(12) United States Patent (10) Patent No.: US 8,071,168 B2
Cruchon-Dupeyrat et al. (45) Date of Patent: Dec. 6, 2011

(54) MICROMETRIC DIRECT-WRITE METHODS FOR PATTERNING CONDUCTIVE MATERIAL AND APPLICATIONS TO FLAT PANEL DISPLAY REPAIR

(75) Inventors: Sylvain Cruchon-Dupeyrat, Chicago, IL (US); Hua Zhang, Evanston, IL (US); Robert Elghanian, Chicago, IL (US); Linette Demers, Evanston, IL (US); Nabil Amro, Chicago, IL (US); Sandeep Disawal, Chicago, IL (US); John Bussan, Naperville, IL (US)

(73) Assignee: Nanoink, Inc., Skokie, IL (US)

( * ) Notice: Subject to any disclaimer, the term of this patent is extended or adjusted under 35 U.S.C. 154(b) by 897 days.

(21) Appl. No.: 11/065,694

(22) Filed: Feb. 25, 2005

(65) Prior Publication Data

US 2005/0235869 A1 Oct. 27, 2005

Related U.S. Application Data

(63) Continuation-in-part of application No. 10/647,430, filed on Aug. 26, 2003, now Pat. No. 7,005,378.

(60) Provisional application No. 60/547,091, filed on Feb. 25, 2004, provisional application No. 60/405,741, filed on Aug. 26, 2002.

(51) Int. Cl.
*B05D 5/00* (2006.01)

(52) U.S. Cl. ......................... 427/256; 427/2.1

(58) Field of Classification Search .................... 427/58, 427/2.1, 2.11, 96.1, 123, 126.1, 140, 250, 427/256, 258; 438/584, 610; 401/191, 196, 401/221, 222, 231, 233, 236; 346/139 R, 346/140.1, 141, 143, 139 C
See application file for complete search history.

(56) References Cited

U.S. PATENT DOCUMENTS

| 4,539,041 A | 9/1985 | Figlarz |
| 4,933,204 A | 6/1990 | Warren et al. |
| 5,759,230 A | 6/1998 | Chow |
| 5,846,615 A | 12/1998 | Sharma et al. |

(Continued)

FOREIGN PATENT DOCUMENTS

EP 1 388 369 A2 2/2003

(Continued)

OTHER PUBLICATIONS

Zhang, M., et al., "A MEMS nanoplotter with high-density parallel dip-pen nanolightography probe arrays", Nanotechnology, vol. 13, No. 2, pp. 212-217 (2002).

(Continued)

*Primary Examiner* — Michael Cleveland
*Assistant Examiner* — Robert Vetere
(74) *Attorney, Agent, or Firm* — Foley & Lardner LLP

(57) ABSTRACT

A new, low temperature method for directly writing conductive metal traces with micron and sub-micron sized features. In this method, a flat beam is used, such as an AFM cantilever, with or without a tip, to draw traces of metal precursor ink onto a substrate. The dimensions of the metal traces can be directly controlled by the geometry of the cantilever, so that one can controllably deposit traces from 1 micron to over 100 microns wide with microfabricated cantilevers. Cantilevers with sharp tips can be used to further shrink the minimum features sizes to sub-micron scale. The height of the features can be increased by building layers of similar or different material.

19 Claims, 40 Drawing Sheets
(35 of 40 Drawing Sheet(s) Filed in Color)

U.S. PATENT DOCUMENTS

| | | | |
|---|---|---|---|
| 5,894,038 | A | 4/1999 | Sharma et al. |
| 5,958,701 | A | 9/1999 | Green et al. |
| 5,980,998 | A | 11/1999 | Sharma et al. |
| 6,035,526 | A | 3/2000 | Saruta et al. |
| 6,103,868 | A | 8/2000 | Heath et al. |
| 6,146,716 | A | 11/2000 | Narang et al. |
| 6,294,401 | B1 | 9/2001 | Jacobson et al. |
| 6,348,295 | B1 | 2/2002 | Griffith et al. |
| 6,413,790 | B1 | 7/2002 | Duthaler et al. |
| 6,458,431 | B2 | 10/2002 | Hill et al. |
| 6,524,435 | B1 | 2/2003 | Agarwal et al. |
| 6,548,122 | B1 | 4/2003 | Sharma et al. |
| 6,573,369 | B2 | 6/2003 | Henderson et al. |
| 6,579,742 | B2 | 6/2003 | Chen |
| 6,635,311 | B1 | 10/2003 | Mirkin et al. |
| 6,642,129 | B2 | 11/2003 | Liu et al. |
| 6,645,444 | B2 | 11/2003 | Goldstein et al. |
| 6,827,979 | B2 | 12/2004 | Mirkin et al. |
| 2002/0122873 | A1 | 9/2002 | Mirkin et al. |
| 2003/0013111 | A1* | 1/2003 | Henderson et al. ............... 435/6 |
| 2003/0068446 | A1 | 4/2003 | Mirkin et al. |
| 2003/0162004 | A1 | 8/2003 | Mirkin et al. |
| 2003/0185967 | A1 | 10/2003 | Eby et al. |
| 2004/0008330 | A1 | 1/2004 | Mirkin et al. |
| 2004/0026681 | A1 | 2/2004 | Cruchon-Dupeyrat et al. |
| 2004/0127025 | A1 | 7/2004 | Crocker et al. |
| 2004/0175631 | A1 | 9/2004 | Van Crocker et al. |
| 2005/0035983 | A1* | 2/2005 | Cruchon-Dupeyrat et al. ............... 346/140.1 |
| 2005/0266149 | A1 | 12/2005 | Henderson et al. |
| 2006/0096078 | A1* | 5/2006 | Bergaud et al. ............... 29/558 |

FOREIGN PATENT DOCUMENTS

| | | |
|---|---|---|
| EP | 1 323 793 A | 7/2003 |
| GB | 24146 | 8/1898 |
| JP | 09-011694 A | 1/1997 |
| JP | 2003-128974 A | 9/2003 |
| WO | WO 00/41213 A1 | 7/2000 |
| WO | WO 01/91855 | 12/2001 |
| WO | WO 02/00348 | 1/2002 |
| WO | WO 03/097238 | 11/2003 |

OTHER PUBLICATIONS

PCT International Search Report, PCT/US2005/006009 (Sep. 26, 2005).

U.S. Appl. No. 10/307,515, filed Dec. 2, 2002, Mirkin et al.

U.S. Appl. No. 10/375,060, filed Feb. 28, 2003, Cruchon-Dupeyrat et al.

U.S. Appl. No. 10/442,189, filed May 21, 2003, Mirkin et al.

U.S. Appl. No. 10/725,939, filed Dec. 3, 2003, Mirkin et al.

U.S. Appl. No. 11/056,391, filed Feb. 14, 2005, Zhang et al.

Ali et al., "Atomic force microscope tip nanoprinting of gold nanoclusters," Langmuir 18, pp. 872-976, (2002).

Belaubre et al., "Fabrication of biological microarrays using microcantilevers," Applied Physics Letters, vol. 82, No. 18, pp. 3122-3124, (May 5, 2003).

Brust et al., "Synthesis of Thiol—derivatised Gold Nanoparticles in a Two-phase Liquid System," Chem. Soc., Chem. Commun., pp. 801-802, (1994).

Fuller et al., "Ink Jet Printed Nanoparticle Microelectromechanical Systems," Journal of Microelectromechanical Systems, vol. 11, No. 1, pp. 54-60, (2002).

Ginger et al., "The Evolution of Dip-Pen Nanolithography," Angewandte Chemie, vol. 116, pp. 30-46, (2004).

Hostetler et al., "Alkanethiolate Gold cluster Molecules with Core Diameters from 1.4 to 5.2 nm: Core and Monolayer Properties as a Function of Core Size," Langmuir, vol. 14, pp. 17-30, (1998).

Hostetler et al., "Monolayers in Three Dimensions: Synthesis and Electrochemistry of ω-Functionalized Alkanethiolate-Stabilized Gold Cluster Compounds," Journal of American Chemical Society, vol. 118, pp. 4212-4213, (1996).

Huang et al., "Plastic-compatible low resistance printable gold nanoparticle conductors for flexible electronics," Journal of the Electrochemical Society, vol. 150, No. 7, pp. G412-G417, (2003).

Li et al., "Electrochemical AFM 'Dip-Pen' Nanolithography," Journal of American Chemical Society, vol. 123, pp. 2105-2106, (2001).

Madou, *Fundamentals of Microfabrication, The Science of Miniaturization*, Second Edition, CRC Press, USA, pp. 344-357, (2002).

Maynor et al., "Au 'Ink' for AFM 'Dip-Pen' Nanolithography," Langmuir, vol. 17, pp. 2575-2578, (2001).

Piner et al., "'Dip-Pen' nanolithography," Science, vol. 283, pp. 661-663, (Jan. 29, 1999).

Pique et al., *Direct Write Technologies for Rapid Prototyping Applications: Sensors, Electronics, and Integrated Power Sources*, Academic Press, San Diego, pp. 303-312, 617-619, (2002).

Ridley et al., "All-Inorganic Field Effect Transistors Fabricated by Printing," Science, vol. 286, pp. 746-749, (1999).

Zhang et al., "Biofunctionalized Nanoarrays of Inorganic Structures Prepared by Dip-Pen Nanolithography," Nanotechnology, vol. 14, pp. 1113-1117, (2003).

Zhang et al., "Dip-Pen nanolithography-Based Methodology for Preparing Arrarys of Nanostructures Functionalized with Oligonucleotides," Advanced Materials, vol. 14, No. 20, pp. 1472-1474, (Oct. 16, 2002).

Zhang et al., "Fabrication of Sub-50 nm Solid-State Nanostructures on the Basis of Dip-Pen nanolithography," Nano. Letters, vol. 3, Mo. 1, pp. 43-45, (2003).

Meister et al., "Nanoscale Dispensing of Liquids Through Cantilevered Probes," Microelectronic Engineering, Elsevier, vol. 67-68, Jun. 2003, pp. 644-650.

Partial International Search Report, PCT/US2005/0060009, 2 pages.

* cited by examiner

Figure 1.

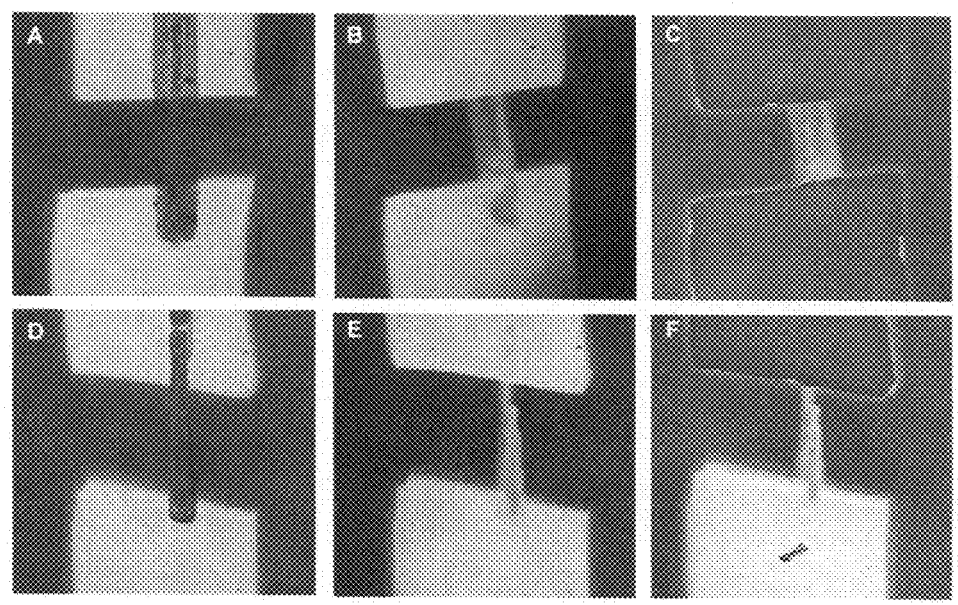

Figure 1. Au Nanoparticles deposited between gold electrodes. (A) and (D) optical images of two lines approximately 60 and 45 μm formed by drawing the inked cantilever along the surface, the cantilever width were 60 and 45 μm respectively. (B) and (E) same patterns as in (A) and (D) after reduction. The measured resistance across the gap for these patterns are 32 and 18 Ohms. They survived water rinsing and scotch tape test, as shown in (C) and (F), where the electrodes were pealed off but not the patterns.

Figure 2.

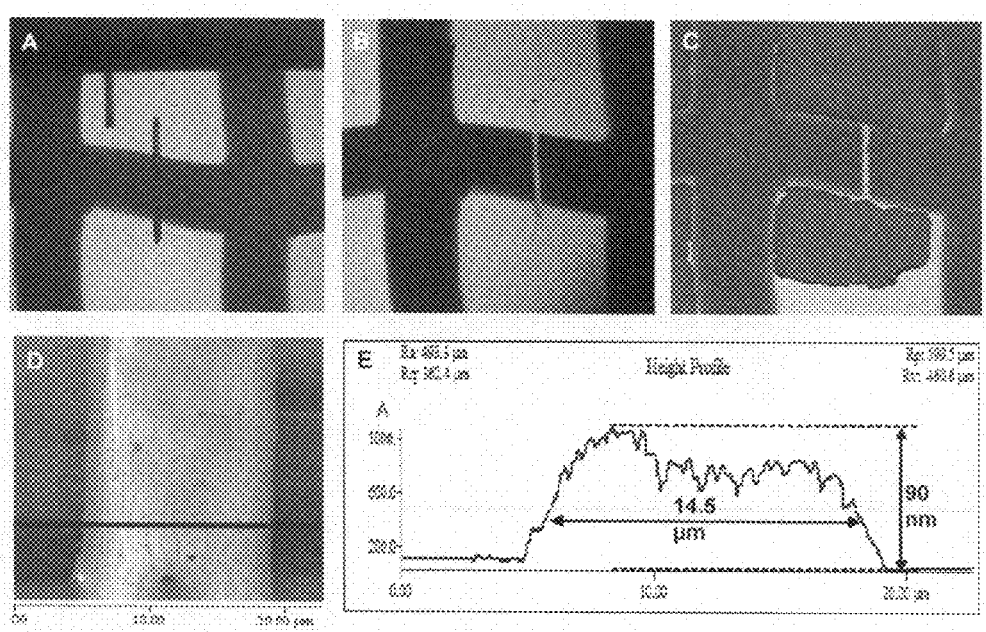

Figure 2. Au Nanoparticles deposited between gold electrodes. (A) and (B) optical images before and after curing of a line formed by drawing a 15 μm inked cantilever between two electrodes. The measured resistance across the gap for this pattern is 16 Ohms. The pattern survived water rinsing and scotch tape test, as shown in (C), where the electrodes were peeled off but not the line pattern. (D) Topographic AFM image of 14.5 μm wide line and 90 nm height. (E) corresponding cursor profile of the fabricated

Figure 3.

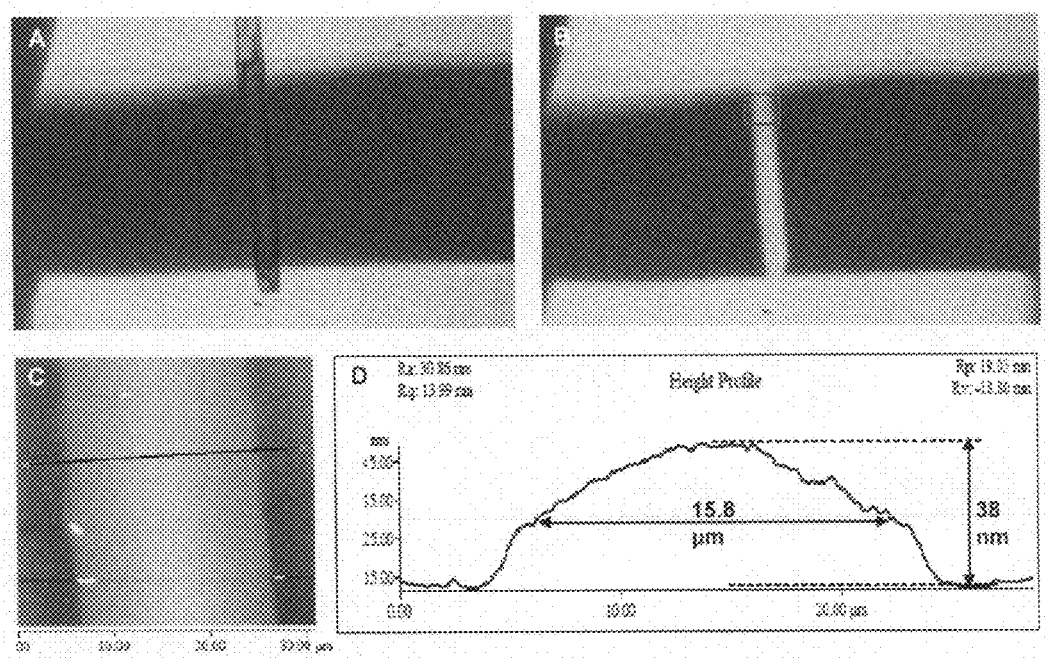

Figure 3. Au Nanoparticles deposited between gold electrodes. (A) and (B) optical images before and after curing of a line formed by drawing a 15 μm inked cantilever between two electrodes. The measured resistance across the gap for this pattern is 19 Ohms. (C) Topographic AFM image of 15.8 μm wide line and 38 nm height. In the red boxed area in (B). (D) corresponding cursor profile of the fabricated.

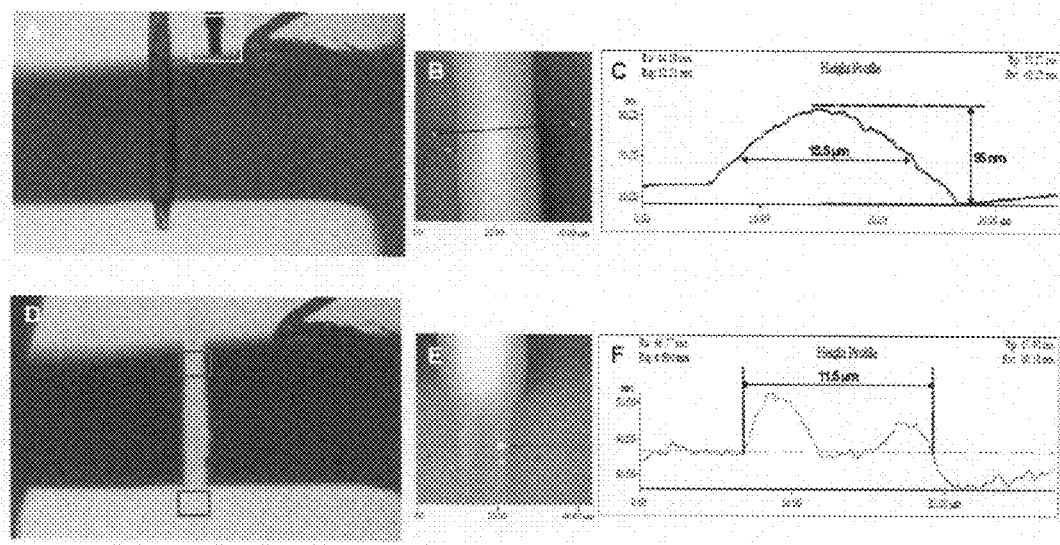

Figure 4. Au Nanoparticles deposited between gold electrodes. (A) and (D) optical images before and after curing of a line formed by drawing a 10 μm inked cantilever (narrowed using FIB, cantilever showed in the yellow box) across two electrodes. The measured resistance across the gap for this pattern is 9 Ohms. (B) and (E) Topographic AFM images of 15.5 μm wide line and 95 nm height and 11.5 μm for the FIB tip, in the red and blue boxed area in (D), respectively. (C) and (F) corresponding cursor profile of the fabricated line.

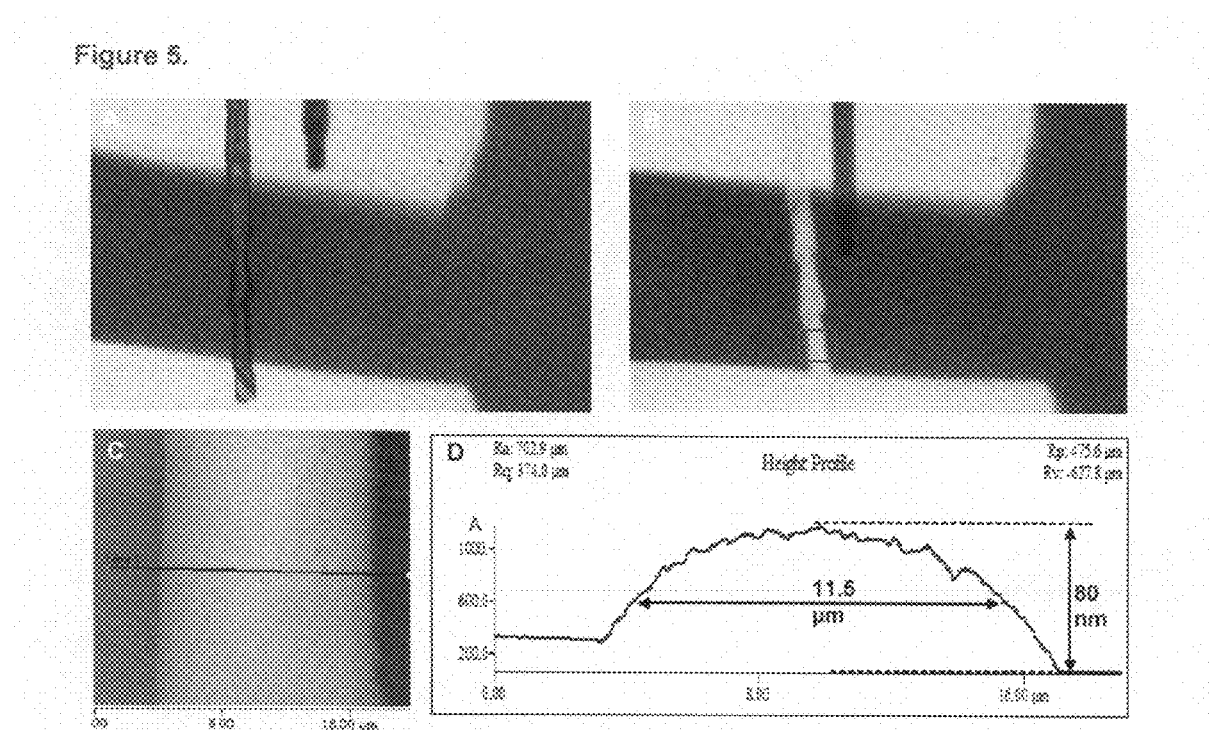

Figure 5. Au Nanoparticles deposited between gold electrodes. (A) and (B) optical images before and after curing of a line formed by drawing a 10 μm wide FIB cantilever across two electrodes. The measured resistance across the gap for this pattern is 22 Ohms. (C) Topographic AFM image of 11.5 μm wide line and 80 nm height in the red boxed area in (B). (D) corresponding cursor profile across the fabricated line.

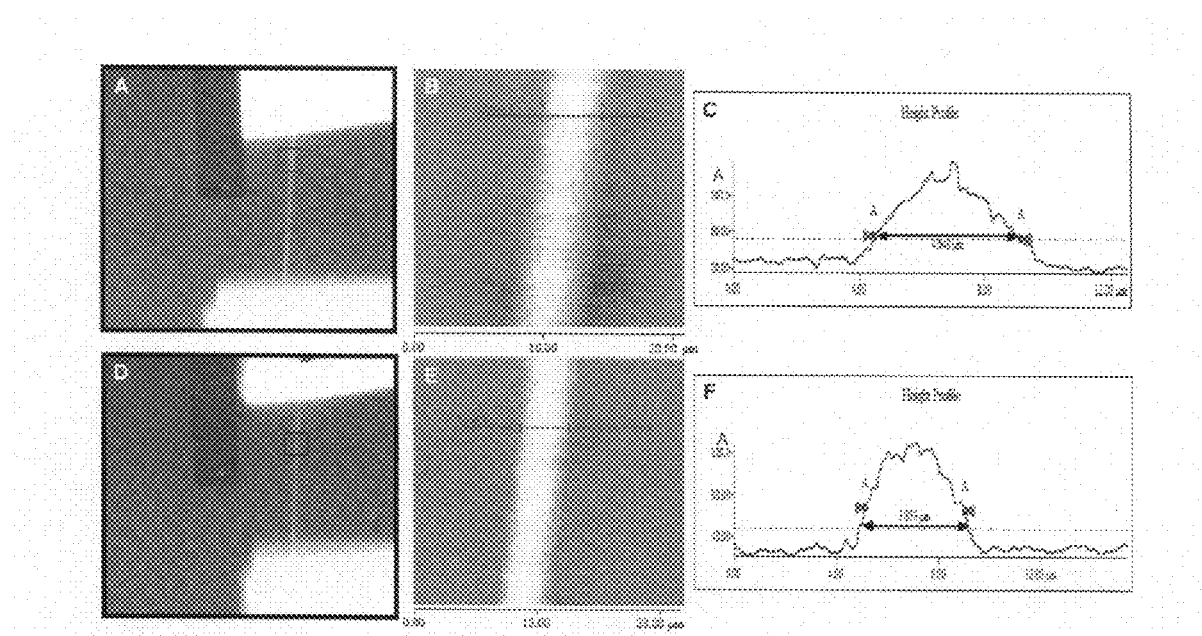

Figure 6. Au Nanoparticles deposited between gold electrodes. (A) and (D) optical images of a gold lines formed across two electrodes. The measured resistance across the gap for the line pattern in (A) is 190 Ohms. (B) and (E) Topographic AFM images of 5 and 4 μm wide lines and 12 nm height, in the red and blue boxed area in (A) and (D), respectively. (C) and (F) corresponding cursor profile of the fabricated line.

Figure 8.

Figure 7. Au Nanoparticles deposited between gold electrodes. (A) and (D) optical images of a gold lines formed across two electrodes. (B) and (E) Topographic AFM images of 3 and 2 μm wide lines and 8 nm height, in the red and blue boxed area in (A) and (D), respectively. (C) and (F) corresponding cursor profile of the fabricated line.

Nanoparticle Feature Control: Line Patterns
Written right to left
Lines formed at 0.15 um/s
H= 2 nm, W=130nm, SP=0.5nN
H= 8.5 nm, W=170nm, SP=2nN
H=10.5 nm, W=200nm, SP=4nN
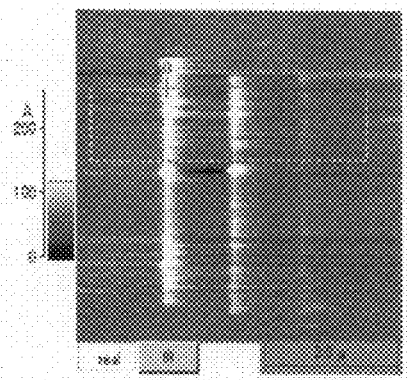
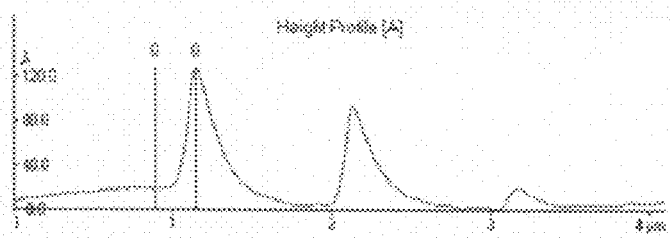
Figure 12

MICROMETRIC DIRECT-WRITE METHODS FOR PATTERNING CONDUCTIVE MATERIAL AND APPLICATIONS TO FLAT PANEL DISPLAY REPAIR

PRIORITY

This application claims priority to U.S. provisional patent application Ser. No. 60/547,091 filed Feb. 25, 2004 which is incorporated by reference in it entirety. This application is also a continuation-in-part of U.S. regular application, Ser. No. 10/647,430 filed Aug. 26, 2003, now U.S. Pat. No. 7,005,378, which claims priority to U.S. provisional application 60/405,741 filed Aug. 26, 2002.

FIELD OF THE INVENTION

The invention generally relates to (i) a micron-scale, direct-write patterning method using microfabricated (tipless) cantilevers coated with ink, which can be called Cantilever MicroDeposition; and (ii) its application to flat panel display repair and especially TFT LCD (thin film transistor liquid crystal displays) repair.

BACKGROUND

There is a strong commercial need in many current and emerging technology fields for direct-write technologies capable of depositing materials, and especially metals and semiconductors, in patterns with features in the micron and sub-micron size regime. While most microelectronic devices are fabricated via photolithography, the need for direct write technologies is particularly evident in the area of additive defect repair and circuit edit. For instance, damaged or defective photomasks are discarded at extremely high costs to the microelectronics industry due to a lack of suitable tools for additive repair of missing material on nanoscale features. On the micron length scale, damage to the metal components of thin film transistor (TFT) arrays in flat panel displays (FPD) is difficult to repair due to the lack of rapid, low cost methods for depositing micron sized conductive traces. Although photolithography can be carried out for fabricating devices, it requires complex and costly instrumentation which makes the technology prohibitively expensive for low volume, high performance components, or prototyping applications. In these cases, other techniques such as direct-write processes could offer unique advantages and capabilities. As the most common direct-write technology, ink-jet printing offers a convenient, flexible method for printing a range of different materials from biological molecules to materials for microelectronics. However, the resolution of the technique is generally limited to 15-200 micron-sized dots, which is not sufficient for many applications (see, for example, U.S. Patent Application 2004/0261700 to Edwards et al.). Other direct-write tools, such as laser-assisted deposition, electron or ion beam lithography, suffer either from similar resolution limitations, are too costly for many applications, or have material restrictions that will preclude their application to the direct fabrication or repair of active and passive microelectronic or optoelectronic components. In particular, electron-beam lithography, ion-beam micromachining, laser- or electron-beam-assisted chemical vapor deposition requires a (partial) vacuum, which is prohibitively expensive for very large flat panels (such as wide TV or computer screens).

SUMMARY

The invention is further described with use of a non-limiting summary. A new contact method for writing conductive metal features has been developed that offers controllable feature sizes from 100 micron to sub-micron dimensions. In this method, a (microfabricated) cantilever can be loaded with e.g. molecular or nanoparticulate ink which, by contacting a surface, is dispensed in very small quantities in the form of, for example, line and dot patterns. In the present form, both loading of the cantilever and deposition can be performed passively. However, by increasing the complexity of the microfabricated cantilevers, additional systems can incorporate active ink delivery. In addition, a number of metal precursor ink systems have been developed that are compatible with this method, so that patterning can be carried out with a large number of different metal and metal oxide materials. Importantly, the precursor inks can be patterned under ambient environmental conditions and converted to metallic films at relatively low temperatures so that they can be applied to substrates such as, for example, plastics which cannot withstand high temperature processes.

In a preferred embodiment, the invention provides a method for writing, for example, conductive metal or metal precursor comprising: providing a cantilever having a cantilever end, wherein the cantilever can be a tipless cantilever; providing an ink disposed at the cantilever end; providing a substrate surface; and moving the cantilever end or moving the substrate surface so that ink is delivered from the cantilever end to the substrate surface. The substrate surface can be moved and the cantilever held stationary, or the substrate surface can be moved and the cantilever held stationary. The movement which results in ink deliver can result generally in contact between the cantilever and the substrate surface, although their may be possibly be ink between the cantilever and the surface.

In another preferred embodiment, the invention provides a method for writing conductive metal or metal precursor comprising: providing two or more cantilevers each having a cantilever ends, wherein the cantilevers can comprise a tip at the end or can be tipless cantilevers, wherein the cantilevers have a gap between them which is about one micron to about 20 microns; providing an ink disposed in the gap; providing a substrate surface; contacting the two or more cantilevers with the gap and the substrate surface so that ink is delivered from the gap to the substrate surface.

The invention also provides an ink formulation for microlithography or nanolithography comprising: one or more metal salts and one or more solvents, wherein the concentration of metal salt is about 1 mg/100 µL to about 500 mg/100 µL. The amount of the metal salt can be adjusted to be sufficiently high to provide suitable dispersion and suitable mass density and a thickness for a given application.

The invention also provides a method for direct writing conductive metal comprising: providing a cantilever having a cantilever end, wherein the cantilever is a tipless cantilever; providing an ink disposed at the cantilever end, wherein the ink comprises metallic nanoparticles; providing a substrate surface; contacting the cantilever end and the substrate surface so that ink is delivered from the cantilever end to the substrate surface.

Important advantages of the present invention include ability to operate in a variety of different size regimes for a particular system including, for example, the about one micron to the about 15 micron regime or the about one micron to about 10 micron regime (e.g., single digit) for lateral dimensions such as length and width with excellent control. Problems with clogging in nozzles or pipettes can be avoided in many embodiments. Instrumentation to do this is relatively straightforward and does not require, for example, high vacuum. Registration and versatility are excellent. Mass production and disposability are possible.

In addition, a series of numbered embodiments are also provided:

1. A method of depositing a conductive coating in a desired pattern onto a substrate comprising: depositing a precursor onto the substrate in the desired pattern by nanolithography with use of a tip coated with the precursor; contacting the precursor with a ligand; applying sufficient energy to transfer electrons from the ligand to the precursor, thereby decomposing the precursor to form a conductive precipitate in the desired pattern and thus forming the conductive pattern directly on the substrate.

2. The method according to 1, wherein the tip is a nanoscopic tip.

3. The method according to 1, wherein the tip is a scanning probe microscopic tip.

4. The method according to 1, wherein the tip is an atomic force microscope tip.

5. The method of 1, wherein the coating comprises a metal with a purity of at least about 80%.

6. The method of 1, wherein the coating comprises a metal with a thickness of less than about 10 angstroms.

7. The method of 1, wherein the coating comprises a metal with a thickness of at least about 100 angstroms.

8. The method of 1, wherein the precursor comprises a salt selected from the group consisting of a carboxylate, a halide, a pseudohalide, and a nitrate.

9. The method of 1, wherein the precursor comprises a carboxylate.

10. The method of 1, wherein the pattern comprises a circuit.

11. The method of 1, wherein the ligand comprises a material selected from the group consisting of an amine, an amide, a phosphine, a sulfide, and an ester.

12. The method of 1 wherein the ligand is selected from the group consisting of a nitrogen donor, a sulphur donor, and a phosphorous donor.

13. The method of 1 wherein the precipitate comprises a metal.

14. The method of 1 wherein the precipitate is selected from the group consisting of copper, zinc, palladium, platinum, silver, gold, cadmium, titanium, cobalt, lead, tin, silicon and germanium.

15. The method of 1 wherein the precipitate comprises an electrical conductor.

16. The method of 1 wherein the precipitate comprises an electrical semiconductor.

17. The method of 1 wherein the substrate comprises a non-conductor.

18. The method of 1 wherein the substrate comprises at least one of a conductor and a semiconductor.

19. The method of 1 wherein the step of applying energy comprises applying heat.

20. The method of 1 wherein the step of applying energy comprises applying infra red radiation or UV radiation.

21. The method of 1 wherein the step of applying energy comprises applying vibrational energy.

22. The method of 1 wherein the precursor comprises a salt selected from the group consisting of a carboxylate, a halide, a pseudo halide, a nitrate, and the ligand comprises a material selected from the group consisting of an amine, an amide, a phosphine, a sulfide and an ester.

23. The method of 19, wherein the precipitate is selected from the group consisting of copper, zinc, palladium, platinum, silver, gold, cadmium, titanium, cobalt, lead, tin, silicon and germanium.

24. The method of 19, wherein the step of applying energy comprises applying radiant heat.

25. A method of printing a conductive metal in a desired pattern onto a substrate comprising:

drawing a metal precursor and ligand directly onto the substrate according to the desired pattern using nanolithography with use of a tip coated with a precursor; and decomposing the precursor by applying energy to form the conductive metal in the desired pattern, without removing from the substrate a substantial quantity of the precursor, and without removing from the substrate a substantial quantity of the metal.

26. The method of 25, wherein the metal pattern comprises a substantially pure metal, with impurities less than about 20% by weight.

27. The method of 25, wherein the step of decomposing comprises thermally decomposing.

28. The method of 25 wherein the step of decomposing comprises thermally decomposing at a temperature of less than about 300° C.

29. The method of 25, wherein the metal is selected from the group consisting of an elemental metal, an alloy, a metal/metal composite, a metal ceramic composite, and a metal polymer composite.

30. A nanolithographic method comprising:

depositing a metallic precursor from a tip onto a substrate to form a nanostructure, and subsequently converting the precursor nanostructure to a metallic deposit.

31. The method according to 30, wherein the deposition and conversion is carried out without use of an electrical bias between the tip and substrate.

32. The method according to 30, wherein the deposition and conversion is carried out with use of a chemical agent other than the substrate.

33. The method according to 30, wherein the tip is a nanoscopic tip.

34. The method according to 30, wherein the tip is a scanning probe microscopic tip.

35. The method according to 30, wherein the tip is an AFM tip.

36. The method according to 35, wherein the deposition and conversion is carried out without use of an electrical bias between the tip and substrate.

37. The method according to 30, wherein the method is repeated to form a multilayer.

38. The method according to 30, wherein the tip is adapted to not react with the precursor.

39. The method according to 30, wherein the method is used to connect at least one nanowire with another structure.

40. The method according to 30, wherein the method is used to connect at least two electrodes.

41. The method according to 30, wherein the method is used to prepare a sensor.

42. The method according to 30, wherein the method is used to fabricate a lithographic template.

43. The method according to 30, wherein the method is used to prepare a biosensor.

44. A nanolithographic method consisting essentially of:

depositing an ink composition consisting essentially of a metallic precursor from a nanoscopic tip onto a substrate to form a nanostructure, and subsequently converting the metallic precursor of the nanostructure to a metallic form.

45. The method according to 44, wherein the conversion is a thermal conversion without use of a chemical agent.

46. The method according to 44, wherein the conversion is a chemical conversion carried out with use of a reducing agent.

47. The method according to 44, wherein the reducing agent is used in the vapor state to carry out the conversion.

48. The method according to 44, wherein the tip is an AFM tip.

49. The method according to 44, wherein the tip comprises a surface which does not react with the precursor.

50. A method according to 44, wherein the method is repeated a plurality of times to generate a multi-layer structure.

51. A method of printing without use of electrochemical bias or reaction between the ink and substrate comprising depositing a metallic precursor ink composition onto a substrate from a tip in the form of a microstructure or nanostructure on the substrate to form an array having discreet objects separated from each other by about one micron or less.

52. The method according to 51, further comprising the step of forming metal from the precursor.

53. The method according to 51, wherein the discreet objects are separated from each other by about 500 nm or less.

54. The method according to 51, wherein the discreet objects are separated from each other by about 100 nm or less.

55. A method for writing conductive metal comprising providing a cantilever having a cantilever end, wherein the cantilever can comprise a tip at the end or can be a tipless cantilever;
providing an ink disposed at the cantilever end;
providing a substrate surface;
contacting the cantilever end and the substrate surface so that ink is delivered from the cantilever end to the substrate surface.

56. The method according to 55, wherein the substrate surface is moved and the cantilever is stationary.

57. The method according to 55, wherein the substrate surface is stationary and the cantilever is moved.

58. The method according to 55, wherein the cantilever is a tipless cantilever.

59. The method according to 55, wherein the cantilever comprises a tip at the cantilever end.

60. The method according to 55, wherein the ink comprises one or more metals.

61. The method according to 55, wherein the ink comprises one or more metal salts.

62. The method according to 55, wherein the ink comprises one or more metal nanoparticles.

63. The method according to 55, wherein the ink comprises one or more hydrophobic nanoparticles.

64. The method according to 55, wherein the ink comprises one or more hydrophilic nanoparticles.

65. The method according to 55, wherein the ink comprises one or more metal nanoparticles having an organic shell.

66. The method according to 55, wherein the ink comprises one or more metal nanoparticles having an insulating shell.

67. The method according to 55, wherein the ink is a hydrophobic ink.

68. The method according to 55, wherein the ink is a hydrophilic ink.

69. The method according to 55, wherein the ink is a hydrophobic ink, and the substrate surface is a hydrophobic surface.

70. The method according to 55, wherein the ink is a hydrophilic ink, and the substrate surface is a hydrophilic surface.

71. The method according to 55, wherein the ink comprises both hydrophobic and hydrophilic agents.

72. The method according to 55, wherein the ink comprises one or more metal nanoparticles having an average diameter of about 100 nm or less.

73. The method according to 55, wherein the ink comprises one or more biological molecules.

74. The method according to 55, wherein the ink comprises one or more peptides or proteins.

75. The method according to 55, wherein the ink comprises one or more nucleic acids.

76. The method according to 55, wherein the ink comprises one or more sol-gel materials.

77. The method according to 55, wherein the ink comprises one or more magnetic materials or precursors thereof.

78. The method according to 55, wherein the ink comprises one or more semiconductor materials or precursors thereof.

79. The method according to 55, wherein the ink comprises one or more optical materials or precursors thereof.

80. The method according to 55, wherein the ink comprises one or more solvents having a boiling point over 100° C.

81. The method according to 55, wherein the ink comprises one or more compounds which chemisorb to or covalently bond with the substrate surface.

82. The method according to 55, wherein the ink forms a feature on the substrate surface.

83. The method according to 55, wherein the ink forms metal oxide on the surface.

84. The method according to 55, wherein the ink forms metal alloy on the surface.

85. The method according to 55, wherein the ink forms a feature on the substrate surface which has a dimension controlled by the geometry of the cantilever.

86. The method according to 55, wherein the ink forms a feature on the substrate surface which has a width of about one micron to about 100 microns.

87. The method according to 55, wherein the ink forms a feature on the substrate surface and the feature is subjected to fusion, sintering, or coalescence conditions.

88. The method according to 55, wherein the ink forms a feature on the substrate surface and the feature is subjected to annealing.

89. The method according to 55, wherein the ink forms a feature on the substrate surface and the feature is subjected to light.

90. The method according to 55, wherein the ink forms a feature on the substrate surface and the feature is subjected to laser.

91. The method according to 55, wherein the ink forms a feature on the substrate surface and the feature is subjected to electrical current.

92. The method according to 55, wherein the ink forms a feature on the substrate surface which contacts one or more electrodes on the substrate surface.

93. The method according to 55, wherein the ink forms a feature on the substrate surface and is subjected to annealing at temperature of about 300° C. or less.

94. The method according to 55, wherein the ink forms a feature on the substrate surface and is subjected to annealing at temperature of about 100° C. to about 300° C.

95. The method according to 55, wherein the ink is subjected to a reduction reaction on the substrate surface.

96. The method according to 55, wherein the ink forms a feature on the substrate surface which is made continuous after contacting.

97. The method according to 55, wherein the ink forms a feature on the substrate surface which is converted to a metallic state which has a resistivity of about 10 microohm*cm or less.

98. The method according to 55, wherein the ink forms a feature on the substrate surface which is converted to a metallic state which has a resistivity of about 1 microohm*cm to about 10 microohm*cm.

99. The method according to 55, wherein the ink forms a feature on the substrate surface which has a width of about 5 nm to about one micron.

100. The method according to 55, wherein the method is repeated to form layers of ink on the substrate surface.

101. The method according to 55, wherein the method is repeated to form layers of ink on the substrate surface, wherein the inks are the same material.

102. The method according to 55, wherein the method is repeated to form layers of ink on the substrate surface, wherein the inks are different material.

103. The method according to 55, wherein the ink forms a feature on the substrate surface which is a line.

104. The method according to 55, wherein the ink forms a feature on the substrate surface which is a dot.

105. The method according to 55, wherein the cantilever is an AFM cantilever.

106. The method according to 55, wherein the substrate surface is glass.

107. The method according to 55, wherein the substrate surface is a thin film transistor array.

108. The method according to 55, wherein the method is used to repair a flat panel display.

109. The method according to 55, wherein cantilever is loaded with ink with use of a microfabricated inkwell filled with ink.

110. The method according to 55, wherein the cantilever is brought into contact with the substrate surface at an angle of about 10 degrees or less.

111. The method according to 55, wherein the cantilever is brought into contact with the substrate surface at an angle of about 5 degrees or less.

112. The method according to 55, wherein the cantilever is bent upon contact as viewed by optical microscopy.

113. The method according to 55, wherein the contacting is carried out with use of force-feedback.

114. The method according to 55, wherein the contacting is carried out with use of piezoelectric scanning features.

115. The method according to 55, wherein the cantilever has a width of about one micron to about 100 microns.

116. The method according to 55, wherein the cantilever has a width of about five microns to about 25 microns.

117. The method according to 55, wherein the cantilever is a straight beam shaped cantilever.

118. The method according to 55, wherein the contacting is carried out with use of force-feedback.

119. The method according to 55, wherein the cantilever has a spring constant of about 0.001 N/m to about 0.50 N/m.

120. The method according to 55, wherein the cantilever has a spring constant of about 0.004 N/m to about 0.20 N/m.

121. The method according to 55, wherein the cantilever has a length of about 100 microns to about 400 microns.

122. The method according to 55, wherein the cantilever has a length of about 150 microns to about 300 microns.

123. The method according to 55, wherein the cantilever is one of a plurality of cantilevers which deposit ink in parallel.

124. The method according to 55, wherein the ink is a polyol ink.

125. The method according to 55, wherein the ink comprises metal salts together with one or more alcohols or polyols.

126. The method according to 55, wherein the ink forms features on the substrate surface having a lateral dimension of about one micron to about 15 microns.

127. The method according to 55, wherein the ink forms features on the substrate surface which have a lateral dimension of about one micron to about 10 microns.

128. The method according to 55, wherein the ink forms features on the substrate surface which have a lateral dimension of about one micron to about 15 microns.

129. A substrate comprising a substrate surface and an ink thereon prepared by the method of claim 55.

130. A method for writing conductive metal comprising: providing two or more cantilevers each having a cantilever ends, wherein the cantilevers can comprise a tip at the end or can be tipless cantilevers, wherein the cantilevers have a gap between them which is about one micron to about 20 microns; providing an ink disposed in the gap; providing a substrate surface; contacting the two or more cantilevers with the gap and the substrate surface so that ink is delivered from the gap to the substrate surface.

131. The method according to 130, wherein the gap is about one micron to about five microns.

132. The method according to 130, wherein the gap is about five microns to about ten microns.

133. The method according to 130, wherein the gap is about ten microns to about twenty microns.

134. An ink formulation for nanolithography comprising: one or more metal salts and one or more solvents, wherein the concentration of metal salt is about 1 mg/100 μL to about 500 mg/100 μL.

135. An ink formulation according to 134, wherein the concentration of metal salt is about 1 mg/100 μL to about 200 mg/100 μL.

136. An ink formulation according to 134, wherein the concentration of metal salt is about 5 mg/100 μL to about 30 mg/100 μL.

137. The ink formulation of 134, wherein the formulation further comprises two or more oligomer or polymer additives having different average molecular weight.

138. The ink formulation of 134, wherein the formulation further comprises at least one oligomer and at least one polymer.

139. The ink formulation of 100, wherein the formulation comprises two or more metal salts.

140. The ink formulation of 100, wherein the formulation further comprises epoxy.

141. A method for direct writing conductive metal comprising: providing a cantilever having a cantilever end, wherein the cantilever can comprise a tip at the end or can be a tipless cantilever; providing an ink disposed at the cantilever end, wherein the ink comprises metallic nanoparticles; providing a substrate surface; contacting the cantilever end and the substrate surface so that ink is delivered from the cantilever end to the substrate surface.

142. The method according to 141, wherein the ink forms a feature on the substrate surface and the feature is subjected to post-treatment.

143. The method according to 141, wherein the ink forms a feature on the substrate surface and the feature is subjected to heat treatment.

144. The method according to 141, wherein the ink forms a feature on the substrate surface and the feature is subjected to light treatment.

145. The method according to 141, wherein the ink forms a feature on the substrate surface and the feature is subjected to heat treatment below about 300° C.

BRIEF SUMMARY OF THE DRAWINGS

The patent or application file contains at least one drawing executed in color. Copies of this patent or patent application publication with color drawing(s) will be provided by the Office upon request and payment of the necessary fee.

FIG. 1. Au Nanoparticles deposited between gold electrodes. (A) and (D) optical images of two lines approximately 60 and 45 µm formed by drawing the inked cantilever along the surface, the cantilever width were 60 and 45 µm respectively. (B) and (E) same patterns as in (A) and (D) after reduction. The measured resistance across the gap for these patterns is 32 and 18 Ohms. They resisted water rinsing and scotch tape test, as shown in (C) and (F), where the electrodes were pealed off but not the patterns.

FIG. 2. Au Nanoparticles deposited between gold electrodes. (A) and (B) optical images before and after curing of a line formed by drawing a 15 µm inked cantilever between two electrodes. The measured resistance across the gap for this pattern is 18 Ohms. The pattern resisted water rinsing and scotch tape test, as shown in (C), where the electrodes were pealed off but not the line pattern. (D) Topographic AFM image of 14.5 µm wide line and 90 nm height. (E) Corresponds to the cursor profile of the fabricated line.

FIG. 3. Au Nanoparticles deposited between gold electrodes. (A) and (B) optical images before and after curing of a line formed by drawing a 15 µm inked cantilever between two electrodes. The measured resistance across the gap for this pattern is 19 Ohms. (C) Topographic AFM image of 15.8 µm wide line and 38 nm height, in the red boxed area in (B). (D) Corresponds to cursor profile of the fabricated line.

FIG. 4. Au Nanoparticles deposited between gold electrodes. (A) and (D) optical images before and after curing of a line formed by drawing a 10 µm inked cantilever (narrowed using FIB, cantilever showed in the yellow box) across two electrodes. The measured resistance across the gap for this pattern is 9 Ohms. (B) and (E) Topographic AFM images of 15.5 µm wide line and 95 nm height and 11.5 µm for the FIB tip, in the red and blue boxed area in (D), respectively. (C) and (F) correspond to cursor profile of the fabricated line.

FIG. 5. Au Nanoparticles deposited between gold electrodes. (A) and (B) optical images before and after curing of a line formed by drawing a 10 µm wide FIB cantilever across two electrodes. The measured resistance across the gap for this pattern is 22 Ohms. (C)) Topographic AFM image of 11.5 µm wide line and 80 nm height in the red boxed area in (B). (D) Corresponds to cursor profile of the fabricated line.

FIG. 6. Au Nanoparticles deposited between gold electrodes. (A) and (D) optical images of a gold lines formed across two electrodes. The measured resistance across the gap for the line pattern in (A) is 190 Ohms. (B) and (E) Topographic AFM images of 5 and 4 µm wide lines and 12 nm height, in the red and blue boxed area in (A) and (D), respectively. (C) and (F) correspond to cursor profile of the fabricated line.

FIG. 12. AFM height images of nanoscale gold patterns on quartz. Gold nanoparticles dissolved in mesitylene (the 'ink') were patterned by translating an ink-coated conventional silicon nitride AFM tip across the surface at a rate of 0.15 microns/s. The line trace indicates that the height and the width of the lines increase with applied force.

FIG. 17(B) was carried out with use of a PDMS DPN stamp tip. (C) An AFM image showing the large grainy microstructure of the platinum-gold alloy film; grain sizes were ~150 nm.

DETAILED DESCRIPTION

The invention, which can for convenience be referred to as "cantilever microdeposition" (CMD) in its preferred embodiments, can be practiced in numerous embodiments, including those described below in the working examples.

Embodiment 1

Cantilever Microdeposition

Figure 36:
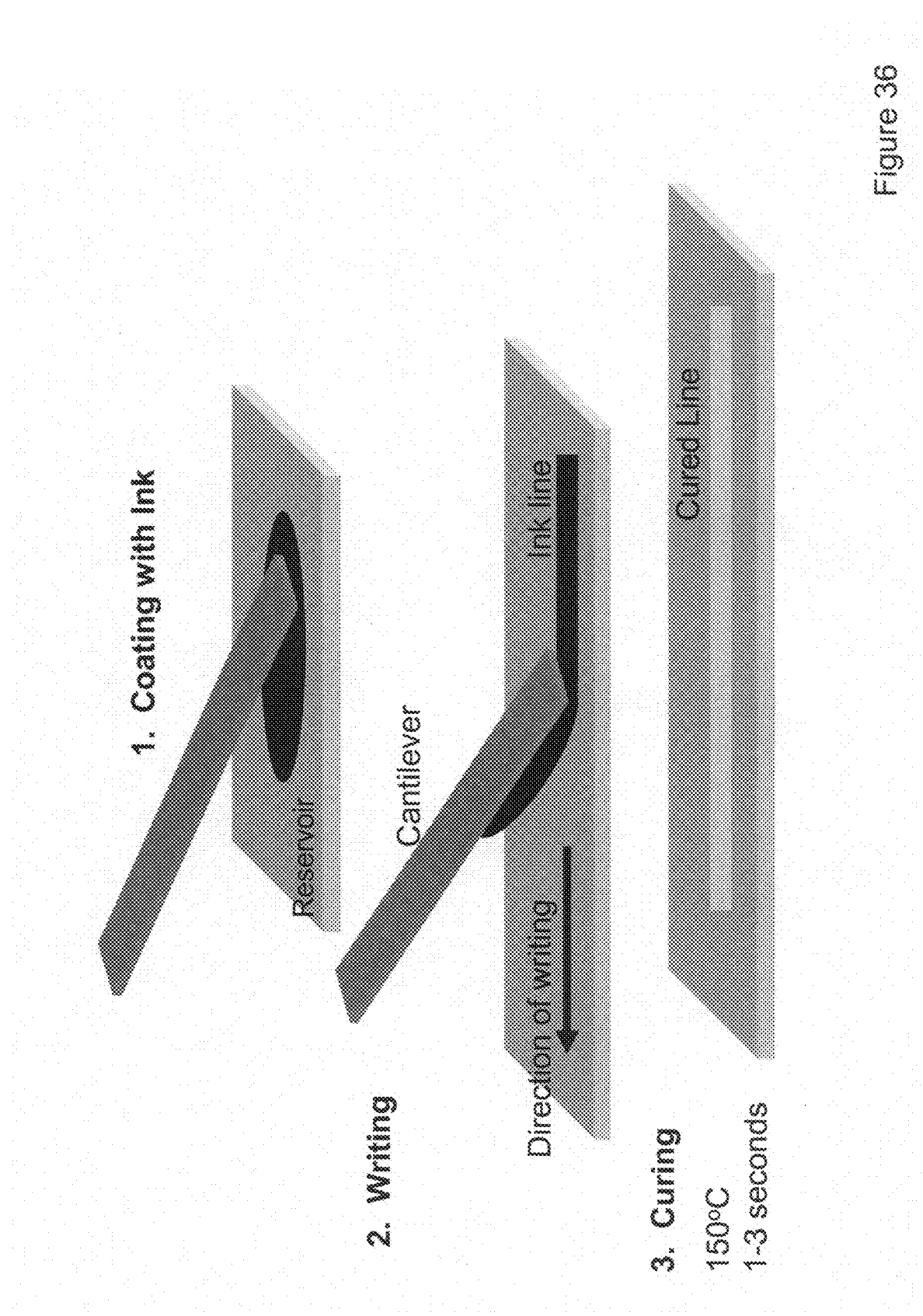
FIG. 36. Diagram illustrating the loading and fabrication of micron-scale (conductive) lines by direct-writing with a tipless cantilever coated with an ink, followed by curing. Experimental curing conditions are indicated that are suitable for low-temperature-curing inks, such as gold nanoparticle inks.

In a first embodiment, the invention provides a method for fabricating micrometer-scale and submicrometer-scale patterns using a cantilever or microbrush, the method comprising (1) providing a cantilever or microbrush; (2) providing an ink, meaning a chemical compound or a mixture thereof, disposed on said cantilever or microbrush; (3) providing a substrate surface; and (4) contacting the microbrush and the substrate surface so that ink is delivered from the cantilever or microbrush to the substrate surface. FIG. 36 illustrates the principle of this method.

Preferably, the smallest lateral dimension of the resulting pattern (measured parallel to the substrate surface, e.g. the width of a line) ranges from 0.5 micron to 15 microns. Its largest lateral dimension (e.g. the length of a line) exceeds 100 microns and preferably 200 microns, and its height (e.g. measured substantially orthogonally to said local plane) ranges from 1 nm to 2 microns.

Preferably, the cantilever or microbrush is a microfabricated device, meaning a microelectromechanical system (MEMS) fabricated using standard microfabrication techniques, including but not limited to photolithography, electron beam lithography, thin film deposition, etching, lift-off and focused ion beam micromachining. The microbrush may have the shape of a cantilever having a free end and an end bound to a macro- or mesoscopic body or it may be a device comprising a multiplicity of cantilevers. The cantilever(s) may be with or without tip(s) protruding out of the principal plane of the cantilever. The meso/macroscopic body may be a diced (silicon or glass) wafer.

Two or more neighboring cantilevered bodies may form a gap or slit of fixed or variable width that may be used for ink storage or dispensing. A microfluidic circuit may be formed on/in the cantilevered bodies and/or the meso- or macroscopic body it is attached to. The microfluidic circuit may comprise reservoirs, channels, and vias for ink delivery. Channels and reservoirs may be formed by two substantially parallel surfaces (such as the walls of the slits described above) or by three or more surfaces (e.g. forming an open channel or a completely enclosed channel). In a preferred embodiment, a substantially flat, tipless cantilever is used.

Many inks may be deposited, including organic and inorganic compounds, including metal salts and complexes, sol-gel precursors, polymers, biomolecules such as nucleic acid (e.g. DNA), peptides and proteins, nanoparticles and solutions or mixtures thereof. Deposition may be preceded or followed by a number of treatments, including substrate cleaning, surface preparation, hole drilling, micromachining with a laser or ion beam, photolithography and curing by application of heat or light.

Literature Useful for Practicing the Invention

Cantilevers, tips, inks, substrate surfaces, and contact methods are known in the art, and one skilled in the art can refer to the following technical literature in the practice of the present invention in its many embodiments including the preferred embodiments and working examples described below. In addition, a list of references is provided later in the specification, and all references in this specification are incorporated by reference in their entirety and can be relied upon in general in practicing the invention.

Cantilever microdeposition is related to but distinct from Dip Pen Nanolithography™ (DPN™) printing, a technology commercially developed by NanoInk, Inc. (Chicago, Ill.), in which typically (1) a sharp tip with a nanometer-scale apex is coated with an ink; (2) the ink flows from the tip onto a substrate through a meniscus that naturally condenses at the contact junction. In contrast to DPN printing, the present invention does not require a sharp tip but rather preferably uses a flat, spatula-like micrometer-sized cantilever or cantilever as the ink application means. Cantilever microdeposition is best used for the fabrication of patterns with a critical dimension from the high submicrometer to ten-micron range, while DPN printing is best for very-high-resolution (e.g. nanoscale) patterning.

Figure 37:
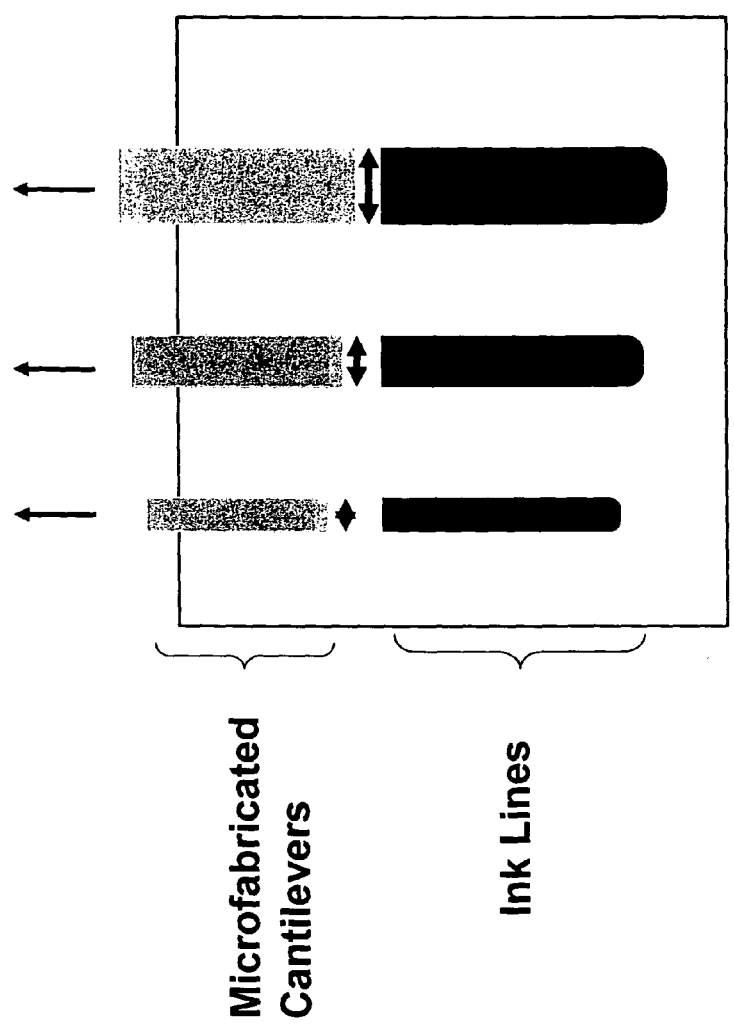
FIG. 37. Diagram illustrating how the line width is controlled by (is proportional to) the cantilever width.
Figure 38:
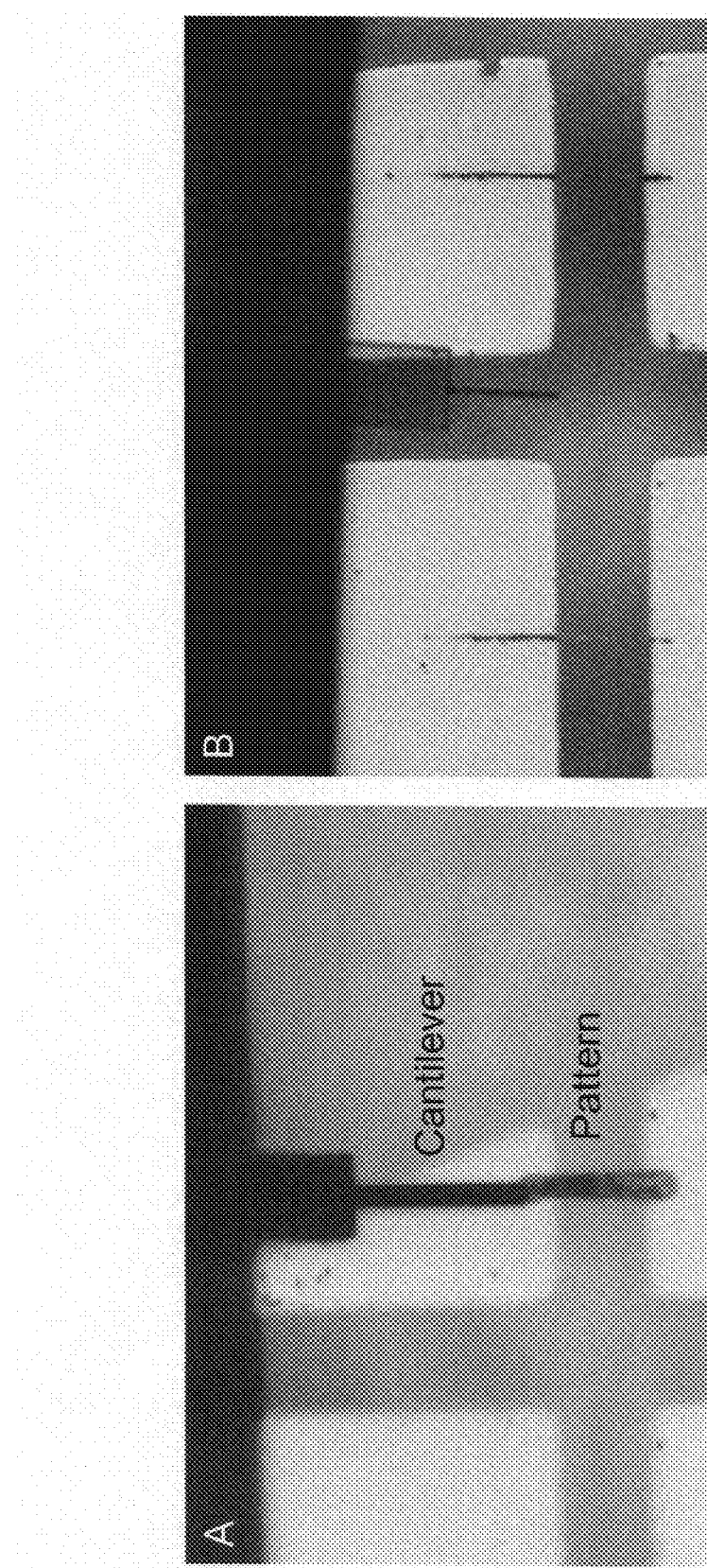
FIG. 38. Experimental results illustrating how the line width is controlled by (is proportional to) the cantilever width. (A) A ten-micron-wide cantilever is shown writing a line of similar width. (B) A two-micron cantilever is shown writing a circa two-micron line. Both images are at the same scale for easier comparison of the line widths.

While its resolution is lower, the throughput of cantilever microdeposition (in square microns per second) is higher than that of DPN printing, especially since higher speed (of the cantilever or microbrush relative to the surface) may be used. Generally speaking, the cantilever used in the present invention does not contact directly the surface of the substrate. Rather, a layer of ink is trapped between the surface and the microbrush or cantilever end. Without wishing to be bound by theory, it is believed that the interplay of hydrodynamics and capillary tension in the space between the cantilever and the surface controls ink deposition. For example, the pattern height and overall quality (continuity) is sensitive to the pressure applied to the cantilever, while in DPN this is generally not the case. The line width is highly correlated to the cantilever width (see FIGS. 37 and 38, for example) and mostly independent from the patterning speed, while in contrast, with DPN printing, it is controlled by the diffusion rate of the ink from a point source (the tip-sample contact) and the patterning speed.

However, a lot of the technical developments associated with Dip Pen Nanolithography, including but not limited to inks, ink delivery technology, cantilever/brush fabrication processes, cantilever position control technology and computer-control design and fabrication algorithms, are highly relevant to cantilever microdeposition.

A variety of products related to DPN printing can be obtained from NanoInk including deposition instruments (e.g. the NSCRIPTOR™ platform), computer software, environmental chambers, pens, substrates, kits, inks, inkwells, calibration software, alignment software, accessories, and the like. Single DPN printing probes, passive multi-probe arrays, A-frame cantilevers, diving-board-shaped cantilevers, as well as AC-mode cantilevers can be obtained from NanoInk. Also available are sharpened and unsharpened tips. DIP PEN NANOLITHOGRAPHY™ and DPN™ are trademarks for NanoInk, Inc., Chicago, Ill.) and are used accordingly herein.

DPN printing and deposition methods are extensively described in the following patent applications and patent publications, which are hereby incorporated by reference in their entirety and support the disclosure for the present inventions, particularly with respect to the experimental parameters for carrying out the deposition:

1. U.S. Provisional application 60/115,133 filed Jan. 7, 1999 ("Dip Pen Nanolithography").

2. U.S. Provisional application 60/157,633 filed Oct. 4, 1999 ("Methods Utilizing Scanning Probe Microscope Tips and Products Therefor or Produced Thereby").

3. U.S. Regular patent application Ser. No. 09/477,997 filed Jan. 5, 2000 ("Methods Utilizing Scanning Probe Microscope Tips and Products Therefor or Produced Thereby"), now U.S. Pat. No. 6,635,311 to Mirkin et al. issued Oct. 21, 2003.

4. U.S. Provisional application 60/207,713 filed May 26, 2000 ("Methods Utilizing Scanning Probe Microscope Tips and Products Therefor or Produced Thereby"). This application, for example, describes wet chemical etching, working examples, references, and figures, which are all incorporated by reference in their entirety.

5. U.S. Provisional application 60/207,711 filed May 26, 2000 ("Methods Utilizing Scanning Probe Microscope Tips and Products Therefor or Produced Thereby").

6. U.S. Regular application Ser. No. 09/866,533, now U.S. Pat. No. 6,827,979 filed May 24, 2001 ("Methods Utilizing Scanning Probe Microscope Tips and Products Therefor or Produced Thereby"). This application, for example, describes wet chemical etching, working examples (e.g., example 5), references, and figures, which are all incorporated by reference in their entirety.

7. U.S. patent publication number 2002/0063212 A1 published May 30, 2002 ("Methods Utilizing Scanning Probe Microscope Tips and Products Therefor or Produced Thereby").

8. U.S. patent publication number 2002/0122873 A1 published Sep. 5, 2002 ("Nanolithography Methods and Products Produced Therefor and Produced Thereby").

9. PCT publication number WO 00/41213 A1 published Jul. 13, 2000 based on PCT application no. PCT/US00/00319 filed Jan. 7, 2000 ("Methods Utilizing Scanning Probe Microscope Tips and Products Therefor or Produced Thereby").

10. PCT publication number WO 01/91855 A1 published Dec. 6, 2001 based on PCT application no. PCT/US01/17067 filed May 25, 2001 ("Methods Utilizing Scanning Probe Microscope Tips and Products Therefor or Produced Thereby").

11. U.S. Provisional application 60/326,767 filed Oct. 2, 2001, ("Protein Arrays with Nanoscopic Features Generated by Dip-Pen Nanolithography"), now published 2003/0068446 on Apr. 10, 2003 to Mirkin et al.

12. U.S. Provisional application 60/337,598 filed Nov. 30, 2001, ("Patterning of Nucleic Acids by Dip-Pen Nanolithography") and U.S. regular application Ser. No. 10/307,515, now U.S. Pat. No. 7,361,310 filed Dec. 2, 2002 to Mirkin et al.

13. U.S. Provisional application 60/341,614 filed Dec. 17, 2001, ("Patterning of Solid State Features by Dip-Pen Nanolithography"), now published 2003/0162004 Aug. 28, 2003 to Mirkin et al. This application includes descriptions of metallic, metal oxide, and inorganic solid state structures.

14. U.S. Provisional application 60/367,514 filed Mar. 27, 2002, ("Method and Apparatus for Aligning Patterns on a Substrate") and publication no. 2003/0185967 on Oct. 2, 2003 to Eby et al.

15. U.S. Provisional application 60/379,755 filed May 14, 2002, ("Nanolithographic Calibration Methods") and U.S. regular application 10/375,060 filed Feb. 28, 2003 to Cruchon-Dupeyrat et al.

16. In addition, U.S. regular application Ser. No. 10/647,430, now U.S. Pat. No. 7,005,378 (now published, 2004/0127025) filed Aug. 26, 2003 to Crocker et al. ("Processes for fabricating conductive patterns using nanolithography as a patterning tool") describes a variety of metal inks which can be patterned according to the present invention and is incorporated by reference in its entirety (much of the text is provided below to further enable one skilled in the art to practice the present invention). Also, US regular application published as 2004/0026681 ("Protosubstrates") to Cruchon-Dupeyrat et al. published Feb. 12, 2004 describes a variety of embodiments for printing micro and nano structures which can be tested on a macro scale, and is incorporated by reference in its entirety. Also, US regular application published Jan. 15, 2004 to Mirkin et al. ("Electrostatically Driven Nanolithography") publication no. 2004/0008330 describes patterning of conductive polymers and is hereby incorporated by reference in its entirety. Also, U.S. regular application Ser. No. 10/442,189, now abandoned filed May 21, 2003 to Mirkin et al. ("Peptide and Protein Nanoarrays and Direct-Write Nanolithographic Printing of Peptides and Proteins") is incorporated by reference in its entirety and describes a variety of peptides and proteins which can be patterned according to the present invention. Also, U.S. patent application Ser. No. 10/689,547 filed Oct. 21, 2003 to Van Crocker et al. ("Nanometer Scale Engineering Structures . . . ") is incorporated by reference in its entirety. Also, U.S. patent application Ser. No. 10/705,776, now U.S. Pat. No. 7,034,854 filed Nov. 12, 2003 to Cruchon-Dupeyrat et al. ("Methods and Apparatus for Ink Delivery . . . ") is incorporated by reference in its entirety.

In general, state of the art DPN™ printing and deposition-related products, including hardware, software, and instrumentation are also available from NanoInk, Inc. (Chicago, Ill.), and these can be used to carry out the present invention. For example, NSCRIPTOR™ instrumentation can be used for patterning. DPN printing is further described in, for example, Ginger, Zhang, and Mirkin, Angew. Chem. Int. Ed., 2004, 43(1), 30-45.

Parallel methods of the DPN printing process can be carried out as described in, for example, U.S. Pat. No. 6,642,129 to Liu et al. issued Nov. 4, 2003.

In addition, the following papers describes wet chemical etching procedures used in conjunction with direct-write nanolithography, and is hereby incorporated by reference in its entirety including figures, references, and working examples: Zhang et al., "Dip-Pen Nanolithography-Based Methodology for Preparing Arrays of Nanostructures Functionalized with Oligonucleotides"; *Adv. Mat.*, 2002, 14, No. 20, Oct. 16, pages 1472-1474; Zhang et al., "Biofunctionalized Nanoarrays of Inorganic Structures Prepared by Dip-Pen Nanolithography"; *Nanotechnology*, 2003, 14, 1113-1117; Zhang et al., "Fabrication of Sub-50 nm Solid-State Nanostructures on the Basis of Dip-Pen Nanolithography"; Nano Lett., 2003, 3, 43-45. In addition, U.S. patent application "Fabrication of Solid-State Nanostructures including sub-50 nm Solid-State Nanostructures Based on Nanolithography and Wet Chemical Etching" (Ser. No. 10/725,939 filed Dec. 3, 2003 to Mirkin et al.) also describes etching and monolayer resists which can be used in the invention and is incorporated by reference in its entirety.

The text *Fundamentals of Microfabrication, The Science of Miniaturization, 2$^{nd}$ Ed.*, Marc J. Madou, describes micro and nanotechnologies including additive and substractive methods, for example, lithography (Chapter 1), pattern transfer with dry etching methods (Chapter 2), pattern transfer with additive methods (Chapter 3), and wet bulk micromachining (Chapter 4). Also, the text *Direct-Write Technologies for Rapid Prototyping Applications: Sensors, Electronics, and Integrated Power Sources* (Eds. A. Pique and D. B. Chrisey), describes micro and nanotechnologies including additive and substractive methods. For example, bulk micromachining and etching are described on pages 617-619. DPN printing on the Sub-100 nanometer length scale is described in Chapter 10.

Additional Embodiments

Embodiment 2

Cantilever Microdeposition and Curing for Producing Conductive Metallic and Other Patterns In a preferred embodiment, for example, the invention provides a method for writing conductive metal comprising: (1) providing a cantilever having a cantilever end, wherein the cantilever can comprise a tip at the end or can be a tipless cantilever; (2) providing an inkdisposed at the cantilever end; (3) providing a substrate surface; and (4) contacting the cantilever end and the substrate surface so that ink is delivered from the cantilever end to the substrate surface. The deposition is preferably followed by localized heat curing step e.g. by use of a medium-power laser or an infrared gun.

In another preferred embodiment, stamp tips are used to deposit material which are described further below. Stamp tips are described in, for example, U.S. provisional patent application 60/544,260 entitled "Direct-Write Nanolithography with Stamp Tip: Fabrication and Applications" to H. Zhang et al. and filed Feb. 13, 2004, and U.S. regular patent application Ser. No. 11/056,391 filed Feb. 14, 2005 which are hereby incorporated by reference in their entirety.

Cantilevers are known in the art and are available from, for example, MikroMasch USA (Portland, Oreg.). Cantilevers can be coated and functionalized as desired. Tipless cantilevers are also known in the art as described in, for example, U.S. Pat. Nos. 5,958,701 to Green et al.; 6,524,435 to Agarwal et al.; and 6,573,369 to Henderson et al.

An important feature of the invention is that the geometry and shape of the cantilever can be used to control at least one dimension of the features formed on the substrate surfaces from inks.

The ink is not particularly limited, although a primary embodiment of the invention is metal-based inks, including both metal precursor inks, often using metal salts, and metal nanoparticulates inks. Useful embodiments are described further in patent application no. 16 (conductive patterns) noted above and described further below.

In general, the three primary ink components include (1) the primary material to be deposited such as, for example, one or more metals or metal salts, (2) one or more solvents, and (3) one or more additives if desired. One can adjust the components of the ink to function together with the cantilever, the tip if present, and the substrate.

Inks can be fully or partially dried, if desired, on the cantilever or the cantilever tip before delivery to the substrate surface. Inks can be fully or partially dried on the substrate surface after delivery.

The nanoparticles of the ink are not particularly limited although a primary embodiment of the invention is metal-based inks. Inorganic compounds can be used in the nanoparticles. The nanoparticles can be substantially homogeneous or can be heterogeneous. They can have a core-shell structure if desired. They can have organic surface coatings or shells if desired. They can be magnetic in nature. They can be semiconductive in nature, whether doped or undoped. Nanoparticles can be electrically insulating or have an insulating shell. The nanoparticles can be hydrophilic or hydrophobic. Nanoparticles can also be precursors to other technologically useful materials including electrical conductors, magnetic materials including ferromagnetic materials, semiconductors, and optical materials. Nanoparticles can exhibit quantum confinement effects and show useful properties such as for example electroluminescent and photoluminescence of various colors. Nanoparticles can be functionalized to chemisorb to or covalently bond to the surface.

The solvent system is not particularly limited. Ink solvents which are high-boiling are generally preferred. For example, solvents with boiling points above about 100° C. and more particularly above about 150° C. can be used. Aromatic hydrocarbons are one kind of high boiling solvent for example.

Upon delivery to the substrate surface, the inks can begin drying as desired for form features which are preferably stable over time after, for example, one month. Preferably, the features can be cured and made stable against rinsing with solvents including aggressive solvents and etching systems. Features can be subjected to annealing, light, lasers, electric currents, and other stimulations.

Often, it is desired to form continuous masses of structures which provide, for example, high electrical conductivity. Often it is desired to form high quality contacts between the features and the surface or other features on the surface such as, for example, electrodes.

Features can be nanostructures or microstructures. The height of the feature is not particularly limited as layering can be carried out to build up height. Lateral dimensions such as length and width are not particularly limited as the methods described herein can be used to prepare nanoscale and micron scale dimensions. For example, dot diameter or line width can be, for example, about 5 nm to about one micron. Alternatively, dot diameter or line width can be, for example, about one micron to about 100 microns, or about 5 microns to about 25 microns.

Additional references are described throughout the rest of the specification for use in practicing the present invention. No admission is made that any of these references are prior art. The invention is further described by the following non-limiting examples.

WORKING EXAMPLES

In the following examples, gold and platinum traces were written by this new method to yield low resistivity traces that adhere strongly to substrates such as glass. The working examples are subdivided into (1) an experimental section, and (2) results and discussion.

Experimental

Materials

All metal salts were purchased in highest available purity from Aldrich (Milwaukee, Wis.). Silicon nitride cantilevers with tips and without tips and with different beam widths were prepared via standard microfabrication methods. To further test the effect of cantilever width, some cantilevers were narrowed using focused ion beam (FIB) technology.

Nanoparticle Preparation

Nanoparticles were prepared using the method described by Murray and coworkers in M. J. Hostetler, et al., *Langmuir* 14, 17 (1998).

Patterning

Micron sized patterns were generated using the translation stages of Thermomicroscopes CP Research instruments or NSCRIPTOR (NanoInk, Chicago, Ill.) instruments. Cantilevers were coated with different metal precursor inks by using the z-stepper motors to bring the cantilevers into contact with microfabricated inkwells filled with ink. The z-motor and x-y translation stage were then used to position the coated cantilevers over the substrate, and to bring the cantilever into contact with the surface. The cantilevers were brought into contact at a slight angle (several degrees) so that only the end of the cantilever touched the surface. A slight bending of the flexible cantilever as monitored by optical microscopy indicated that contact has been achieved. Note that for patterning micron scale features, it was not necessary to use the force feedback and piezoelectric scanning/positioning features of the instruments. However, for nanoscale patterns these fine positioning features provided control of feature size and alignment at the sub-micron and in some cases sub-100 nm scale.

Results and Discussion

Ink Deposition

A new method for directly writing ink on surfaces was developed that enables line and dot patterns with dimensions of hundreds of microns and as small as sub-micron. The ink delivery method involved the following general steps:

Ink Loading

A flexible cantilever was loaded with an ink. Depending on the application, the cantilever can have a sharp tip on the end, or be tipless, and can have various end shapes and widths, from several microns to hundreds of microns. Ink loading can be performed passively by bringing the cantilever in contact with a droplet or reservoir of ink and then removing it. The ink wets the underside of the cantilever and adheres through cohesive forces. Passive loading and delivery of ink was demonstrated in the working examples. The methods described by C. Bergaud and collaborators to actively draw up liquid inks and control the deposition via electrowetting and dielectrophoresis can be also used.

Approach

The cantilever can be brought into contact with the surface for patterning. In most cases, a laser force-feedback mechanism is not required, nor is a piezoelectric scanning/positioning mechanism required. Mechanical "Z" stepper motors can be used to bring the cantilever into contact with the surface, and optical microscopy can be used to detect defection of the cantilever when it comes into contact with the surface.

Feature Control

Figure 7:
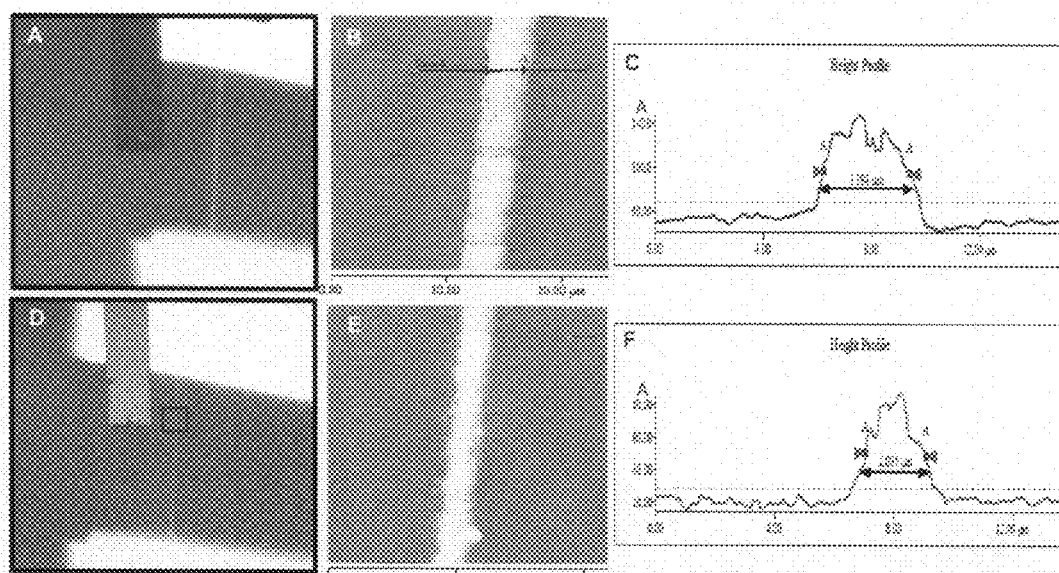
FIG. 7. Au Nanoparticles deposited between gold electrodes. (A) and (D) optical images of a gold lines formed across two electrodes. (B) and (E) Topographic AFM images of 3 and 2 µm wide lines and 8 nm height, in the red and blue boxed area in (A) and (D), respectively. (C) and (F) correspond to the cursor profile of the fabricated line.

Line patterns can be formed by drawing the cantilever along the surface. With NSCRIPTOR and Thermomicroscope CP Research platforms "X" and "Y" stepper motors or fine manual positioning screws can be used to translate the lever along the surface in the form of the desired pattern. Commercial high-resolution piezoelectric stage (NPoint, Madison, Wis.) may be retrofitted in either instrument. With the NSCRIPTOR platform, one can use custom pattern design software to direct the motion of the cantilever. Importantly, if the cantilever is translated along the surface in the direction of the long axis of the cantilever, the width of the line can be directly related to the width of the end of the cantilever as shown in FIG. 1. Thus, one can control the shape of the lines, e.g. the width of the lines, via the geometry of the cantilever. Using standard microfabrication techniques it is possible to fabricate cantilevers with widths of about 1 micron to about 100 microns. Therefore, with this method, line patterns can be generated that have widths under a micron to well over 100 microns. The large range of line widths that can be patterned using various cantilever configurations is shown in FIGS. 1 through 7. For example, FIG. 1 shows optical images of 60 and 45 micron wide lines. FIG. 6 shows optical and AFM height images of 5 and 4 micron wide lines, and FIG. 7 shows 3 and 2 micron wide lines. Even at the narrowest line widths, the lines are sufficiently continuous to yield resistivities as low as 4 microohm·cm.

The best feature control was achieved with straight beam shaped cantilevers and that "V-shaped" or "A-shaped" cantilevers did not produce lines of controlled width. Also, one can achieve control over line shape with a wide variety of cantilever spring constants (i.e. stiffness from 0.004 N/m to 0.19 N/m) and lengths (150 to 300 micron). Also, the optimum length for a cantilever of fixed width depends on the spring constant of the material. In practice, very good line control was achieved with 15 micron wide cantilevers that were 150 microns long, with spring constant of 0.032 N/m, but only fair line control was achieved with 15 micron wide cantilevers that were 300 microns long with spring constant of 0.004 N/m. Advanced lithography methods such as focused ion beam can be used to further reduce the dimensions of the cantilever by milling. Note that the process works equivalently when the surface is translated under a stationary cantilever. With current instrumentation, one can fabricate lines as wide as 100 microns and down to less than a micron with a single cantilever pass at a speed of 20 microns/second, although the higher conductivity traces are obtained from writing speeds of 10 microns per second.

Feature Height Control

By controlling several patterning variables, one can vary the height of the line traces. In general, the thickness of the line pattern generated by a single pass can be under 1 nm to several hundred nanometers after curing (see following section). To ensure optimal control over the line shape, the cantilever is brought into contact with the surface at an angle greater than several degrees, rather than parallel to the surface. One can vary the height of the traces by controlling the distance between the cantilever and surface, the force or bending of the cantilever, and the tip translation speed.

When the cantilever is pressed to the surface with high force, the height of the patterned traces is decreased. To achieve the maximum height per pass for metal inks, one can maximize the distance between the cantilever and surface as much as possible without losing contact. Thus, using inks with greater viscosity and high metal concentration enables higher patterns with this method. In preliminary experiments, the force was approximately controlled by varying the separation between the cantilever and the surface while monitoring the cantilever deflection. One can further improve height/force control by imbedding piezoelectric material within the cantilevers to sense the force between the cantilever and the substrate during approach to the surface and patterning. Qualitative observations have implied that another method of increasing the height of the patterns is to decrease the translation speed of the cantilever during patterning. With slow tip translation, 100 nm high features (after curing) can be generated in a single pass. To form dot patterns the cantilever is brought into contact with the surface, maintained in contact for a fixed time (usually several seconds), and then removed.

Split and Multiple Cantilevers

Figure 8:
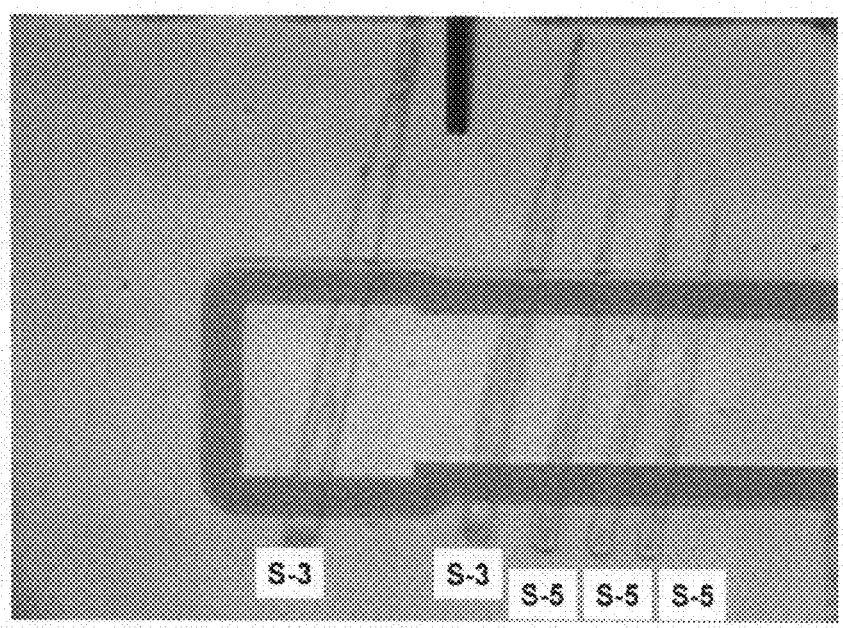
FIG. 8. Platinum/gold alloy ink deposited between gold electrodes on silicon oxide using cantilevers. Each line was formed by dipping a cantilever into an ink-filled inkwell and then drawing a line until the cantilever ran out of ink. Note the similarities in line shape and length.
Figure 9:
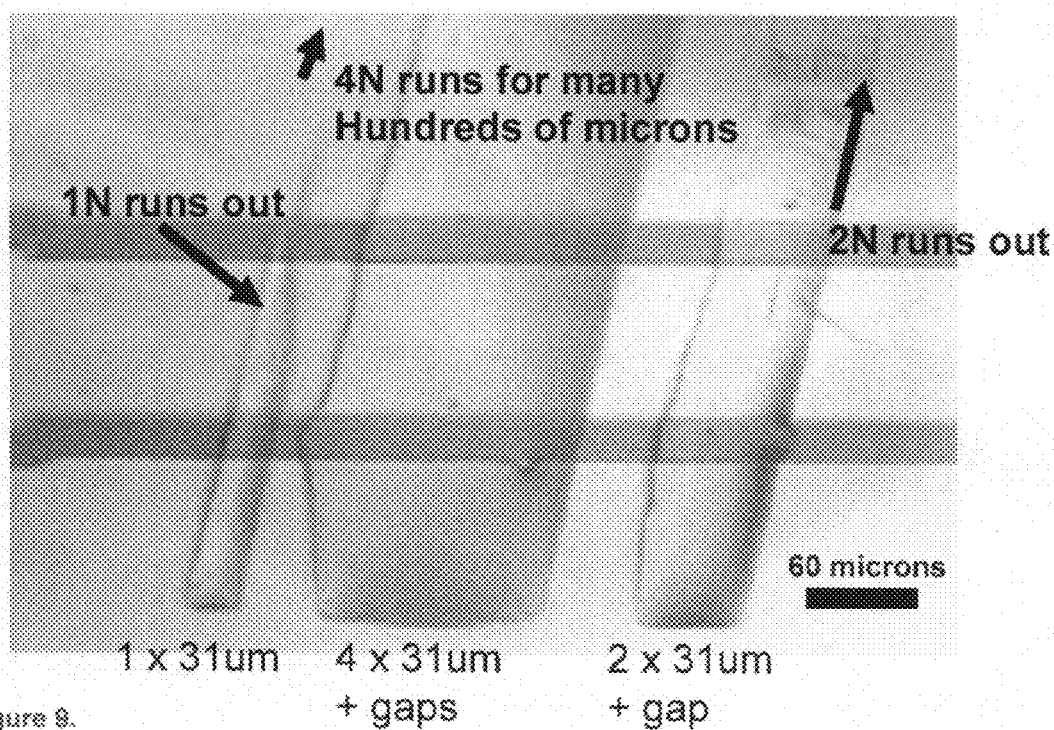
FIG. 9. Platinum/gold alloy ink deposited between gold electrodes on silicon oxide using adjacent cantilevers. Each of the three lines was fabricated using a single cantilever or adjacent cantilevers loaded with ink. The line on the left was generated by drawing a single 31 micron wide cantilever across the surface until it ran out of ink The widest, middle line was generated using 4 adjacent 31 micron wide cantilevers, and the right line was generated by 2 adjacent 31 micron wide cantilevers. Note that the maximum length of the lines increases with increasing number of writing cantilevers.

One can increase the maximum ink loading, and thus the maximum line length, by changing the geometry of the cantilever. With single cantilevers that are 50 microns to 200 microns long, one is able to reproducibly obtain lines as long as several hundred microns with a single loading step, as shown in FIG. 8 for two different tip geometries. One can greatly improve the total supply of ink (i.e. the volume available from a single dip) by writing with adjacent cantilevers that have a very small gap (microns) between them. The increased ink supply can yield higher patterns or longer line patterns. The slit or gap in between the cantilevers acts as a reservoir to hold ink due to capillary action. When the cantilevers are closely spaced (several microns to 10 microns) this strategy can also be used to increase the line width of the traces. Alternatively, when multiple cantilevers are placed further apart they can be used to generate dot or line patterns of the same or different inks in parallel. FIG. 9 is an optical image of patterned lines generated with multiple adjacent cantilevers. Note how the maximum line length (and thus ink loading) obtained increases with the increasing number of cantilevers in the 'pen' (1, 4, 2 adjacent cantilevers). Also note the increase in line width scales with the number of cantilevers in the pen.

Layering

One can increase the height of the line and dot patterns by applying multiple layers. Typically, for metal inks, each layer is first cured by heating before a second layer of the same metal precursor ink is applied. A nanoscale two-layer palladium pattern is shown in the AFM images and line scans in FIG. 10. Note the increase in height from 2 nm for the first layer to 10 nm for the second layer. The ink used in this experiment was a saturated solution of palladium acetate dissolved in 80% ethylene glycol: 20% water. For other applications it may be necessary to build layered features of dissimilar materials, such as metals, oxide, and semiconductors. For these experiments the substrate was removed from the patterning instrument to cure each layer, however, improved instrumentation could include an energy source that can anneal or sinter ink as it is deposited onto a surface. The energy source may be a heated sample stage for thermal curing, a laser or other light source, or a method of applying a current to the substrate to induce conversion of the ink to the final metal or metal oxide form.

Inks

The general method for patterning conductive features comprises the steps of choosing an appropriate precursor ink and dispersant, applying the ink to the surface, for instance using the method described in the previous sections, and finally treating the pattern to convert the precursor material to the final desired material, for example by applying energy, such as heat. In this section, two different nanoparticle ink strategies are described that are compatible with this patterning method. For specific applications it may be also useful to use variations or combinations of the different inks.

1. Monolayer Protected Nanoparticle Inks

Because of the high melting points of inorganic materials, it is not generally desirable to directly write them onto substrates. However, nanoparticles (diameters less than 100 nm) of many materials exhibit extreme melting point depression (as much as 1000° C.) compared to the bulk materials. Thus, nanoparticles offer a route to inks for direct-write deposition of metals and metal oxides that can be converted to continuous films at low temperatures. This principle has been applied by others, for example, in combination with ink jet technology. Jacobson et al (U.S. Pat. No. 6,294,401) generated II-VI semiconductor patterns, starting with nanoparticles inks such as CdTe and CdSe (see also Ridley et al. Science 1999 286 746-749.) The best nanoparticles for direct-write inks are easily dispersed in carrier solvent or matrix, have a good stability in ambient conditions, are inexpensive to prepare, and can be converted cleanly to continuous films at low temperatures.

Ink Preparation

Various alkanethiol-capped gold nanoparticles were prepared following the method described by Hostetler, Murray et al. This method has been also used to prepare other metallic nanoparticles such as platinum, palladium, and silver. In addition, there are a number of similar methods of preparing stabilized nanoparticles of other metals that would be equally useful for this application. Such methods use various surfactants, lipids, and polymers to prevent the particles from agglomerating. However, the Hostetler, Murray method was chosen because the synthetic procedure is relatively simple and it yields stable particles that can be decomposed into metal films at low temperatures. Subramanian and coworkers reported that the temperature at which the nanoparticles convert to a continuous film is strongly related to the number of carbons in the stabilizing surfactant and the diameter of the nanoparticle, with shorter chains and larger particles decomposing at lower temperatures (Huang, J. Electrochem. Soc. 2003, 150, G412.)

Hexanethiol was chosen for hydrophobic particles and thiotic and mercaptosuccinic acid for hydrophilic particles. After synthesizing the particles according to the procedure described by Murray and coworkers, inks were prepared by dispersing the particles in solvents with high boiling points, such as mesitylene, xylene, and dimethylformamide to reduce evaporation of the inks.

Nanoparticle Ink Deposition and Conversion to Metal

In order to attain inks that are compatible with the substrate of interest, it is generally useful to choose a thiol capping surfactant and solvent that enables the ink to wet the surface. For example, when nanoparticles are prepared using hexanethiol as the surfactant, the nanoparticles are hydrophobic, and disperse well in non-polar solvents such as toluene, mesitylene, and xylene. These inks were very useful for patterning hydrophobic or uncleaned surfaces. On the other hand, nanoparticles prepared with thiotic acid or mercaptosuccinic acid disperse in relatively polar solvents, such as alcohols, so they were used to pattern on hydrophilic surfaces including clean glass, quartz, oxidized silicon, silicon, and silicon nitride. When the ink is incompatible with the surface it doesn't form a continuous line, but de-wets from the surface to form droplets. Some non-polar solvents such as mesitylene were useful for both hydrophilic and hydrophobic glass surfaces. After depositing the ink onto suitable substrates, the nanoparticle patterns were converted to continuous metallic films by heating the surface with a hot air gun at 250° C. for several seconds. In principle, the nanoparticles can be converted into bulk metal using many different sources of energy, including a laser or heated stage, as long as the temperature is sufficient to remove the insulating organic shell. In FIGS. 1 through 7, optical images show gold traces written between two gold electrodes before and after curing, and an AFM line scans showing average heights of approximately from 12 nm to 90 nm can be obtained with a single layer of ink.

Surprisingly, the addition of long chain carbon compounds, for example C-5 to C-50, preferably C-10 to C-18, gives improved results. Preferably, the long chain carbon has a boiling point of 200° C. or greater. Similar to the ink composition of the examples shown in FIGS. 1 and 2, we added long carbon chain compounds (preferably 10 to 18 carbon) with high boiling point to the ink formulation. For example, dodecane or pentadecane with boiling point 215 and 270° C. respectively may be used. In the examples shown in FIG. 3 to 7, we attended 1-2 microliter of pentadecane to the 4 microliter of nanoparticles solution composed of (nanoparticles, mesitelyne and thiotic acid), these long chain carbons will interact and inter-digitate with the carbon chain on the nanoparticles to form a three dimensional structure to form continuous and homogeneous films as shown in the optical images of FIG. 3 to 7 in comparison with the optical images of FIGS. 1 and 2. By comparing the AFM images of FIG. 2D with FIGS. 3C, 4 A&B, 5C, 6 B&E, 7 B&E, few cracks or holes were observed in FIG. 3 to 7, and a relatively smooth surface is formed after curing in comparison with FIG. 2D where holes and cracks are present. The addition of the long chain carbon reduced the evaporation rate on the surface or in the inkwells from a few minutes for mesitylene to a couple of hours for pentadecane, which helped in the formation of homogenous lines shown in the optical images of FIG. 3 to 5.

Properties of Gold Traces

Figure 40:
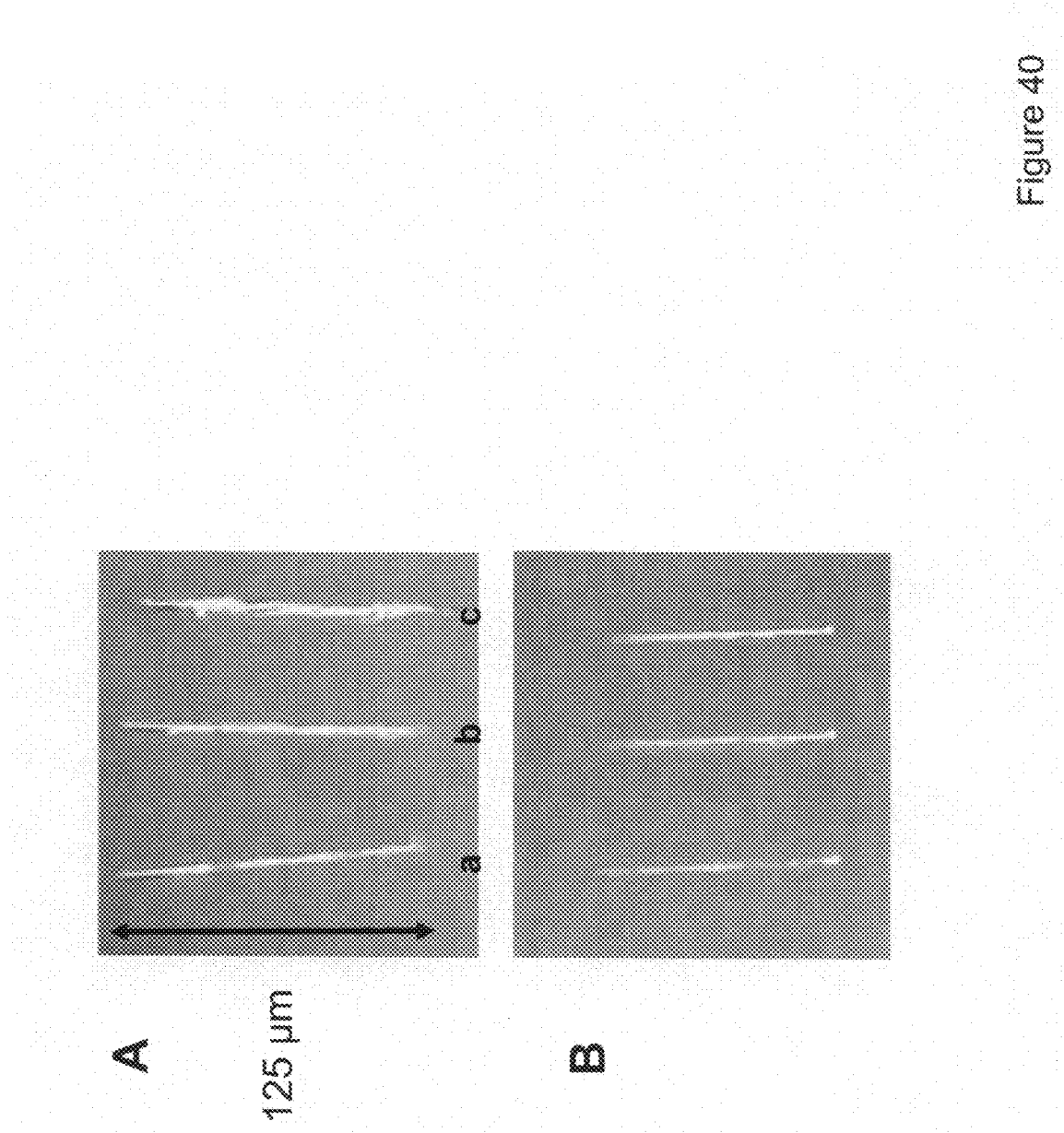
FIG. 40. Adhesion Tests. Single-layer gold lines were deposited onto glass on three adhesion test samples and cured for ~10 seconds at 150° C. Tape peel tests showed no loss of adhesion to the substrate and the lines withstood chemical cleaning.

Surprisingly, gold films prepared from nanoparticle precursors adhered very well to clean glass surfaces (see FIG. 40), although the nature of the capping group can play a significant role in adhesion. For instance, nanoparticles prepared with acid terminated thiol capping groups, such as thiotic acid, formed films on glass that withstood a scotch tape test, where a strip of tape is placed over the pattern, rubbed, and then removed. However, these hydrophilic films on glass were removed by rinsing with water. On the other hand, cured films made from hydrophobic gold nanoparticles (i.e. capped with methyl-terminated alkanethiols such as hexanethiol) were removed by the scotch tape test, but withstood water rinsing treatments. The best overall adhesion and conductivity was obtained by combining hydrophilic and hydrophobic agents and the gold nanoparticles. Specifically, organic soluble ink was made by dissolving nanoparticles prepared with hexanethiol into mesitylene, and then adding 100 mg/ml of thiotic acid. Single layer patterns of this hybrid ink remained intact after the scotch tape adhesion test, and also withstood water rinsing. In fact, the ink had excellent writing properties, wetting glass surfaces well during writing, and curing cleanly at 250° C. Evidence of the excellent resistance to scotch tape and rinsing tests is shown in FIGS. 1 and 2. The resulting gold thin films are metallic yellow, approximately 50-100 nm thick as measured by AFM, and exhibit excellent conductivity, as measured by a two-probe configuration. For example, traces such as the one shown in FIG. 2 that are approximately 250 microns long and 15 microns wide have measured resistances of about 18 ohm. Therefore, a resistivity of 8 microohm·cm was calculated for this particular trace, and resistivities for patterned traces as low as 4 microohm·cm have been measured. For reference, the bulk resistivity of gold is 2.44 microohm·cm. Similar results can be obtained by preparing inks from nanoparticles that have a ratio of acid-terminated thiols and hydrophobic methyl-terminated thiols. Particles with different ratios of dissimilar thiol capping molecules can be prepared in situ, or tailored using place exchange reactions as described by Hostetler and coworkers (M. J. Hostetler, S. J. Green, J. J. Stokes, and R. W. Murray, J. Am. Chem. Soc. 1996, 118, 4212-4213.) Although gold particle inks were demonstrated in this example, the patterning method is generally applicable to any nanoparticle material that can be prepared with capping ligands. There are various reports in the literature of procedures for making particles with sizes in the range of less than a nanometer to 100 nanometers, from materials including Cu, Pd, Ag, Ru, Mo, CdSe, Ni, Co, and others.

Nanoscale Patterns with Nanoparticle Inks

Figure 11:
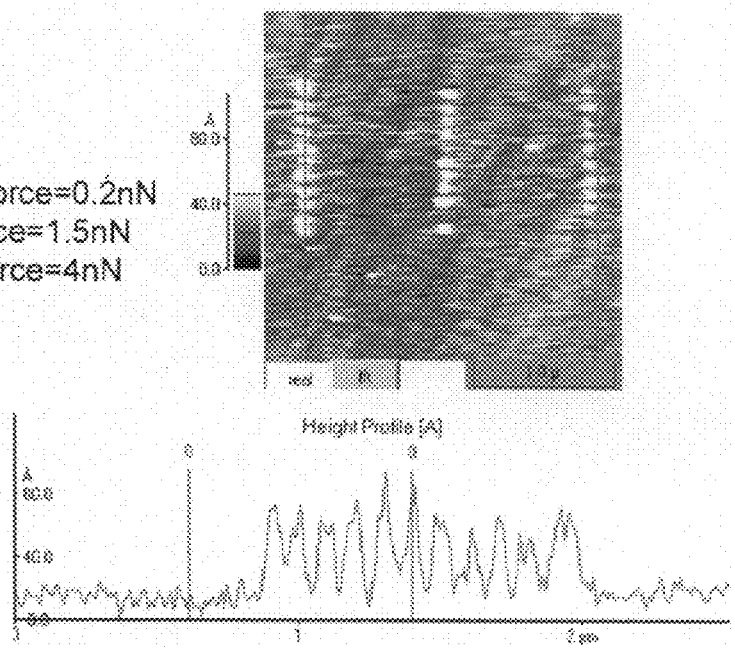
FIG. 11. AFM height images of nanoscale gold patterns on quartz. Gold nanoparticle ink was patterned by holding an ink-coated conventional silicon nitride AFM cantilever/tip in contact with the surface for 10 s at a constant force. The rightmost row of dots (diameter 50 nm, height 3.5 nm) were formed at a force of 0.2 nN, the middle row of dots were formed at a force of 1.5 nN (diameter 65 nm, height 6 nm) and the leftmost row of dots were formed at a force of 4 nN (diameter 85 nm, height 7.5 nm). The patterns were imaged immediately after patterning with the coated tip.
Figure 13:
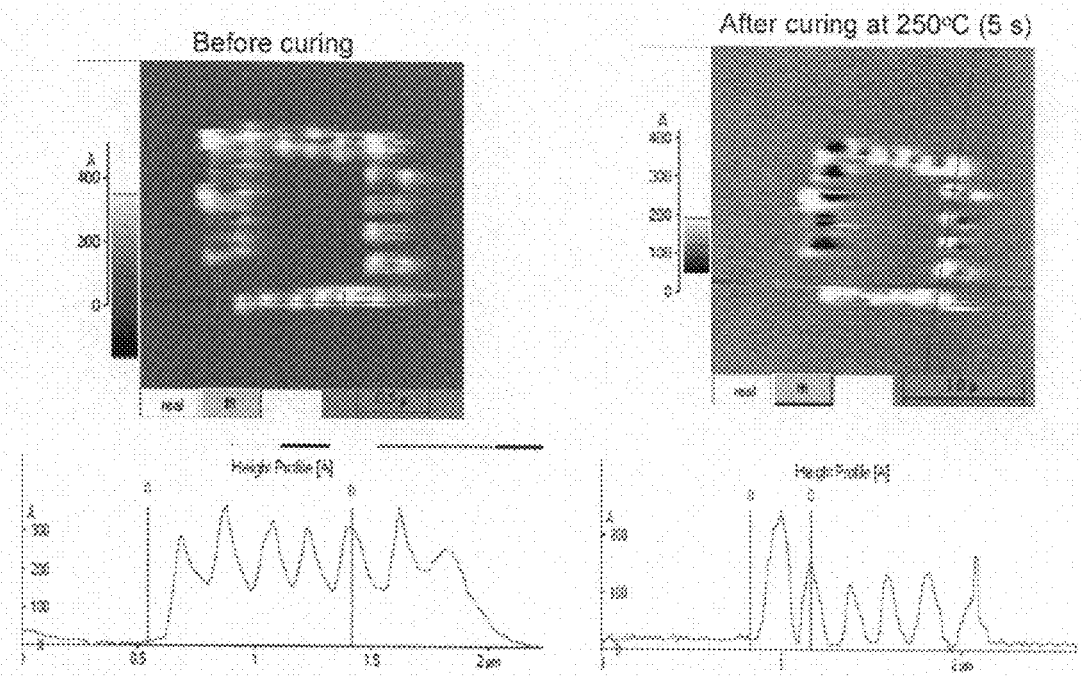
FIG. 13. AFM height images of nanoscale gold patterns on quartz. Gold nanoparticles dissolved in mesitylene (the 'ink') were patterned by holding an ink-coated conventional silicon nitride AFM tip in contact with the surface for 10 seconds. The resulting pattern was cured for 10 seconds at 250° C. using a heat gun and then imaged. After curing, the height of the particle patterns decreases from around 30 nm to around 15 nm.

The nanoparticle-based ink formulations can be patterned using the Dip Pen Nanolithography printing method to yield sub-micron sized patterns. In one experiment, hexanethiol-capped gold nanoparticles (saturated solution in mesitylene) were patterned on quartz using a silicon nitride cantilever/tip assembly. Specifically, tips were coated in nanoparticle ink by contacting the tip with a droplet of nanoparticle ink in a silicon inkwell for several seconds. The coated tips were then used to generate line and dot features on a quartz surface. For example, dot patterns were generated by holding the tip in contact with the surface for 10 seconds, as shown in FIG. 11. The diameters and heights of the dots were varied from 50 nm to 85 nm wide and from 2.5 nm to 7.5 nm high by changing the applied force from 0.2 nN to 4 nN. Lines were generated by translating the tip across the surface at a fixed rate (~0.15 microns/second). The height and width of the lines can also be varied by changing the applied force, as in FIG. 12. The nanoscale particle patterns were cured by applying heat (250° C., 5 s) from a heat gun, and verified by re-imaging, FIG. 13.

2. Polyol Inks

Another method of preparing nanoparticles is to chemically reduce metal salts in the presence of alcohols or polyols with heat. This method was reported by Figlarz et al. as a means of making dispersed nanoparticles (U.S. Pat. No. 4,539,041). The method was improved by Chow et al who reported a similar method to form continuous films. One can creatively and advantageously adapt this polyol process for forming nanoparticles for use as an ink for nanoscale and microscale conductive patterns.

Ink Preparation

The general formula for the metal precursor inks comprises alcohol containing matrix and metal salts. After patterning, the salts are transformed in situ into nanoparticles, which coalesce into metal films with increased heat. In preliminary experiments this process has been demonstrated for metals such as Au, Pt, Pd, and Ag, although many other metals and metal alloys (outlined in U.S. Pat. Nos. 5,759,230 and 4,539, 041) are also amenable to this process.

Nanometer Scale Patterns with Polyol Inks

Working Example 1

Figure 10:
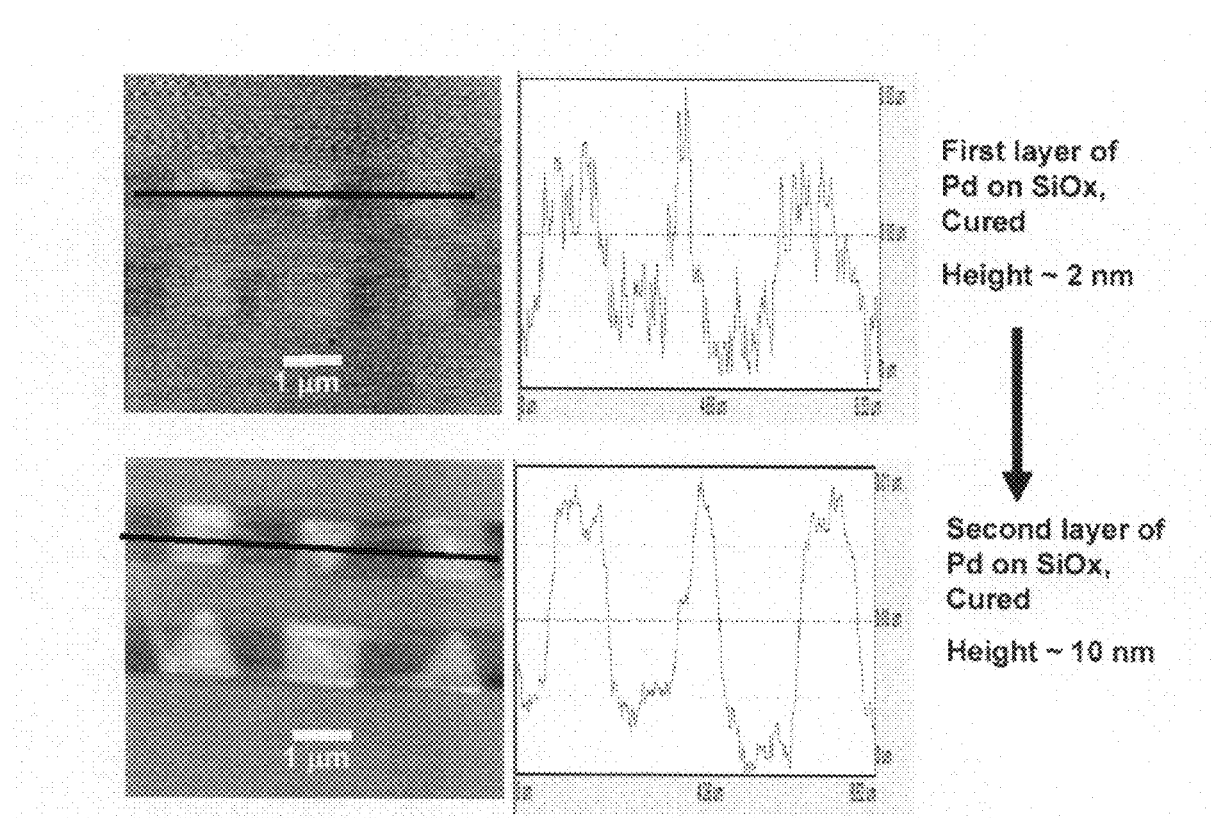
FIG. 10. AFM height images of nanoscale palladium patterns on silicon oxide. Palladium acetate dissolved to saturation in 80% ethylene glycol was patterned using a PDMS coated silicon nitride AFM tip. The line scans of the cured patterns reveal a increase in height from 2 nm to 10 nm between the first and second layers.
Figure 14:
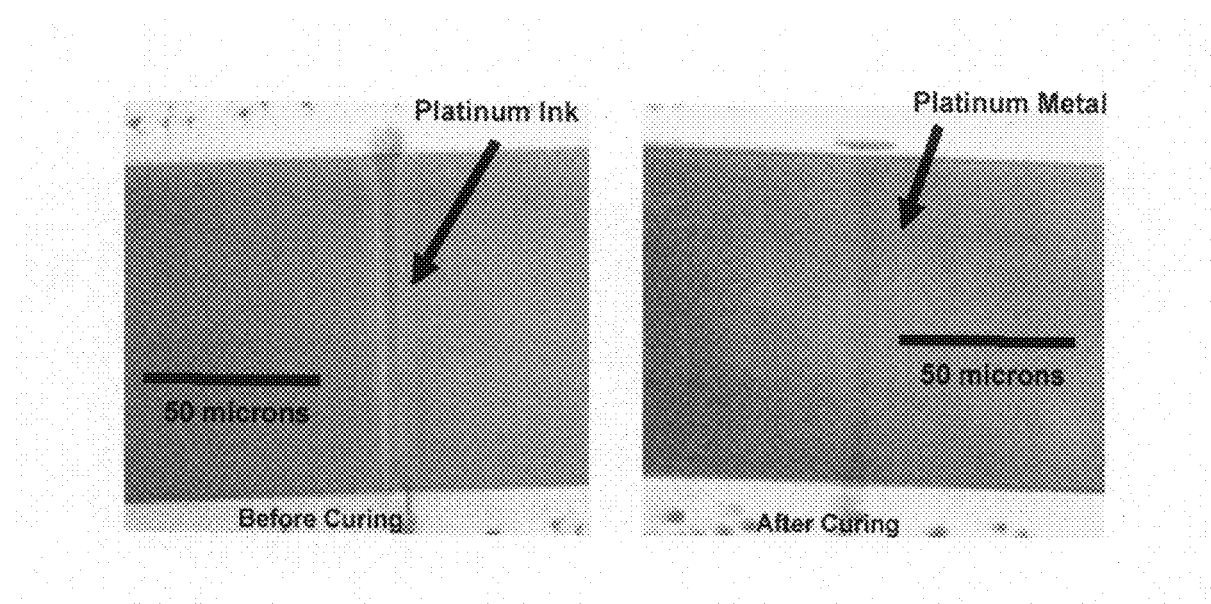
FIG. 14. Optical image of a micron scale platinum line drawn with a silicon nitride cantilever across gold electrodes on a silicon oxide wafer. The platinum ink comprised platinum chloride dissolved in 80% ethylene glycol (100 mg in 15 microliters). The precursor ink was converted to metal by heating on a hot plate a 200° C. for 20 s. The width of the line after curing was approximately 5 microns.

Nanoscale features of platinum using a precursor ink consisting of 10 mg/100 µL hydrogen hexachloroplatinate (IV) hydrate dissolved in 20% Millipore water and 80% ethylene glycol have been written. This ink can be written onto clean glass or silicon oxide substrates using the DPN printing technique. For micron sized patterns a tipless cantilever gives the optimal control over pattern size and thickness, whereas for nanoscale patterns a cantilever with an ultrasharp tip (e.g. silicon nitride) on the end of a flexible cantilever offers the optimal resolution. After deposition the precursor patterns are converted to metal features by heating with a hot plate or a hot air gun. This curing or conversion reaction occurs rapidly (several seconds) at temperatures around 250° C. The thickness of the patterns can be increased by adding layers of ink in between curing steps. FIG. 10 shows layered nanoscale patterns generated on silicon oxide using this ink. A similar method was used to draw micron sized platinum traces on silicon oxide between gold electrodes. FIG. 14 shows a 110 micron long line drawn with the platinum chloride ink by translating an ink-coated cantilever in the direction parallel to its short axis. After curing, the single layer of ink had high resistance, but subsequent layers could be added to increase the height of the pattern, and thus the conductivity.

Working Example 2

Figure 15:
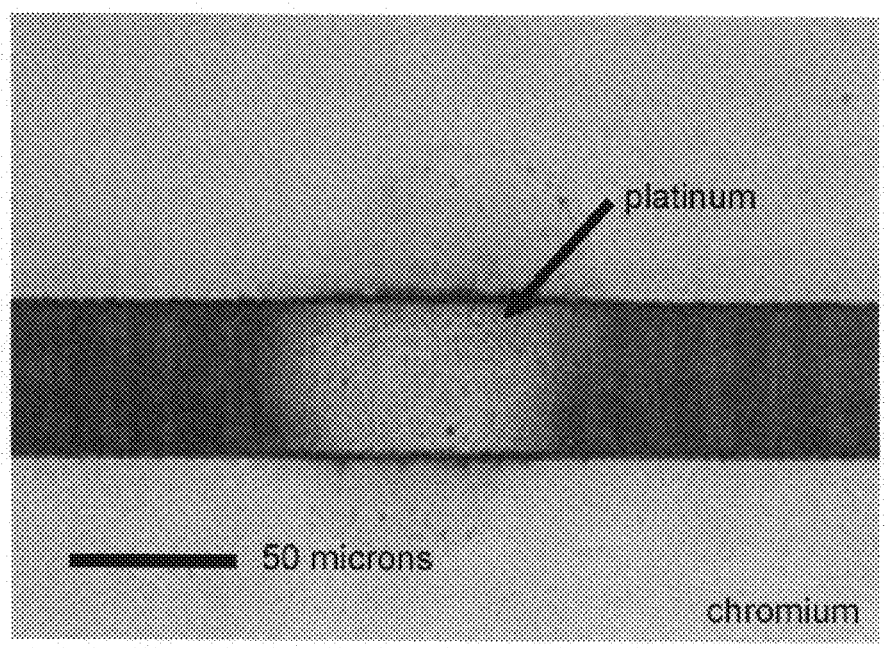
FIG. 15. Optical image of a cured micron scale platinum line drawn with a silicon nitride cantilever across chromium electrodes on a glass wafer. The platinum ink comprised 100 mg of platinum chloride dissolved in 15 microliter aqueous solution containing 30 mg each of 300 and 10,000 molecular weight polyethylene glycol. The precursor ink was converted to metallic platinum by heating with a heat gun at 250° C. for 10 seconds.

In another example, the platinum ink was used to form dot features between micron sized gold electrodes. Dots are formed by bringing a coated tip/cantilever assembly into contact with the surface briefly (several seconds) and then retracting the tip to leave a droplet, as shown in the optical image in FIG. 15. The size of the droplet depends on the wetting properties of the ink to the surface, the loading of the tip, and the in some cases the tip-substrate holding time.

Working Example 3

Figure 16:
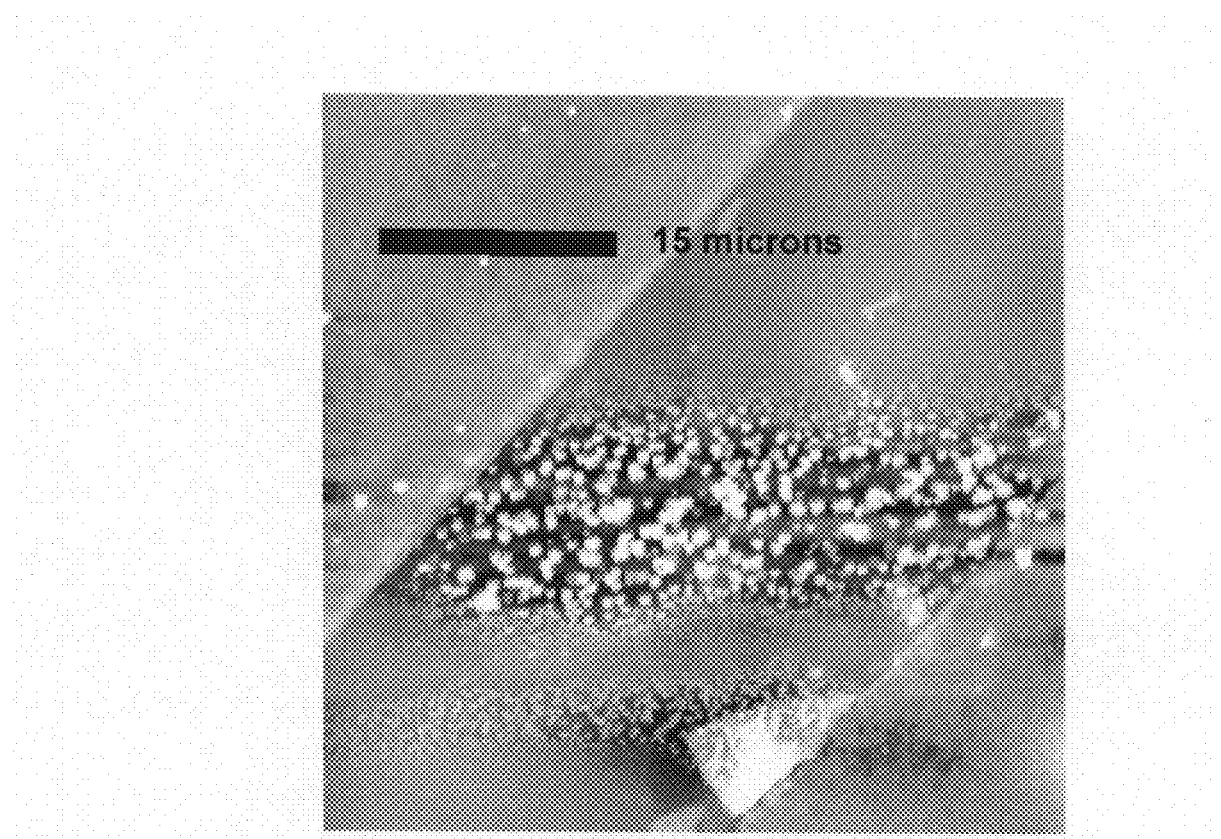
FIG. 16. AFM height image of nanoscale gold features drawn between gold electrodes on silicon oxide. The gold precursor ink solution comprises 100 mg of gold tetrachloride salt dissolved in 80% ethylene glycol/20% water. The large particles are a result of three layers of ink, with each layer cured by heating on a hot plate at 200° C. for 10 seconds. This trace was not conductive.

In order to change the viscosity and wetting properties of the metal salt precursor inks, several different polymers were used as additives. For example, ink properties were improved by replacing ethylene glycol with polyethylene glycol as a reducing agent. A particularly useful platinum ink is obtained by using a mixture of two different molecular weights of polyethylene glycol. To prepare this ink, 100 mg of hydrogen hexachloroplatinate (IV) hydrate in was dissolved in a 15 microliter aqueous solution containing 30 mg each of 300 and 10,000 molecular weight polyethylene glycol. The ink wets glass surfaces well, and after curing with heat forms a conductive platinum film. For instance, FIG. 16 shows an example of a single layer platinum trace drawn between chromium electrodes. After curing, the resistance of the 50 micron long trace was 80 ohms and the trace adhered well to the surface during rinsing and scotch tape peel tests.

Working Example 4

Figure 17:
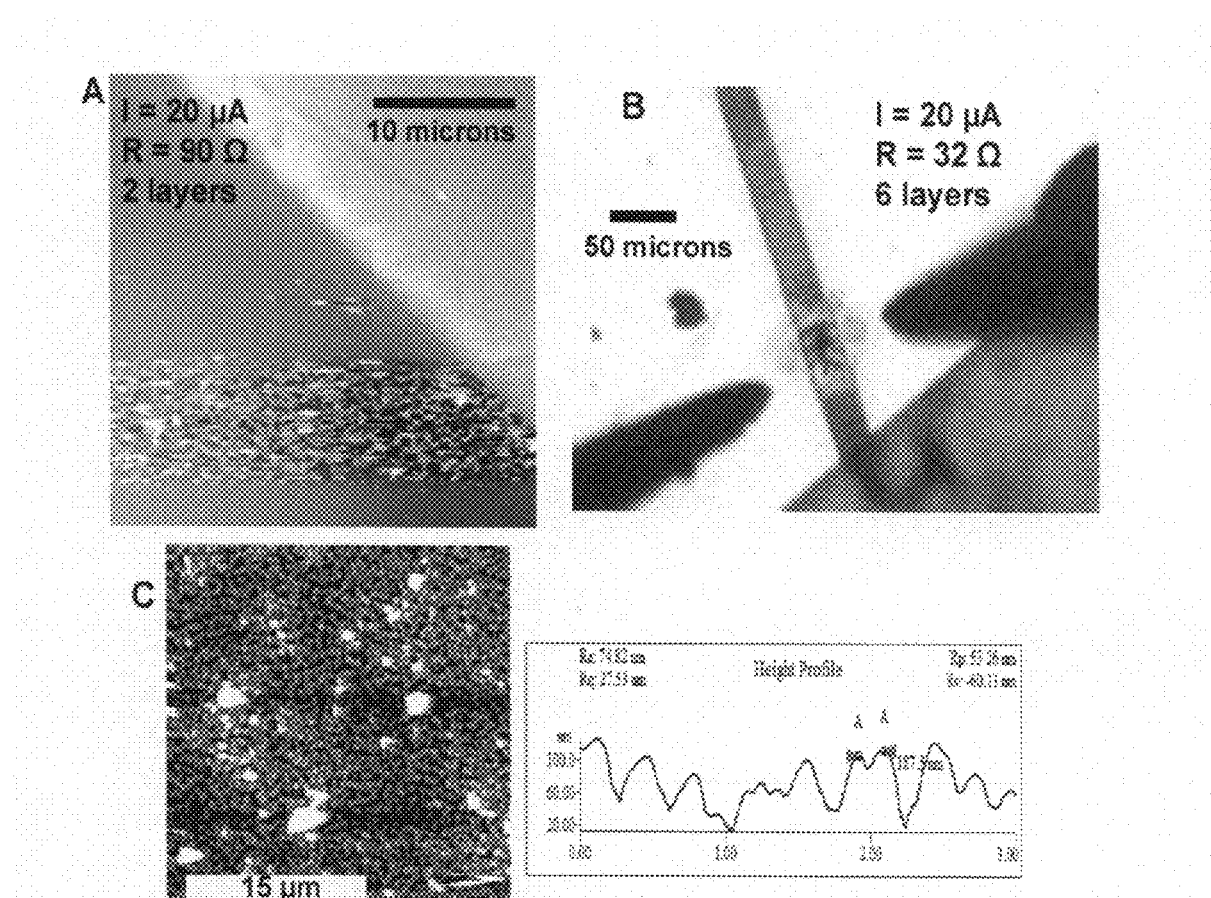
FIG. 17. Images of platinum-gold alloy patterns generated using AFM cantilevers. The alloy precursor ink comprised 100 mg of platinum salt and 50 mg of gold salt co-dissolved in 30 microliters of water containing 60 mg each of 300 and 10,000 MW polyethylene glycol. The traces were cured by heating with a heat gun for 10 seconds at 250° C. (A) A two layer pattern drawn across the 30 micron gap between gold electrodes on a silicon oxide wafer. The resistance of the trace was 90 ohms. (B) A six layer pattern drawn between chromium electrodes on a glass wafer. The resistance of the trace was 32 ohms.

Gold has a much lower bulk resistivity than platinum. Therefore, to improve the conductivity of metal traces for applications such as repair of metal traces in thin film transistors, a similar metal ink precursor was tested based on a gold salt, hydrogen tetrachloroaurate (III) trihydrate. A typical formulation comprises 100 mg of Au salt in 80% ethylene glycol/20% water. The gold precursor inks wet silicon oxide and glass surfaces well during writing, and cured within 5-10 seconds at 200° C. on a hot plate. The resulting films appeared black in an optical micrograph, and according to AFM images, consisted of small isolated particles. Single layer traces were usually non-conductive, and adhered poorly to clean silicon oxide substrates. Subsequent layers (as many as 5) increased the height and diameter of the individual particles to several hundred nanometers, but the large interparticle separations result in high resistivities (several hundred ohms across 100 micron long electrode gaps.) The AFM scan in FIG. 17 shows large gold particles that have formed after 3 layers of gold chloride ink deposited on silicon oxide between gold electrodes.

Working Example 5

A useful ink for forming conductive traces on silicon oxide would combine the properties of the gold and platinum precursor inks. Thus, to obtain the high conductivity properties of gold and the superior deposition and film adhesion properties of platinum, alloy-forming inks were developed based on gold and platinum. For example, one formulation that was very compatible with the patterning method was composed of 100 mg of platinum salt and 50 mg of gold salt co-dissolved in 30 microliters of water containing 60 mg each of 300 and 10,000 MW polyethylene glycol. A two layer pattern, shown in FIG. 17A drawn on silicon oxide across a 30 micron gap had a resistance of 90 ohms after curing. Six layers of the same alloy ink written with a PDMS (polydimethylsitoxane) coated AFM tip between chromium electrodes gave a resistance of 32 ohms after curing and reached a height of 80 nm (FIG. 17B). FIG. 17C shows uniform Au—Pt particles in the 6 layer pattern as measured by atomic force microscopy. To further increase the conductivity of the metal trace, the substrate was immersed in silver enhancement solution for 1 hour. Optical and AFM images indicated that the silver enhancement solution forms a silver coating only on areas that already contain gold. This experiment provides additional proof that the patterns contain gold metal in the fully reduced state. Current-voltage measurements indicate that the resistance decreased to 24Ω after silver was deposited.

Working Example 6

Figure 18:
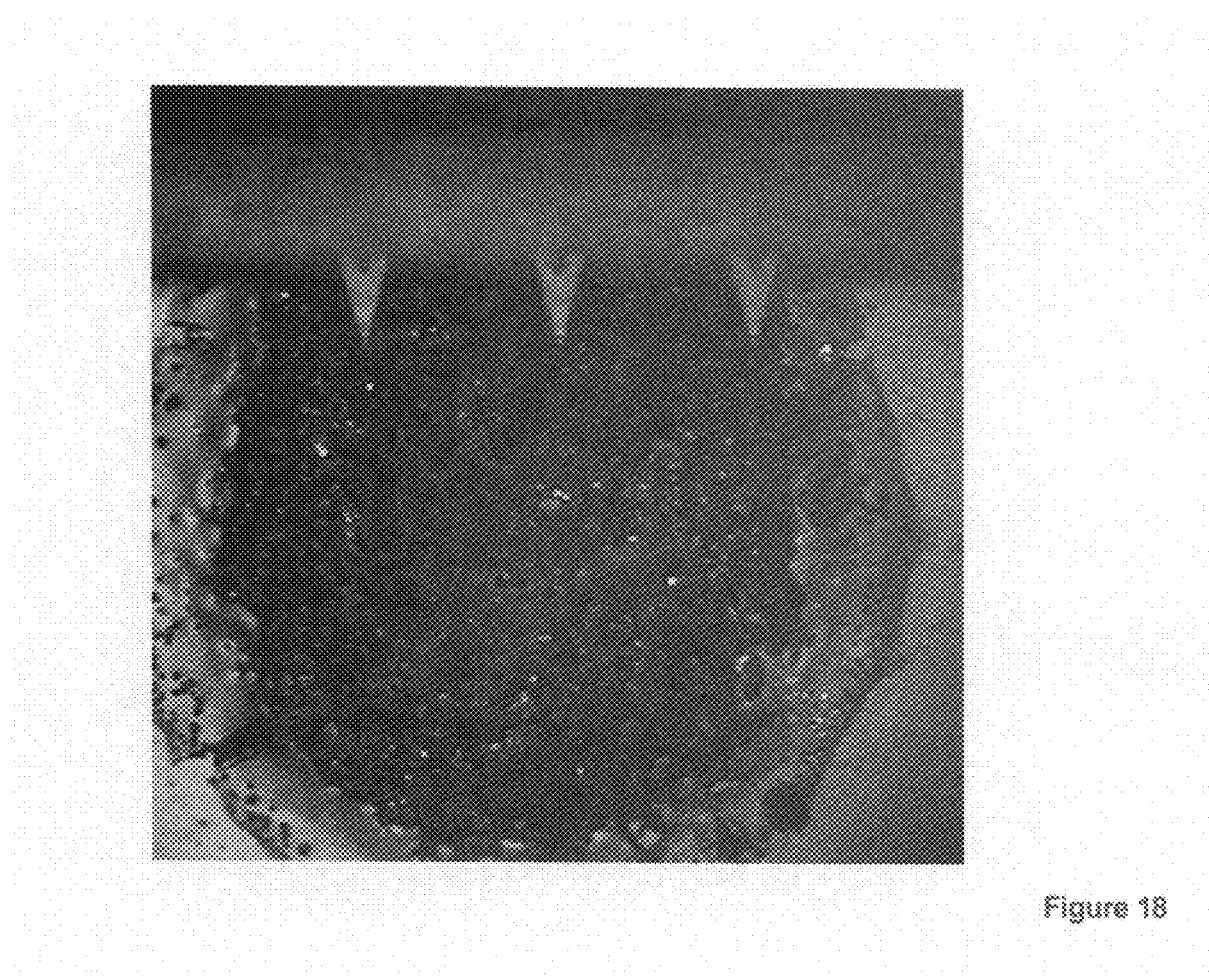
FIG. 18. An optical micrograph of a large gold feature on glass prepared dropping epoxy/gold precursor ink onto the slide and then curing for two hours at 150° C. The gold precursor ink was prepared by dissolving 85 mg of hydrogen gold tetrachloride in 50 microliters of dimethylformamide and then adding 1 microliter of ethylene glycol and 1 microliter of epoxy mixture to 3 microliters of this salt solution. The resistance of the film was 0.3 ohms.

One method of improving the adhesion of polyol inks to glass surfaces (and many other surfaces) is to add small amounts of epoxy to the ink formulation. For one such ink, 85 mg of hydrogen gold tetrachloride was dissolved in 50 microliters of dimethylformamide. To 3 microliters of this salt solution, 1 microliter of ethylene glycol and 1 microliter of epoxy mixture were added. Two part epoxy purchased from Epotek (377 Epotek) cured in 1 hour at 120° C. in the absence of metal salts, and epoxy purchased from Aldrich (bisphenol-F) cured in 1 minute at 150° C., although the curing time increased in the presence of the gold salts. The resulting ink mixture transported easily to the surface during standard deposition processes, but did not wet glass surfaces very well. After patterning, heat was used to convert the metal salt into nanoparticles, and to cross link the epoxy. The resulting film adhered extremely well to glass surfaces, withstanding all standard cleaning procedures (water rinsing and scotch tape peeling), as well as mechanical abrasion. As long as the metal content of the ink was sufficiently high, metal traces formed between gold electrodes had adequately low resistance. FIG. 18 shows an optical micrograph of a large gold feature on glass prepared using the epoxy enhanced ink with two hours curing at 150° C. The resistance of the film was 0.3 ohms.

Working Example 7

Figure 19:
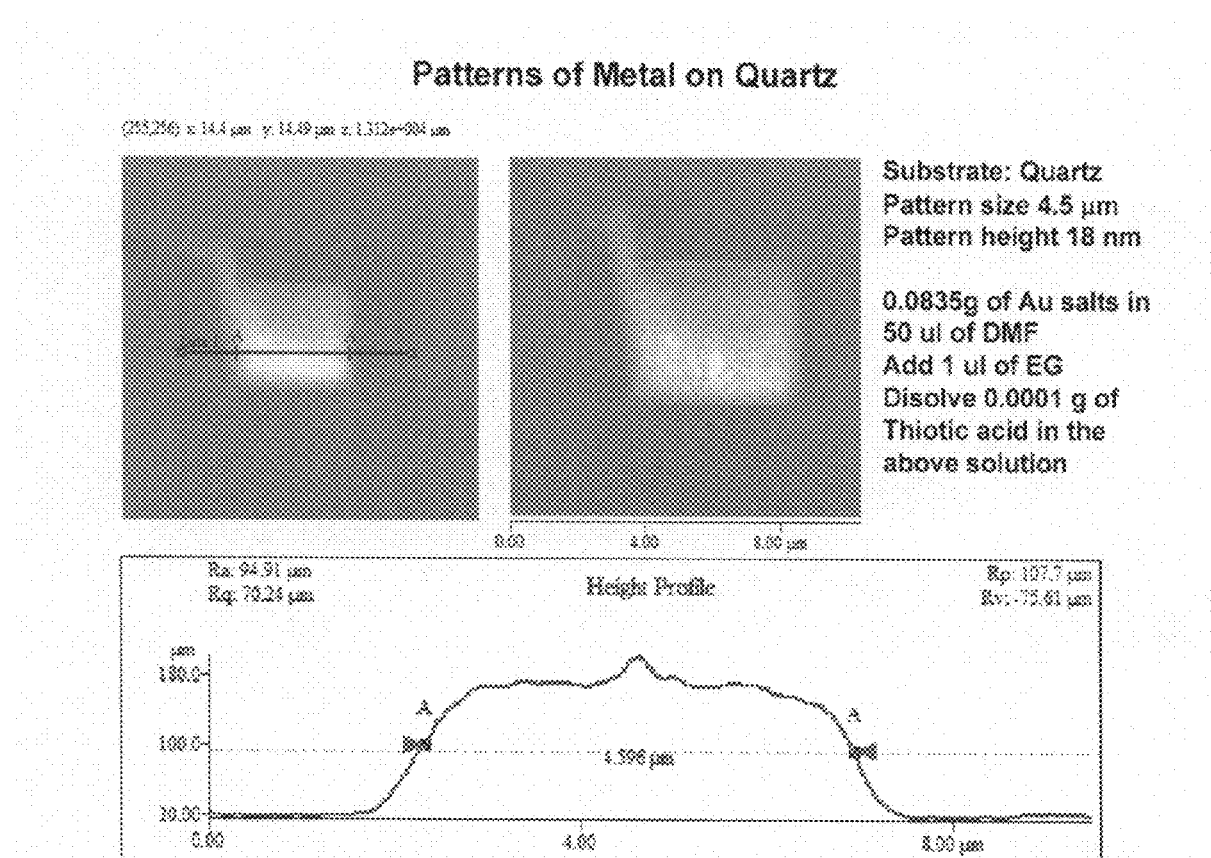
FIG. 19. An AFM height image of a gold pattern generated by depositing a gold precursor ink onto quartz using a PDMS-coated silicon nitride AFM tip. The gold precursor ink was prepared by dissolving 85.5 mg of gold tetrachloride (85.5 mg) in 50 μL of dimethylformamide. To this solution is added 1 μL of ethylene glycol and 0.1 mg of thiotic acid. The 4.5×4.5 micron square pattern was cured by heating with a hot air gun at 250° C. for 10 seconds. The 1-layer pattern was 15 nm high after curing (see line trace).

In all of the preceding examples, micron scale patterns were deposited using cantilevers as source of ink and the primary delivery tool. However, in order to generate sub-micron sized features using these metal precursor inks, it is useful to use a sharp tip on the end of a cantilever as the source and tool for ink delivery. One metal ink that works particularly well for micron and sub-micron scale patterning is a modification of the gold ink described above. To prepare the ink gold chloride (85.5 mg) is dissolved in 50 µL of dimethylformamide. To this solution is added 1 µL of ethylene glycol and 0.1 mg of thiotic acid. Although this ink can be deposited with silicon nitride tips, the reliability of the patterning is improved if PDMS (polydimethylsiloxane) coated tips are used for writing. Writing this ink on quartz substrates produces features as high as 15 nm, as demonstrated in the AFM image in FIG. 19. The precursor ink patterns are cured in an oven at 120° C. for 5 min, and then at 250° C. for 10 s. Importantly, the patterns exhibit excellent stability, resisting water rinsing and two piranha solution washes (3:1 $H_2SO_4$/$H_2O_2$) for 10 min each at 120° C.

All of the following references are incorporated by reference in their entirety.

ADDITIONAL REFERENCES RELATED TO INKS AND DEPOSITION TECHNOLOGIES

Belaubre, P.; Guirardel, M.; Garcia, G.; Pourciel, J. B.; Leberre, V. Dagkessamanskaia, A.; Trevisiol, E.; Francois, J. M.; Bergaud, C., Fabrication of biological microarrays using microcantilevers. *Applied Physics Letters* 82 (18) 3122-3124 May 5, 2003.

Daniel Huang, Frank Liao, Steven Molesa, David Redinger, Vivek Subramanian, "Plastic-compatible low resistance printable gold nanoparticle conductors for flexible electronics," *Journal of the Electrochemical Society*, 150 (7) G412-G417 (2003).

M. J. Hostetler, J. E. Wingate, C.-J. Zhong, J. E. Harris, R. W. Vchet, M. R. Clark, J. D. Longdono, S. J. Green, J. J. Stokes, G. D. Wignall, G. L. Glish, M. D. Porter, N. D. Evans, and R. W. Murray, *Langmuir* 14, 17 (1998).

Ben Ali, M.; Ondarcuhu, T.; Brust, M.; Joachim, C., "Atomic force microscope tip nanoprinting of gold nanoclusters," *Langmuir* 18, 872-876 (2002).

Brust, M.; Find, J.; Bethell, D.; Schriffrin, D. J.; Kiely, D. J. Chem. Soc., Chem. Commun. 1994, 802.

S. F. Fuller, E. J. Wilhelm, J. M. Jacobson, "Ink-Jet Printed Nanoparticle Microelectromechanical Systems", Journal of Microelectromechanical Systems, 2002, Vol 11, No. 1, p. 54-60.

Patents

Burger, G. Elders, J., Spiering, V. <<Device for metered collection and dispensing of liquids, method for manufacturing such a device and methods for collecting and dispensing liquids >> PCT/NL01/00467 or WO 02/00348.

C. Bergaud, P. Belaubre, M. Guirardel, B. Belier, J-B. Pourciel. Systéme de dépôt de solutions biologiques avec ou sans contact pour la fabrication de biopuces. Device for the actively-controlled and localised deposition of at least one biological solution. PCT/FR03/01481 or WO 03/097238 or N°0206016.

U.S. Pat. No. 6,294,401 Jacobson et al. Nanoparticle-based electrical, chemical, and mechanical structures and methods of making same.

U.S. Pat. No. 6,458,431 Hill et al. Methods for the lithographic deposition of materials containing nanoparticles. Dispersed nanoparticles deposited onto a surface and converted to a metal or metal oxide film, films are patterned. Used for applications such as diffusion barriers, electrodes, etc.

Deposition is performed using:

Dipping, spin coating, spraying, dip coating, inking

Conversion is performed using:

Electromagnetically, photochemically, thermally, with a plasma, with an ion beam, with an electron beam, hybrid methods in which light is used as the energy source, but where the light initiates a thermal rather than a photochemical reaction. Under different atmospheres to modify properties U.S. Pat. No. 6,348,295 Griffith et al. Methods for manufacturing electronic and electromechanical elements and devices by thin film deposition and imaging. This patent describes nanoparticle colloidal suspensions for direct-write fabrication. The nanoparticles are capped with an insulating shell that can be removed by application of energy (heat) so that the nanoparticles fuse. Patent covers electrically active patterns and multilayers. The films can be reduced via electromagnetic radiation, laser, thermal, low temperatures.

Deposition

Particles are applied to a surface via spin coating, by displacement, ejection technologies (ink jet) transfer techniques (e.g. microcontact printing), or electrostatic patterning. In the embodiment description: "a modified "pull-down bar" mechanism can be used to deposit these thin films. In this technique a flat rod or wedge is brought in close proximity to the surface to be covered, and then passed over the surface with a pool of the nanoparticle suspension disposed on the side of the direction of travel. The result is the formation of a thin film on the trailing side of the bar."

U.S. Pat. No. 6,103,868 Health et al. Organically-functionalized monodisperse nanocrystals of metals. Describes synthetic methods for making surfactant-capped metal nanoparticles.

U.S. Pat. No. 6,645,444 Goldstein. Metal nanocrystals and synthesis thereof. Patent describes a method for synthesizing metal nanoparticles that involves chemical reduction of a metal-ligand complex in the presence of a solvent.

U.S. Pat. No. 6,413,790 Duthaler et al. Preferred methods for producing electrical circuit elements used to control an electronic display. Ink jet printing of materials to fabricate displays, and various other soft lithography technologies.

U.S. Pat. No. 4,539,041 Figlarz et al. Process for the reduction of metallic compounds by polyols, and metallic powders obtained by this process.

U.S. Pat. No. 5,759,230 Chow et al. Nanostructured metallic powders and films via an alcoholic solvent process.

Additional Description from Reference 16
("Conductive Patterns")

Reference 16 described above and incorporated by reference in its entirety is provided below to further enable one skilled in the art to practice the present invention (patent application "Processes for Fabricating Conductive Patterns Using Nanolithography as a Patterning Tool").

For additional background, many important applications in biotechnology, diagnostics, microelectronics, and nanotechnology require nanostructures of metals, one of the fundamental types of matter. For example, better microelectronics are needed to provide for smaller and faster computer chips and circuit boards, and metals can provide the required electrical conductivity to complete a circuit. Metals also can be used as catalysts. The processing of metals, however, can be difficult, and operating at the nanoscale can make matters even more difficult. Many methods are limited to micron level manufacturing. Many methods are limited by the need for electrochemical biases or very high temperatures. Moreover, many methods are limited by physical requirements of the deposition process such as ink viscosity. Better methods are needed to fabricate metallic nanostructures by means which provide for, among other things, alignment, ability to layer films and wires, high resolution, and versatility.

By way of summary, the present invention comprises a series of embodiments which are summarized herein without limiting the scope of the invention. For example, the present invention provides a method of depositing a conductive coating in a desired pattern onto a substrate comprising: (a) depositing a precursor onto the substrate in the desired pattern by nanolithography with use of a tip coated with the precursor; (b) contacting the precursor with a ligand; (c) applying sufficient energy, optionally from an extended radiation source, to transfer electrons from the ligand to the precursor, thereby decomposing the precursor to form a conductive precipitate in the desired pattern and thus forming the conductive pattern directly on the substrate.

The present invention also provides a method of printing a conductive metal in a desired pattern onto a substrate comprising: (a) drawing a metal precursor and ligand directly onto the substrate according to the desired pattern using nanolithography with use of a tip coated with a precursor; and (b) decomposing the precursor by applying energy, optionally from an extended radiation source, to form the conductive metal in the desired pattern, without removing from the substrate a substantial quantity of the precursor, and without removing from the substrate a substantial quantity of the metal.

The present invention also provides a nanolithographic method comprising depositing a metallic precursor from a tip onto a substrate to form a nanostructure and subsequently converting the precursor nanostructure to a metallic deposit. The deposition can be carried out without use of an electrical bias between the tip and substrate.

The present invention also provides a nanolithographic method consisting essentially of: depositing an ink composition consisting essentially of a metallic precursor from a nanoscopic tip onto a substrate to form a nanostructure, and subsequently converting the metallic precursor of the nanostructure to a metallic form. Basic and novel aspects of the invention are noted throughout this specification, but these aspects include that stamps and resists are not needed, electrochemical bias is not needed, expensive equipment not readily available for typical research laboratories and production facilities is not needed, and reaction between the substrate and the ink is not needed. Accordingly, compositions and inks can be formulated and patterned without these limitations.

The present invention also provides a method of printing without use of electrochemical bias or reaction between the ink and substrate comprising depositing a metallic precursor ink composition onto a substrate from a tip in the form of a microstructure or nanostructure on the substrate to form an array having discreet objects separated from each other by about one micron or less, about 500 nm or less, or about 100 nm or less.

The present invention also provides patterned arrays comprising a substrate and discreet nanoscopic and/or microscopic metal deposits thereon prepared by the methods according to this invention. The metal deposits can be, for example, rectangles, squares, dots, or lines.

The present invention also provides methods of using these methods including, for example, preparing sensors, biosensors, and lithographic templates, as well as other applications described herein.

FIG. 1 in reference 16 illustrates AFM data of palladium structures according to the present invention in Working Example 1.

FIG. 2 in reference 16 illustrates AFM data of palladium structures according to the present invention in Working Example 3.

FIG. 3 in reference 16 illustrates AFM data of platinum structures according to the present invention in Working Example 4.

FIG. 4 in reference 16 illustrates AFM data of palladium structures according to the present invention in Working Example 5.

FIG. 5 in reference 16 illustrates AFM data of palladium structures according to the present invention in Working Example 5.

Detailed Description in Reference 16 ("Conductive Patterns")

Reference 16 claims benefit to provisional applications 60/405,741 to Crocker et al. filed Aug. 26, 2002, and 60/419,781 to Crocker et al. filed Oct. 21, 2002 and incorporated herein by reference in its entirety.

As described above, DPN™ and DIP PEN NANOLITHOGRAPHY™ are trademarks of NanoInk, Inc. and are used accordingly herein (e.g, DPN printing or DIP PEN NANOLITHOGRAPHY printing). DPN methods and equipment are generally available from NanoInk, Inc. (Chicago, Ill.), including the NScriptor™ which can be used to carry out the nanolithography according to the present invention.

Although this specification provides guidance to one skilled in the art to practice the invention including reference to the technical literature, this reference does not constitute an admission that the technical literature is prior art.

Direct-write technologies can be carried out by methods described in, for example, Direct-Write Technologies for Rapid Prototyping Applications: Sensors, Electronics, and Integrated Power Sources, Ed. by A. Pique and D. B. Chrisey, Academic Press, 2002. Chapter 10 by Mirkin, Demers, and Hong, for example, describes nanolithographic printing at the sub-100 nanometer length scale, and is hereby incorporated by reference (pages 303-312). Pages 311-312 provide additional references on scanning probe lithography and direct-write methods using patterning compounds delivered to substrates from nanoscopic tips which can guide one skilled in the art in the practice of the present invention. This text also describes electrically conductive patterns.

Nanolithography and nanofabrication is also described in Marc J. Madou's Fundamentals of Microfabrication, The Science of Miniaturization, 2nd Ed., including metal deposition at pages 344-357.

Multiple embodiments are disclosed in this application for fabricating conductive patterns with use of dip pen nanolithography (DPN) printing as a patterning tool. For all embodiments in this disclosure, the following documents which disclose DPN printing methods are hereby incorporated by reference and form part of the present disclosure:

(1) Piner et al. Science, 29 Jan. 1999, Vol. 283 pgs. 661-663.
(2) U.S. Provisional application 60/115,133 filed Jan. 7, 1999 to Mirkin et al.
(3) U.S. Provisional application 60/207,713 filed Oct. 4, 1999 to Mirkin et al.
(4) U.S. Regular patent application Ser. No. 09/477,997, now U.S. Pat. No. 6,635,311 filed Jan. 5, 2000 to Mirkin et al.
(5) U.S. Provisional application 60/207,713 filed May 26, 2000 to Mirkin et al.
(6) U.S. Provisional application 60/207,711 filed May 26, 2000 to Mirkin et al.
(7) U.S. Regular application Ser. No. 09/866,533, now U.S. Pat. No. 6,827,797 filed May 24, 2001 to Mirkin et al.
(8) U.S. patent publication number 2002/0063212 A1 published May 30, 2002 to Mirkin et al.

The present invention is not limited to use of only one tip to print but, rather, multiple tips can be used, see for example, U.S. Patent Publication 2003/0022470 ("Parallel, Individually Addressable Probes for Nanolithography") to Liu et al. published Jan. 30, 2003.

In particular, in prior application Ser. No. 09/866,533, filed May 24, 2001 (references 7 and 8 above, 2002/0063212 A1 published May 30, 2002), direct-write nanolithographic printing background and procedures are described in detail covering a wide variety of embodiments including, for example: background (pages 1-3); summary (pages 3-4); brief description of drawings (pages 4-10); use of scanning probe microscope tips (pages 10-12); substrates (pages 12-13); patterning compounds (pages 13-17); practicing methods including, for example, coating tips (pages 18-20); instrumentation including nanoplotters (pages 20-24); use of multiple layers and related printing and lithographic methods (pages 24-26); resolution (pages 26-27); arrays and combinatorial arrays (pages 27-30); software and calibration (pages 30-35; 68-70); kits and other articles including tips coated with hydrophobic compounds (pages 35-37); working examples (pages 38-67); corresponding claims and abstract (pages 71-82); and FIGS. 1-28. This disclosure is not and need not be repeated here but is hereby incorporated by reference in its entirety.

Also, US patent publication 2002 0122873 A1, published Sep. 5, 2002 to Mirkin et al., is not and need not be repeated here but is hereby incorporated by reference in its entirety. This published application includes, for example, use of tips which have external openings and internal cavities, and use of electrical, mechanical, and chemical driving forces for transporting the ink (or deposition compound) to the substrate. One method includes aperture pen nanolithography, wherein the rate and extent of the movement of the deposition compound through the aperture is controlled by the driving force.

This published application also describes coated tips, patterns, substrates, inks, patterning compounds, deposition compounds, multiple tip nanolithography, multiple deposition compounds, and arrays.

Nanolithography is also described in the following references:

(a) B. W. Maynor et al., Langmuir, 17, 2575-2578 ("Au 'Ink' for AFM 'Dip-Pen' Nanolithography") describes formation of gold nanostructures by surface-induced reduction of metal ions. This method, however, involves careful selection of appropriate gold precursors and substrate surfaces which react with the gold which limits the process and is not required in the present invention.

(b) Y. Li et al., J. Am. Chem. Soc., 2001, 123, 2105-2106 ("Electrochemical AFM 'Dip-Pen' Nanolithography") describes deposition of platinum metal. This method, however, involves using external electrochemical bias between the tip and substrate which limits the process and is not required in the present invention.

In the DPN printing process, an ink is transferred to a substrate. The substrate can be flat, rough, curved, or have surface features. The substrate can be previously patterned. Immobilization of the ink on the substrate can be by chemical adsorption and/or covalent bonding. The transferred ink, if desired, can be used directly as part of a fabrication design or used indirectly as a template for further fabrication. For example, a protein can be directly patterned onto a substrate by DPN printing, or a template compound can be patterned which is used to bind a protein. The advantages and applications for DPN printing are numerous and described in the above references. Complex structures with high resolution and excellent registration can be achieved, for example. Structures with line widths, cross sections, and circumferences of less than one micron, and in particular, less than 100 nm, and in particular, less than 50 nm can be achieved. In sum, DPN printing is an enabling nanofabrication/nanolithographic technology which allows one to practice fabrication and lithography at the nanometer level with exceptional control and versatility. This type of nanofabrication and nanolithography can be difficult to achieve with many technologies that are more suitable for micron scale work. DPN printing can be also used if desired to prepare micron scale structures but, in general, nanostructures are preferred.

The tip can be a nanoscopic tip. It can be a scanning probe microscopic tip including an AFM tip. It can be hollow or non-hollow. Ink can pass through the middle of a hollow tip, coating the end of the tip. The tip can be modified to facilitate printing of the precursor ink. In general, it is preferred that the tip does not react with the ink and can be used over extended periods of time.

The patterns deposited by the nanolithography are not particularly limited by the shape of the pattern. Common patterns include dots and lines and arrays thereof. The height of the pattern can be, for example, about 10 nm or less, and more particularly about 5 nm or less. If lines are patterned, the lines can be, for example, about one micron wide or less, and more particularly, about 500 nm wide or less, and more particularly about 100 nm wide or less. If dots are patterned, the dots can be, for example, about one micron wide in diameter or less, and more particularly, about 500 nm wide or less, and more particularly about 100 nm wide or less.

Although the nanolithography is preferably carried out to form nanostructures, structures at a micron scale can be also of interest. For example, experiments used to pattern a structure of 1-10 square microns in area, such as a rectangle, square, dot, or line, can be useful in also designing experiments for smaller nanostructures.

In another embodiment, conductive patterns, including nanoscopic patterns, are formed with use of DPN printing with use of the following steps:

1) depositing a precursor such as, for example, a metal salt, onto a substrate in a desired pattern with use of a coated tip, 2) applying an appropriate ligand onto the substrate, wherein for example the ligand comprises a donor atom such as nitrogen, phosphorous, or sulfur, 3) applying sufficient energy to transfer electrons from the ligand to the precursor by, for example, radiant heat, thereby decomposing the precursor to form a precipitate such as, for example, a metal.

Metal patterning processes and chemistries are disclosed in (1) U.S. Pat. No. 5,980,998 to Sharma et al. (issued Nov. 9, 1999), which is hereby incorporated by reference, and (2) U.S. Pat. No. 6,146,716 to Narang et al. (issued Nov. 14, 2000), which is hereby incorporated by reference. However, these references do not disclose or suggest the use of dip pen nanolithography printing or other nanolithographies for deposition, nor do they disclose or suggest advantages which accrue from DPN printing. Rather, they disclose use conventional printing methods with use of dispensers comprising a reservoir and an applicator. Herein, embodiments are disclosed in which the chemistry and patterning as disclosed in the Sharma U.S. Pat. No. 5,980,998 patent are generally modified in unexpected ways with unexpected results to include DPN printing as a patterning method, and the DPN printing process is changed in unexpected ways with unexpected results to include the chemistry as disclosed in the Sharma U.S. Pat. No. 5,980,998.

The ink solution is generally contemplated herein to include a solvent and solute. The solvent can be any material capable of solvating the solute, but is generally contemplated to comprise an inexpensive, readily available, relatively non-toxic material such as water, various alcohols and so forth. The solute is generally contemplated to include at least two components which chemically react with one another under the influence of an energy source, such that a metal or other substance precipitates out of the solution. In preferred embodiments one component of the solute comprises a salt, while another component of the solute comprises an appropriate ligand. As used herein the term "salt" means any combination of an acid (A) and a base (B). Examples are metallic salts such as copper formate, acetate, acrylate, thiocyanate, and iodide. Other examples are non-metallic salts such as ammonium formate and ammonium acrylate.

The various components of the solution may be deposited on the substrate concurrently or sequentially, or in some combination of the two. Thus, it is contemplated that the salt may be deposited concurrently with the ligand, or separately from the ligand. It is also contemplated that the solvent may itself comprise or contribute one or more aspects of the salt or the ligand.

As used herein the term "ligand" (L) refers to any substance which can be thermally activated to displace one or more aspects of the salt in a redox reaction, such that AB+L<−>AL+B, or AB+L<−>A+BL. In processes contemplated herein preferred ligands are non-crystalline, leave no non-metallic residue, and are stable under normal ambient conditions. More preferred ligands are also capable of taking part in redox reactions with a particular salt being used at reasonable temperatures, which are generally considered to be less than about 300° C.

A preferred class of ligands are nitrogen donors, including, for example, cyclohexylamine. A number of other nitrogen donors and their mixtures, however, may also be used. Examples are 3-picoline, lutidines, quinoline and isoquinoline, cyclopentylamine, cyclohexylamine, cycloheptylamine, cyclooctyl amine, and so forth. These are only a few examples, however, and many other aliphatic primary, secondary and tertiary amines and/or aromatic nitrogen donors may also be used.

Contemplated solutions may include other compounds besides salts and ligands. For example, a mixture of copper (II) formate in a nitrogen donor solvent with or without water and an alcohol may be used to facilitate transport from tip to substrate. A small amount of a solvent based polymer or a surfactant may also be useful additives for adjusting the rheology of the precursor solution to facilitate transport from tip to substrate, and to impart better film forming properties. On the other hand, larger amounts of high boiling solvents and/or additives such as triethylphosphate, Triton X100, glycerol, etc., are preferably to be avoided as these have a tendency to contaminate the film produced on account of incomplete pyrolysis over temperature sensitive substrates such as Kapton.™ or paper. Still further, it may be worthwhile to treat the substrate with a coupling agent to improve the adhesion of the deposited material to the substrate as a function of the coupling agent's modifying the hydrophobicity or hydrophilicity of the surface of the substrate.

Where the salt contains a metal, all metals are contemplated. Preferred metals include conductive elements such as copper, silver and gold, but also include semiconductors such as silicon and germanium. For some purposes, especially production of catalysts, it is contemplated that metals such as cadmium, chromium, cobalt, iron, lead, manganese, nickel, platinum, palladium, rhodium, silver, tin, titanium, zinc, etc. can be used. As used herein, the term "metal" also includes alloys, metal/metal composites, metal ceramic composites, metal polymer composites, as well as other metal composites.

The substrate can comprise virtually any substance upon which a compound can be deposited. For example, contemplated substrates include metals and non-metals, conductors and non-conductors, flexible and inflexible materials, absorbent and non-absorbent materials, flat and curved materials, textured and non-textured materials, solid and hollow materials, and both large and small objects. Particularly preferred substrates are circuit boards, paper, glass, and metal objects. Viewed from another perspective, the wide breadth of contemplated substrates gives some indication of the scope of contemplated objects to which the present teachings may advantageously be applied. Thus, methods and apparatus taught herein may be used for a variety of applications, including multichip modules, PCMCIA cards, printed circuit boards, silicon wafers, security printing, decorative printing, catalysts, electrostatic shielding, hydrogen transport membranes, functionally gradient materials, production of nanomaterials, battery electrodes, fuel cell electrodes, actuators, electrical contacts, capacitors, and so forth. The methods and apparatus can be used as sensors and biosensors. The method and apparatus can be used to prepare templates for further lithography such as imprint nanolithography. Using the methods to connect nanowires and nanotubes is of particular interest.

Accordingly, the substrate is contemplated to represent any suitable substrate, including especially a circuit board, which may or may not be installed in or form part of an electronic device such as a computer, disk drive or other data processing or storage device, a telephone or other communication device, and a battery, capacitor, charger, controller or other energy storage related device.

Suitable energy sources contemplated herein include any source which is capable of effecting the desired chemical reaction(s) without causing excessive damage to the substrate or the coating. Thus, particularly preferred energy sources are radiative and convection heat sources, including especially infrared lamps and hot air blowers. Other suitable energy sources include electron beams, and radiative devices at non-IR wavelengths including x-ray, gamma ray and ultra-violet. Still other suitable energy sources include vibrational sources such as microwave transmitters. It should also be appreciated that the various energy sources can be applied in numerous ways. In preferred embodiments the energy source is directed at the precursor/ligand deposited on the substrate. However, in alternative embodiments, for example, a heated ligand could be applied to a cold precursor, or a heated precursor could be applied to a cold ligand.

Many advantages can be discerned from this invention including, for example, smooth surfaces, good coating adhesion, and control of coating thickness. Still another advantage of various embodiments of the present teachings is that coatings can be deposited with a purity of at least 80% by weight. In more preferred embodiments the purity of the metal or other material intended to be included in the coating is at least 90%, in still more preferred embodiments the purity is at least 95%, and in most preferred embodiments the purity is at least 97%.

Still another advantage of various embodiments of the present teachings is that coatings can be deposited with very little waste. In preferred embodiments at least 80% by weight of the material to be deposited on the substrate remains to form the desired pattern. For example, if copper (II) formate is used to produce a copper circuit, then at least 80% of the copper deposited on the substrate can remain to form the desired pattern, and no more than 20% of the copper is removed as "waste". In more preferred embodiments the waste is no more than 10%, in still more preferred embodiments the waste is no more than 95%, and in most preferred embodiments the waste is no more than 3%.

Still another advantage of various embodiments of the present teachings is low temperature operation. Metals, for example, can be deposited in desired patterns at temperatures of less than about 150° C., preferably less than about 100° C., more preferably less than about 75° C., and most preferably at ordinary room temperatures of room temperature (25-30° C.). The redox or "curing" step can also be performed at relatively low temperatures below about 100° C., more preferably below about 75° C., and even as low as about 50° C. Even lower temperatures are also possible, although below about 50° C. the redox reaction tends to be too slow for most applications. These ranges allow precursor solutions to be prepared at room temperature, the deposition to be performed at room temperature, and the decomposition to be accomplished using relatively low heat, as from a heat gun, in a room temperature environment.

The prior art describes additional methods and compositions which can be used to practice the present invention. For example, U.S. Pat. No. 5,894,038 to Sharma et al. (Apr. 13, 1999) is incorporated herein by reference in its entirety and discloses direct deposition of palladium including a process for forming a layer of palladium on a substrate comprising (1) preparing a solution of a palladium precursor, (2) applying the palladium precursor to the surface of the substrate, and (3) decomposing the palladium precursor by subjecting the precursor to heat. This method can also be adapted to carry out nanolithography according to the present invention.

In addition, U.S. Pat. No. 5,846,615 to Sharma et al. (Dec. 8, 1998) is incorporated herein by reference in its entirety and discloses decomposition of gold precursor to form a layer of gold on a substrate. This method can also be adapted to carry out nanolithography according to the present invention.

U.S. Pat. No. 4,933,204, moreover, is incorporated herein by reference in its entirety and discloses decomposition of a gold precursor to form gold features. This method can also be adapted to carry out nanolithography according to the present invention.

Still further, U.S. Pat. No. 6,548,122 to Sharma et al. (Apr. 15, 2003) is also incorporated herein by reference in its entirety and discloses use of copper (II) formate precursors, as well as gold and silver precursors.

Although the present invention is believed to be wide in scope, the following inks or patterning compounds are of particular interest for the present invention: copper formate or copper acetate; silver sulfate; silver nitrate; silver tetrafluroborate; palladium chloride, acetate, and acetylacetonate; hexachloroplatinic (IV) acid; ammonium iron citrate; carboxylates, (pseudo-)halides, sulfates, and nitrates of zinc, nickel, cadmium, titanium, cobalt, lead, iron, and tin; metal-carbonyl complexes, including chromium hexacarbonyl; amine bases, including cyclohexylamine, 3-picoline, (iso) quinoline, cyclopentylamine, dimethylsulfoxide, dimethylformamide, formamide, ethylene diamine; polymers, including poly(ethyleneoxide), poly(methylmethacrylate), poly (vinylcarbozol), and poly(acrylamide).

In a preferred embodiment, for example, deposition can be carried out with use of aqueous solutions as ink, wherein the solutions comprise water, metal salt, and a water-soluble polymer such as a polyalkylene oxide polymer having molecular weight of about 50,000 or less. Aqueous solutions can be also useful as carriers for the reducing agent. For example, deposition of disodium palladium chloride in water with 10% polyethylene oxide (MW 10,000) via DPN printing on amino-silanized glass can be carried out (Schott Glass company), and subsequent chemical reduction to palladium metal using a reducing agent such as, for example, 0.03 M aqueous solution of dimethylamine:borane complex (DMAB). The concentration of the reducing agent can be varied to determine the best conditions for reduction. Atomic force micrographs of the patterns can be obtained before and after reduction. AFM imaging can be carried out with the tip which was used to deposit the structure or a different tip. If a different tip is used, the image can be better, particularly if the tip is selected or adapted for imaging rather than deposition. In general, polymers which are of commercial use in printing inks can be used in the present invention.

In another preferred embodiment, nanolithographic deposition can be carried out of palladium acetylacetonate (Pd (acac)) via DPN printing on an oxidized silicon substrate, and subsequent reduction by application of (1) a reducing agent, such as a liquid reducing agent like formamide, and (2) heat to the patterned surface. Another system is palladium acetate in DMF solvent. Before patterning and reduction, Pd(acac) can be dissolved in an organic solvent including a halogenated solvent such as chloroform to form an ink for use in coating a solid tip or passing through a hollow tip. Heat treatment can be sufficient to carry out the reduction including temperatures of, for example, about 100° C. to about 300° C. or about 150° C. The heat time, temperature, and atmospheric conditions can be adjusted to achieve the desired pattern. Generally, a heat time of one to five minutes at 150° C. can achieve a desired result. The stability of the deposited pattern can be examined by solvent rinsing, and the experimental conditions can be varied to improve the stability. Nanolithographic deposition experimental variables, including substrate and ink composition, also can be varied to provide better resolution. AFM micrographs can be obtained before reduction and after application of heat including use of height scan analysis of the patterns. The imaging parameters can be varied to improve image resolution.

In some cases, a tip such as a gold coated tip can catalyze reduction of a metal salt directly on the cantilever. The tip composition can be varied to prevent this. For example, an aluminum coated probe can be useful to avoid this reduction on the tip. Generally, the tips are preferably selected and adapted for long term use and avoid catalyzing reaction with the ink.

The reduction of a nanolithographically patterned metal salt can be also carried out by vapor reduction rather than liquid phase reduction, wherein the reducing agent is converted to vapor form and passed over the patterned substrate. Heaters known in the art can be used to heat the reducing agent to a vapor state as needed. In some cases, this type of treatment can improve the preservation of the original pattern during reduction.

In a preferred embodiment, deposition can be carried out for a silver salt emulsion consisting of ferric ammonium chloride, tartaric acid, silver nitrate, and water onto an amino-silanized glass substrate via DPN printing, followed by development by photoreduction under a UV lamp. AFM imaging can be carried out to show patterns.

In another preferred embodiment, the reduction step can be carried out with sufficient heat and sufficient time to reduce the metal salt without use of a chemically reducing agent. For example, temperatures below about 400° C. can be used, or below about 200° C. can be used. One skilled in the art can select temperatures and experiment accordingly based on a given ink system and pattern.

The deposition methods according to this invention also can include one or more pre-deposition steps, one or more probe cleaning or chemical modification steps aimed at improving ink coating; and one or more deposition steps, which may use dip pen nanolithography printing technology; one or more post-deposition steps, including cleaning steps and inspection steps.

Pre-deposition substrate surface treatment steps include but are not limited to (in no particular order):

(1) plasma, UV, or ozone cleaning, washing, drying, blow-drying,
(2) chemical cleaning, such as, for example, piranha cleaning, basic etching (eg. hydrogen peroxide and ammonium hydroxide);
(3) chemical or physical modification of the substrate to promote ink transport, or adhesion, or covalent modification (e.g., base treatment to impart a charged surface on silicon oxide, silanization with amino- or mercapto-silanizing agents, polymers carrying chemically reactive functional groups);
(4) protection against side-effects of following process steps (e.g. coating with a resist or thin film),
(5) inspection of the substrate with techniques derived from optical microscopy (e.g. AIMS), electron microscopy (e.g. CD SEM or imaging (e.g. EDS, AES, XPS), ion imaging (e.g. TOF SSIMS) or scanning probe imaging (e.g. AFM, AC AFM, NSOM, EFM . . . ), any of the steps detailed below in the post-deposition section, and combination thereof.

Probe cleaning or modification steps include but are not limited to (in no particular order):

(a) plasma cleaning, washing, drying, blow-drying,
(b) chemical cleaning, such as piranha cleaning, basic etching (eg. hydrogen peroxide and ammonium hydroxide),
(c) chemical or physical modification of the probe to promote or enhance ink coating, adhesion, or transport (eg. base treatment to impart a charged surface of the silicon nitride tip, silanization with amino- or mercapto-silanizing agents, non-covalent modification with small molecule or polymeric agents such as poly(ethyleneglycol)) Such modifications include those that increase loading of the ink on the tip by increasing porosity or enhancing surface area available for ink delivery.

Deposition Steps:

Deposition steps include but are not limited to the deposition of one or more inks e.g. by DPN™ printing or deposition with one or more probe(s). Possible inks include but are not limited to precursors, compounds that will form the bulk of the final pattern, catalysts, solvents, small molecule or polymeric carrier agents, host matrix materials, or sacrificial reducing agents, and mixtures of above materials. They may be deposited as thin films or as thick multilayers (formed by multiple deposition steps), with or without variation of the chemical composition from layer to layer.

Post-deposition steps include but are not limited to (in no particular order):

(1) Heating of the substrate, for example with a heat lamp, hot air blower, or hot plate,
(2) Irradiation of the substrate with electromagnetic radiation (e.g., IR, visible, and UV light) or charged particles (e.g. electrons, ions drawn from a gun or a plasma source). This process may occur in air, vacuum, or in solution, with or without photosensitizing agents,
(3) Immersion of the patterned substrate in one or more solutions,
(4) Electrochemical reduction,
(5) Chemical reduction,
(6) Exposure of the patterned substrate to a vapor or gas,
(7) Sonication of the patterned substrate, as well as all nanoscale, local equivalents of the steps outlined above, if applicable, the source of the energy and/or composition of matter been provided by one or more probe(s), which may or may not be the same than the DPN probe(s); which include but is not limited to:
  (a) Local heating of the deposited matter or surrounding substrate,
  (b) Local irradiation of the deposited matter or surrounding substrate, and all combinations thereof.

The succession of all or some steps may be repeated several times.

The metallic nanostructures can be in the form of conductive nanoscopic grids which can include nanowires. For example, crossbar structures can be formed. Metallic layers can be formed on top of each other. Structures can be included to integrate the nanoscopic conductive patterns with microscopic and macroscopic testing methods. Resistors, capacitors, electrodes, and inductors can be used as desired to form a circuit. Semiconductors and transistors can be used as desired. Formation of multilayers can be carried out to increase the height of the structure. Different metals can be in different layers of the multilayer. The methods of the invention can be used to electrically connect electrodes. In sensor applications, for example, the metallic deposit can have a resistivity which is modified when an analyte of interest binds to the structure. In biosensor applications, for example, antibody-antigen, DNA hybridization, protein adsorption, and other molecular recognition events can be used to trigger a change in resistivity. The methods of this invention can be also used for bar code applications.

U.S. Pat. No. 6,579,742 to Chen, for example, describes nanolithographic structures formed by imprinting for nanocomputing and microelectronics applications. Imprinting, however, can suffer from mold stickiness effects. U.S. Pat. No. 6,579,742 nanocomputing applications and structures can be carried out using the nanolithographic methods described herein, and this patent is incorporated by reference in its entirety.

The substrate can be a protosubstrate as described in, for example, U.S. regular patent application Ser. No. 10/444,061, now U.S. Pat. No. 7,199,035 filed May 23, 2003 to Cruchon-Dupeyrat et al "Protosubstrates". This allows electrical conductivity of the printed structure to be examined by macroscopic methods.

Reference 16's Non-limiting working examples are described below.

Reference 16's Working Examples

General Approach:

This methods provide for direct deposition of metal nanopatterns. Oxidizing and reducing compounds can be mixed together, applied to the tip, and deposited on the substrate at selected locations by DPN™ printing or deposition. The ink mixture can be then heated (either by heating of the whole substrate or by local probe-induced heating). Specifically, a metal salt and organic ligand cocktail can be used. A typical ink formulation can comprise a metal salt (e.g. carboxylate, nitrate, or halide) along with an appropriate organic Lewis base or ligand (amines, phosphines). Additives (small molecules such as ethyleneglycol, polymers such as polyethyleneoxide, PMMA, polyvinylcarbazol, etc) may also be used that modify the solubility, reactivity, or Theological properties of the ink. After deposition of the ink mixture, gentle heating in an ambient or inert environment (e.g., 40-200° C.) can assist the dis-proportionation of the salt to form a metallic precipitate and a volatile organic. This approach enables deposition of a variety of metals or metal oxides including, for example copper, under mild conditions with very little organic contaminant [see, for example, Sharma et al., U.S. Pat. No. 5,980,998, the complete disclosure of which is hereby incorporated by reference, in particular for the materials deposited]. Potential pitfalls may occur if the ligand evaporates from the patterned substrate before reaction takes place. In that case, the salt-patterned substrate may be exposed to a ligand in a second step prior to the heating.

Deposition experiments and AFM imaging can be carried out with a CP Research AFM (Veeco Instruments, Santa Barabara, Calif.) or an NSCRIPTOR (NanoInk). For both deposition and imaging, contact mode can be used including topography or lateral force modes.

Reference 16's Example 1

One specific example of the use of this method used DPN™ printing or deposition to pattern palladium acetylacetonate dissolved in chloroform (1 mg/microliter; generally, almost saturated solutions of inks are desired) on oxidized silicon, glass, or amino-silanized glass. After patterning of the dots, a droplet (1 microlitre) of formamide was placed on the horizontal substrate and heated to 150° C. for 2 min. The resulting metal patterns were stable towards solvent rinsing (including water, alcohols, and other non-polar organics) while the salt patterns prior to reduction were removed by solvent rinsing. FIG. 1 shows AFM images and a height scan of the patterns before (FIG. 1a) and after treatment (FIG. 1b and 1c) with formamide and heat.

Reference 16's Example 2

Palladium nanopatterns were deposited by DPN printing and metallized by vapor reduction. A DPN ink consisting of palladium acetate in dimethylformamide was patterned onto silicon oxide using the DPN technique. The DPN pen used was a silicon nitride probe with a gold coating. This process also works well with aluminum coated DPN probes because the Al coating does not catalyze the reduction of the metal salt directly onto the cantilever as does the gold coated probes. Prior to patterning the silicon/silicon oxide wafer was cleaned by sonication in millipore water for 5 minutes. The patterned substrate was placed vertically in a conical polyethylene tube and 10 microlitres of formamide liquid was placed in the bottom of the tube. The tube was placed on a heating block and heated at 80° C. for 30 min. so that the vapor caused reduction of the metal precursor. This method is useful because it preserves the metal pattern on the substrate. The resulting metal structures are resistive to solvent rinsing and other common methods of cleaning.

Reference 16's Example 3

Palladium nanopatterns deposited by DPN metallized by chemical reduction. A DPN ink consisting of disodium palladium chloride in water with 10% polyethyleneoxide (MW 10,000) was patterned onto amino-silanized glass (Schott Glass company) using the DPN technique. The patterned substrate was exposed to a solution of 0.03M aqueous solution of dimethylamine:borane complex (DMAB) to cause reduction of the metal precursor to conducting metal. The resulting metal structures are resistive to solvent rinsing. FIG. 2 shows AFM images and a height scan of the patterns before (2a) and after (2b, 2c) treatment with DMAB.

Reference 16's Example 4

Platinum nanopatterns deposited by DPN metallized by chemical reduction. A DPN ink consisting of platinum tetrachloride in water was patterned onto amino-silanized glass (Schott Glass company) using the DPN technique. The patterned substrate was exposed to a solution of 0.03M aqueous solution of dimethylamine:borane complex (DMAB) to cause reduction of the metal precursor to conducting metal. The reduction reaction occurs within seconds of immersion. The resulting metal structures are resistive to solvent rinsing. FIG. 3 shows an AFM height scan of platinum nanostructures deposited by DPN and reduced by DMAB.

Reference 16's Example 5

Palladium patterns deposited by DPN. A DPN ink consisting of palladium acetate in dimethylformamide was patterned onto silicon oxide using the DPN technique. Prior to patterning the substrate was cleaning in piranha solution for 15 min at 80° C. After patterning the substrate was heated using a hot plate in air for at least 1 minute. After heating the pattern was imaged by AFM. The resulting metal structures show high topography and are resistive to solvent rinsing and other common methods of cleaning. FIG. 4 and FIG. 5 show a desired structure design (left figure) and actual patterns before reduction (center figures) and after thermal reduction (right figures). The imaging of these patterns, particularly those patterns already reduced, can be improved by, for example, using clean tips not used for deposition.

In sum, in reference 16, nanolithographic deposition of metallic nanostructures is provided using coated tips for use in microelectronics, catalysis, and diagnostics. AFM tips can be coated with metallic precursors and the precursors patterned on substrates. The patterned precursors can be converted to the metallic state with application of heat. This concludes the section on "Additional Description from Reference 16 ("Conductive Patterns")."

Additional Working Examples

The following describes additional working examples that further exemplifies and enables the invention, especially with respect with alternative ink formulations, alternative substrates that may be patterned. Multilayer patterning, delivery of ink to the cantilever using a microfluidic reservoir, and repair of an actual TFT substrate were also demonstrated.

Working Example 8

Ink Formulations

A variety of ink compositions may be direct-written by contacting with a cantilever. In addition to the aforementioned polyol and gold nanoparticle/mesitylene ink, the following ink formulations have been successfully deposited with CML:

Ink Composition #1: Gold Nanoparticles in Mesitylene/Decanol Mixture

The gold nanoparticle ink described in the working example above was improved by addition of an alcohol such as, for example decanol $CH_3(CH2)_9OH$. The addition of decanol improves wetting of hydrophillic substrates and in particular avoids the beading of the deposited ink into droplets onto said hydrophillic substrate, which would result in discontinuous (non-conductive) lines. This ink composition was typically prepared by dissolving 1 mg of hexanethiol-capped gold nanoparticles in 1.5 µL of thiotic acid dissolved in mesitylene (1 mg/mL) and 0.3 µL of decanol. The ink was converted to low-resistivity metallic form by high-temperature curing at 250-300° C. for 7 minutes followed by a lower temperature curing at 120° C. for 60 min.

Ink Composition #2: Gold Nanoparticles in 1,3,5-Triethylbenzene

The gold nanoparticle ink above was further improved by replacing mesitylene and decanol by 1,3,5-triethylbenzene (1,3,5-TEB), a solvent with higher boiling point than mesitylene. The solvent substitution increases the lifetime of the ink (due to less drying) as the decanol-based ink above but avoids phase separation between decanol-rich and mesitylene-rich phases, which ultimately results in nanoparticle precipitation and loss of useful metal content.

Ink Composition #3: Commercial Silver Nanoparticle Ink

A commercial silver paste (Nanopaste NPS-J obtained from Harima Chemicals, Japan, http://www.harima.co.ip) was used as an ink for flat panel display repair. The silver paste comprises monodispersed nanoparticles created by gas evaporation and protected by a dispersing agent. The average nanoparticle diameter is about 7 nm. As each nanoparticle is covered with the dispersing agent, this ink acts almost like a liquid even at high metal content. Therefore, it may be necessary to pre-concentrate this ink (by solvent evaporation in air) to reach optimum viscosity. Circuit formation with this ink is known in the art via printing, dispensing, and impregnation. Its sintering temperature is lower than 200° C. Similar commercial inks comprising silver, gold (Harima NPG-J) or other types of nanoparticles may be used as well.

Working Example 9

Deposition of Various Inks on Various Substrates

Figure 20:
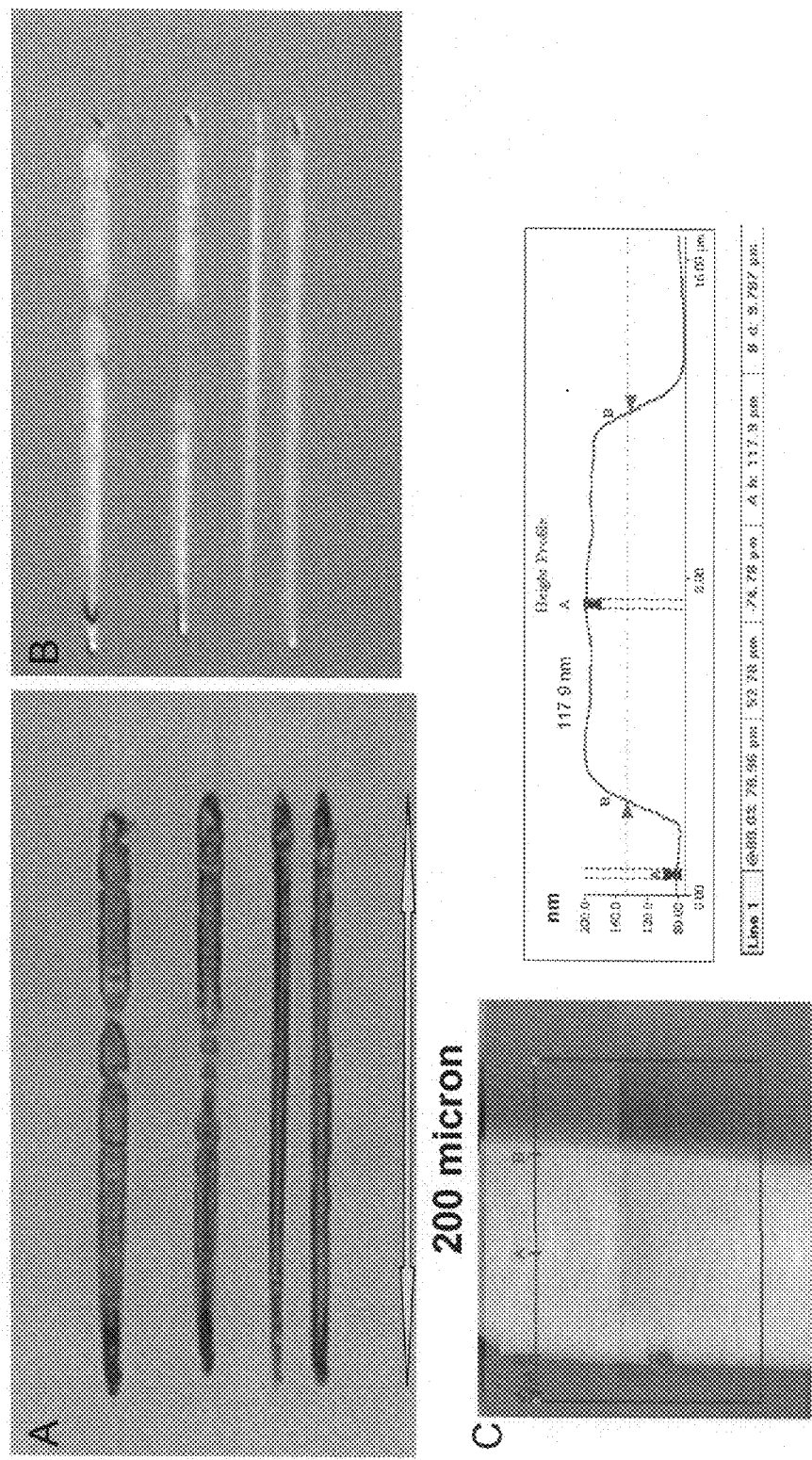
FIG. 20. Direct-writing of silver lines on a silicon nitride substrate using a commercial silver nanoparticle ink. (A) Optical image of the 200 um-long silver ink lines after direct writing; (B) Resulting silver microstructures after low-temperature curing; (C) Topographic atomic force microscope image of a small portion of a line and corresponding average height profile, revealing that said line is 117.9 nm thick.
Figure 21:
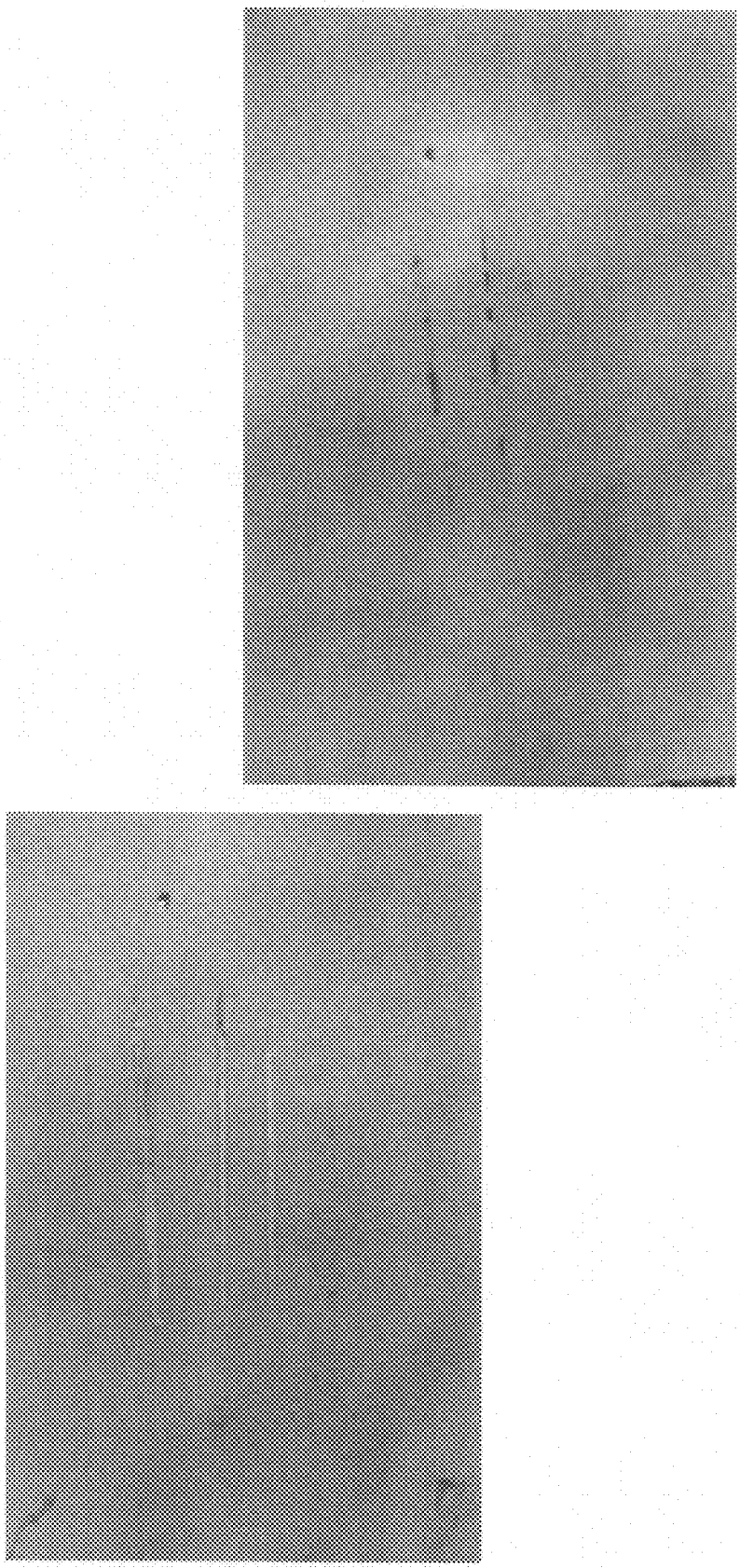
FIG. 21. Optical images showing cantilever microdepositions of a commercial silver nanoparticle ink on a glass substrate before and after curing.
Figure 22:
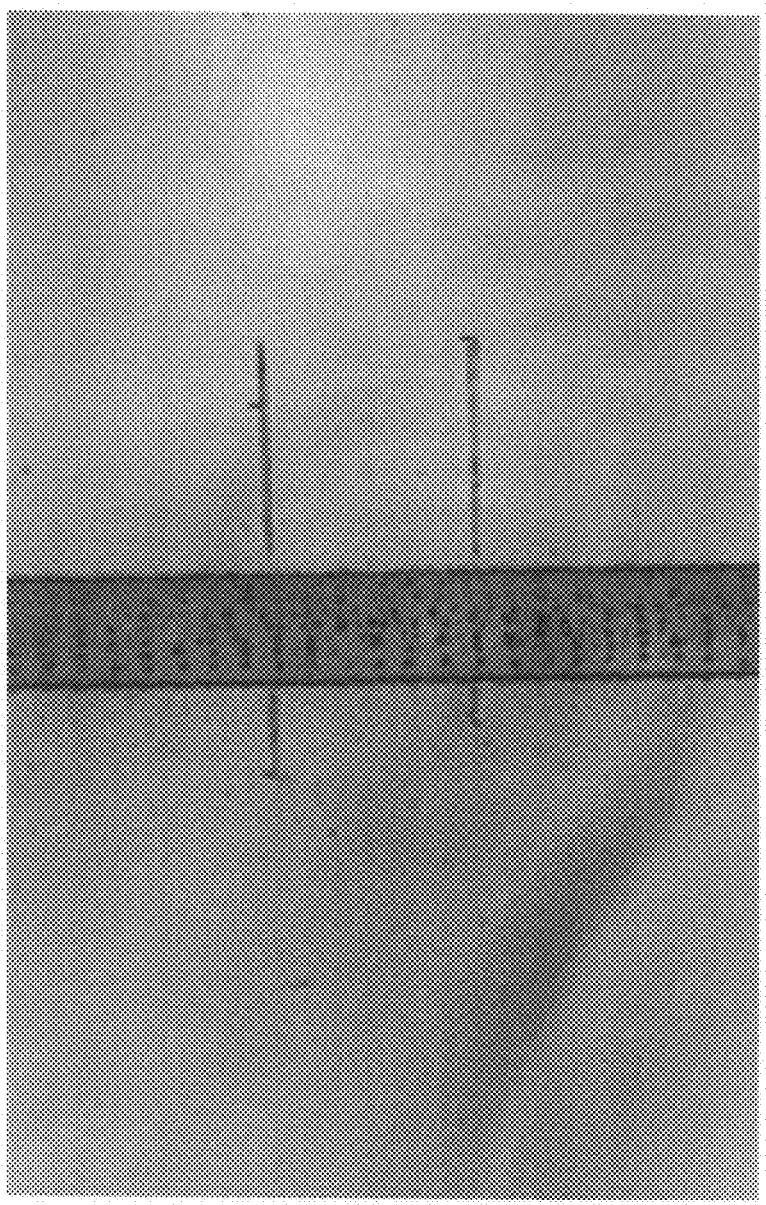
FIG. 22. Deposition and low-temperature curing of a commercial silver nanoparticle ink on a glass substrate coated with a chromium thin film. Laser ablation was used to form a gap in the chromium film and expose the underlying glass substrate (in the center of the image). A tipless cantilever was then used to draw two lines onto the chromium film on each side of the laser-ablated gap and across the gap.
Figure 39:
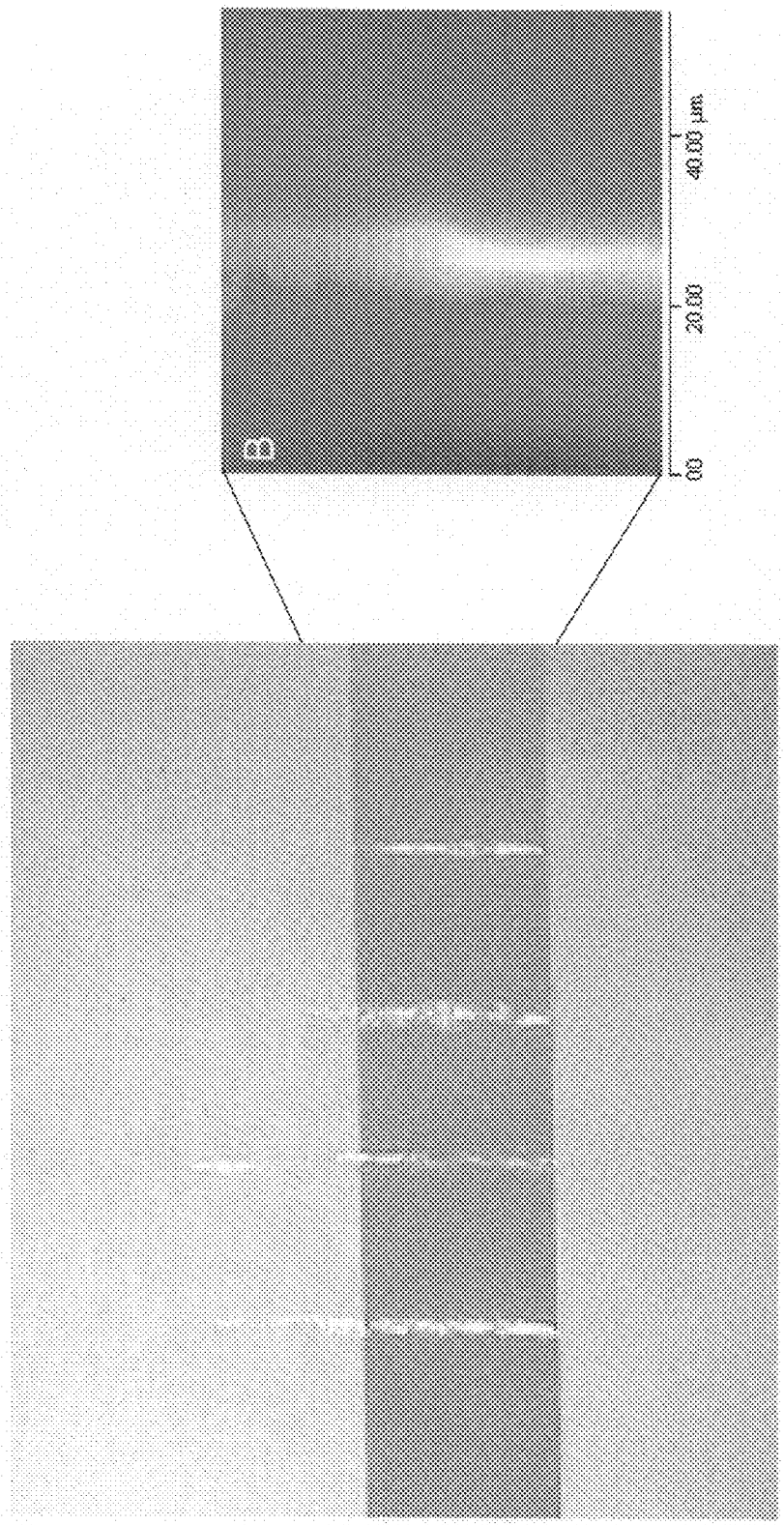
FIG. 39. Optical and AFM images (A and B respectively) of conductive gold traces deposited across a 200 μm gap between chromium electrodes. A gold nanoparticles/mesitylene/decanol mixture (described in the additional working examples) was used in this experiment. The ink was converted to low-resistivity metallic form by performing a high-temperature curing at 250-300° C. for 7 minutes followed by a lower temperature curing at 120° C. for 60 min.

FIGS. 20, 21, 22 and 39 are illustrations of the successful deposition of the inks disclosed in working example 8 on various substrates. For example, FIG. 20 illustrates the direct-writing of silver lines on a silicon nitride substrate using the Harima silver nanoparticle ink (composition #3). Observed variations in line width and quality are the result of the increase in the viscosity (increasing concentration) of the ink with time. With time, the ink became too viscous to form continuous lines. All lines were drawn at the same cantilever speed relative to the substrate. Observed striations are an artifact of the stop-and-go motion of the high-precision stage that was used in this experiment. FIG. 21 illustrates deposition of the same ink on a glass substrate. FIG. 22 illustrates the deposition and low-temperature curing of a commercial silver nanoparticle ink on a glass substrate coated with a chromium thin film. Laser ablation was used to form a groove in the chromium film and expose the underlying glass substrate (in the center of the image). A tipless cantilever was then used to draw two lines onto the chromium film on each side of the laser-ablated gap and across the gap. While deposition was successful on the chromium film per se, it was not across the gap, because, in this case, the glass substrate left after laser ablation was particularly rough (>1 micron, higher than the film being deposited). FIG. 39 illustrate deposition of the ink composition #1 on chromium and glass, while FIG. 30 (described in further details below) illustrates the deposition of the gold nanoparticle/1,3,5-TEB ink.

Working Example 10

Fabrication of Multilayered Patterns

Figure 23:
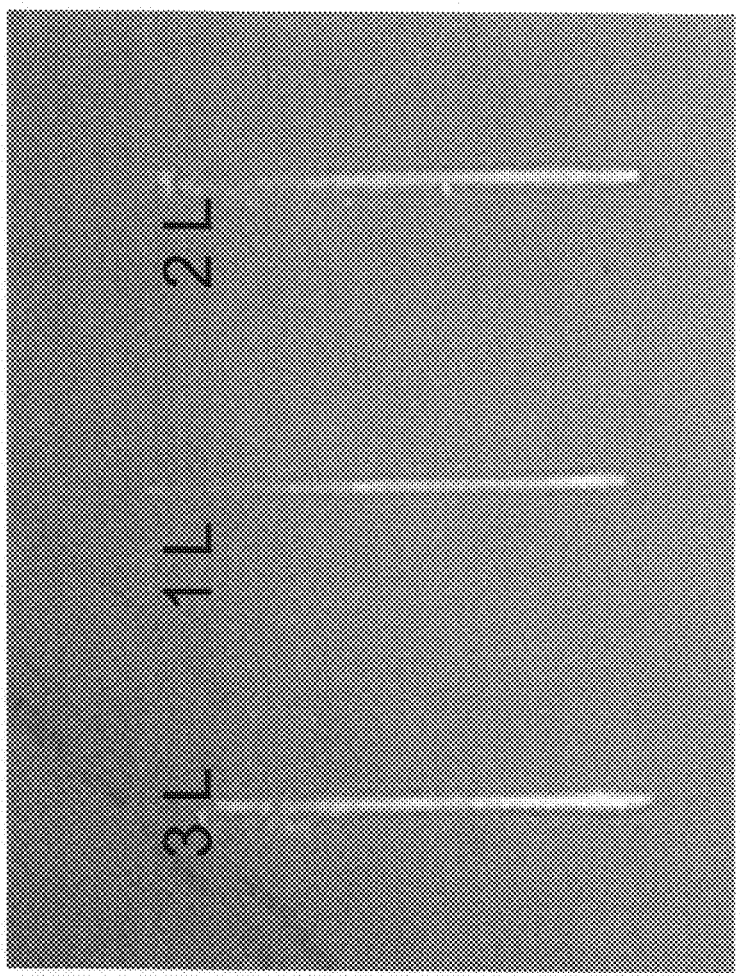
FIG. 23. Optical images illustrating the fabrication of multilayered lines by repeated drawing:
 (1L) One-layer line with a 6 μm width and 30 nm thickness;
 (2L) Two-layer line with a 8.6 μm width and 41 nm thickness;
 (3L) Three-layer line with a 8 μm width and 70 nm thickness.

FIG. 23 illustrates the fabrication of multilayered lines (with up to 3 layers) using a tipless cantilever coated with the gold nanoparticle/mesitylene ink described above. A first layer was deposited on the substrate. After reloading with ink, the cantilever was repositioned at the start of the first-layer line and used to draw a second layer directly on top of the first. Note that, because the quantity of deposited material is small, the solvent in the first layer dries fast enough to allow second-layer drawing without need for an intermediate thermal curing step. A third layer was deposited by repeating the same process to form a three-layer line. This process enables the fabrication of thick lines with larger conductivity and improves line continuity. Line broadening was observed as well. However, a fraction of the line broadening is believed to result from limitations of the existing XY stage. Its replacement with a more repeatable stage should result in narrower lines.

Working Example 11

Delivery of Ink to the Cantilever

Figure 24:
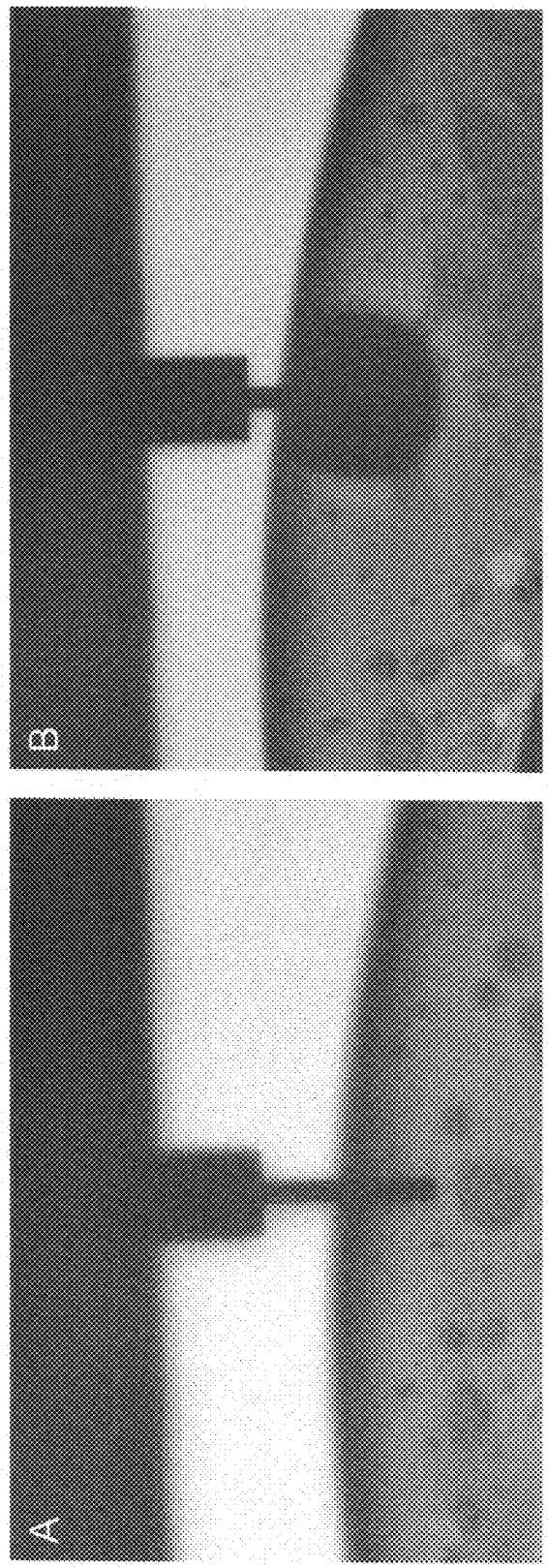
FIG. 24. Coating of a tipless cantilever with ink by dipping into a microfabricated reservoir. Top-view optical images of a cantilever (A) just above or (B) dipping into a pool of ink in a millimeter-wide circular reservoir (fabricated by deep reactive ion etching in a silicon wafer; bottom part of the image). Note the meniscus around the cantilever in image B.

FIG. 24 illustrates the coating of a tipless cantilever (which may be with or without a slit) with ink by dipping into a microfabricated reservoir. In this experiment, a microfabricated cantilever was mounted on the scanning head of the NSCRIPTOR instrument (NanoInk, Inc. Chicago, Ill.) and placed above a silicon microfabricated inkwell chip with the help of the top-view video microscope and XY motor stage integrated in the instrument. The fabrication of this inkwell chip, which is normally used to deliver ink to tips for dip-pen nanolithographic printing, has been described in U.S. application Ser. No. 10/705,776, now U.S. Pat. No. 7,034,854 to Cruchon-Dupeyrat et al. and related art. The inkwell comprises microfluidic millimeter-scale reservoirs, in which ink may be deposited using a pipette. The cantilever was dipped into the pool of ink in one of the aforementioned reservoirs (bottom part of the image). Note the meniscus around the cantilever in image B. The process is easily automated using appropriate (Z-axis) positioning devices and software.

Working Example 12

Repair of an Actual TFT LCD Sample

Figure 25:
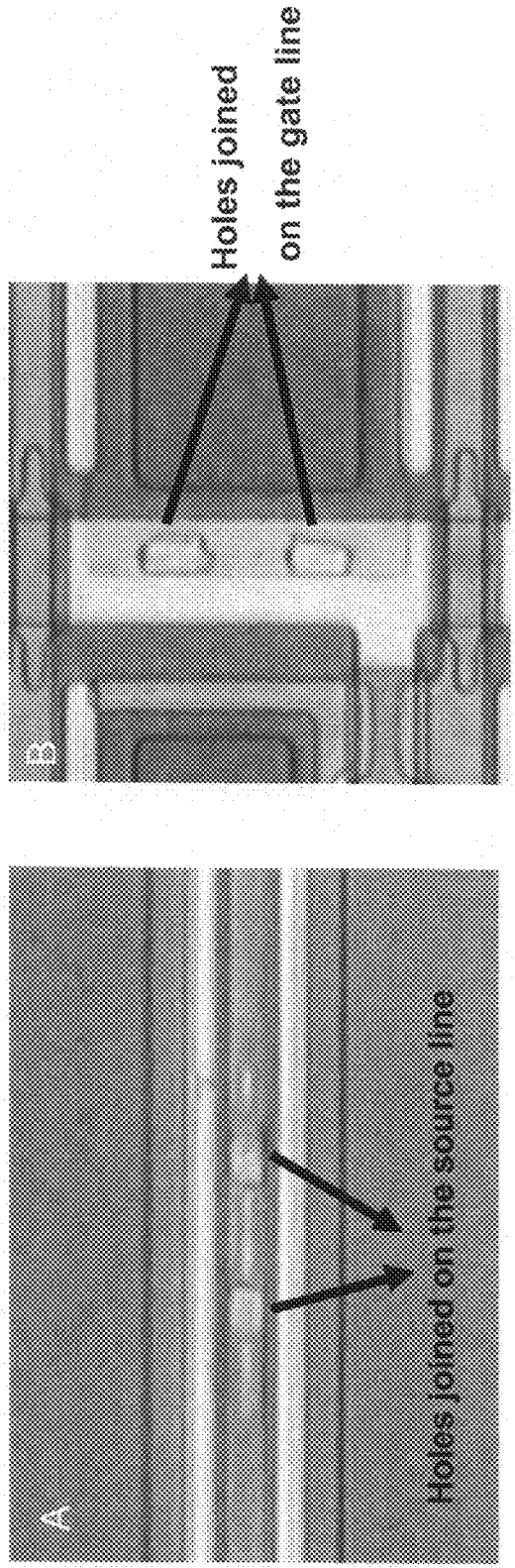
FIG. 25. Optical images illustrating the repair of a thin film transistor (TFT) flat panel display.

FIG. 25 illustrates the repair of a thin film transistor (TFT) flat panel display. Laser ablation was used to create holes in the insulating (silicon nitride) layer protecting on each side of a defect in the conductive traces forming electronic circuits on the flat panel display. A line was drawn between these holes with a gold nanoparticle ink; it was then cured to form an electrical bridge between the left and right parts of the trace, repairing the defect.

Working Example 13

Deposition with Cantilevers with Integrated Slits or Microfluidic Channel(s)

Figure 26:
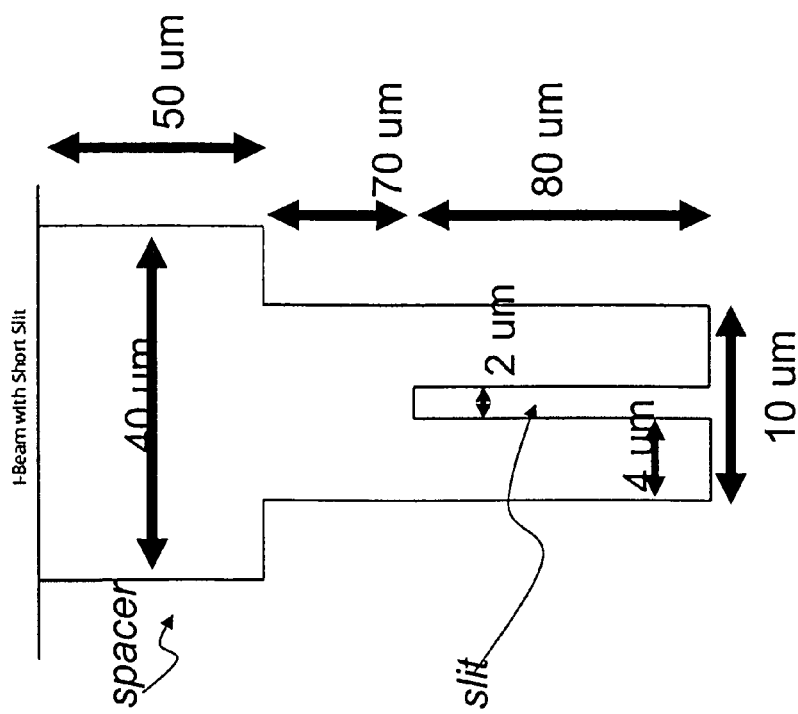
FIG. 26. Schematic diagram of a tipless cantilever with an ink storage slit.
Figure 27:
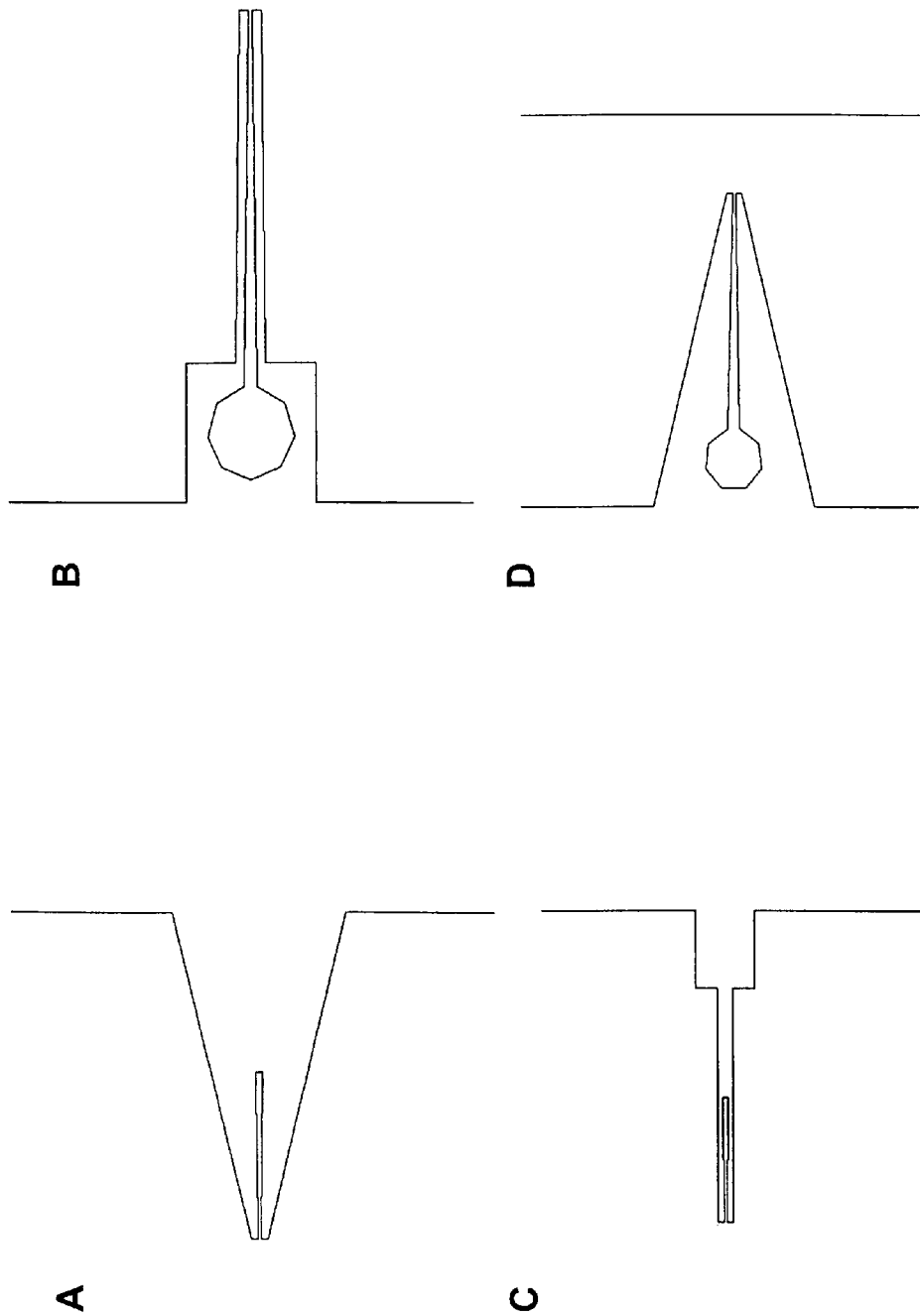
FIG. 27. Diagram illustrating four alternative designs for tipless slit cantilevers.
Figure 28:
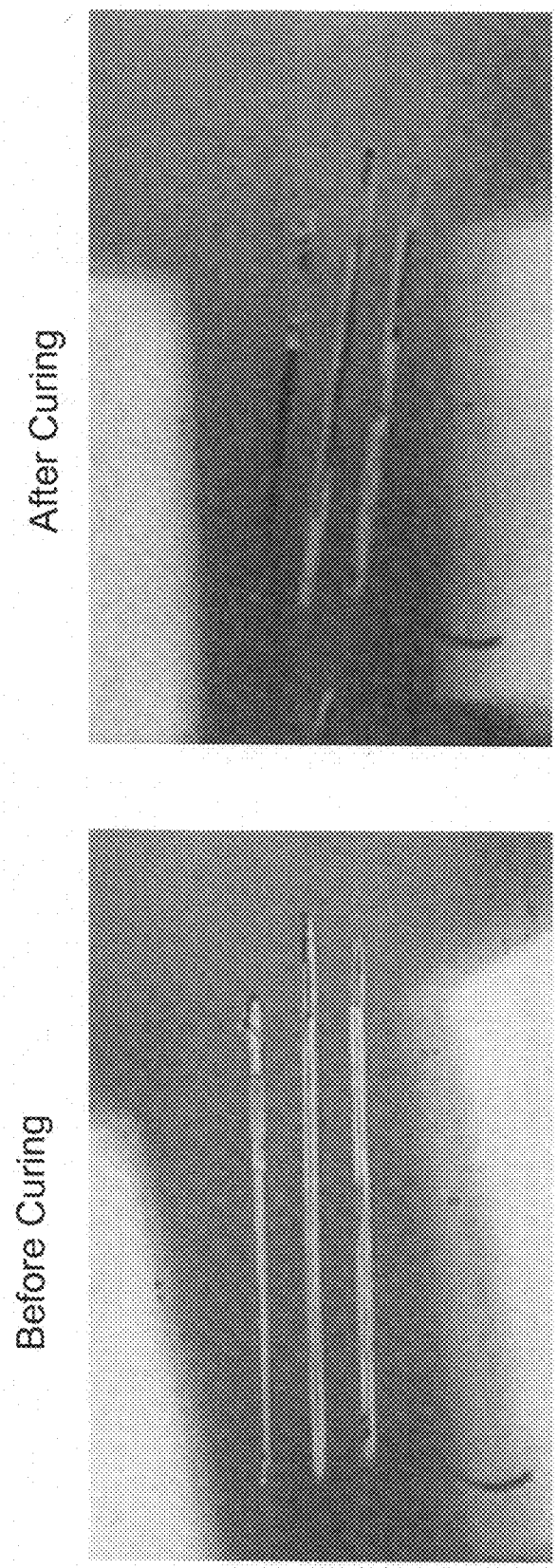
FIG. 28. Optical image illustrating the deposition of a commercial silver ink on a glass substrate with a slit cantilever.
Figure 29:
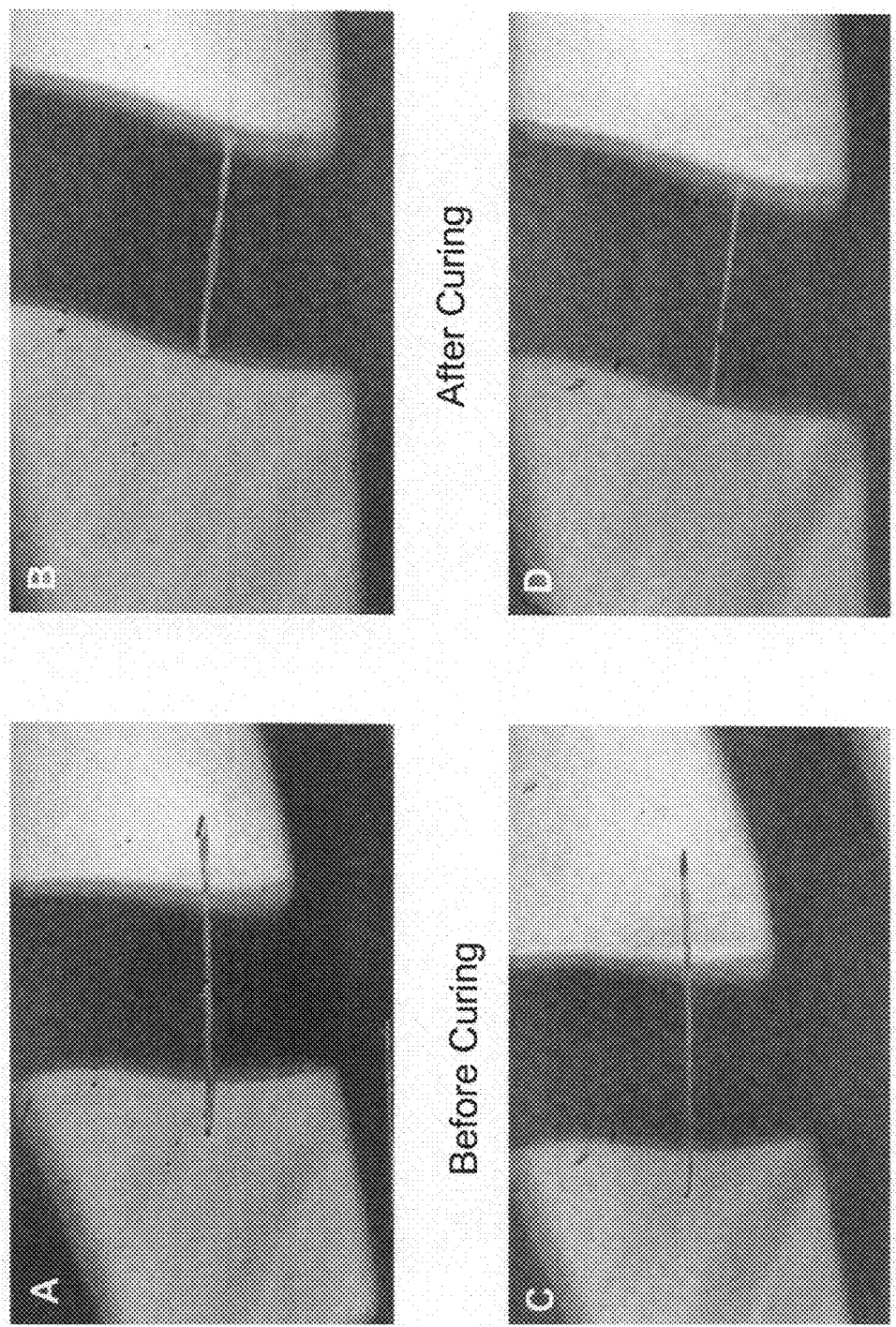
FIG. 29. Two examples of deposition and curing of lines made of silver nanoparticle ink across a gap between gold electrodes on a glass substrate when using a slit cantilever.
Figure 30:
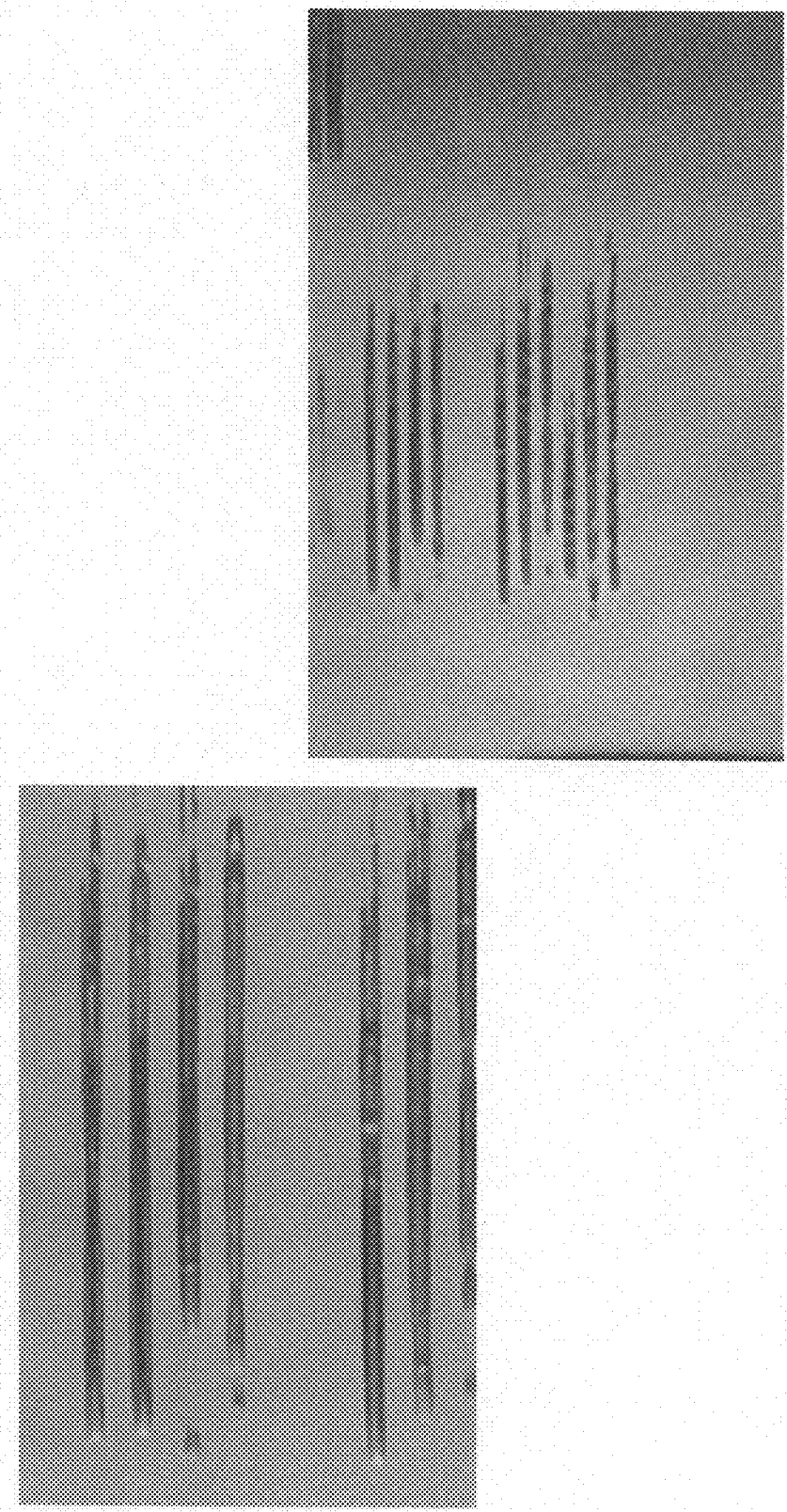
FIG. 30. Line writing with a slit cantilever loaded with a gold nanoparticle/1,3,5-TEB ink.

FIG. 26 is the schematic diagram of a tipless cantilever with an ink storage slit or channel. This cantilever can store more ink volume with each dipping which will in turn result in better uniformity over the length of the line, increased line height, better conductivity and better ability to write over high steps. FIG. 27 illustrates four additional designs for tipless slit cantilevers, which may be triangular or rectangular in shape and may comprise an enlarged portion acting as a reservoir for fluid storage. The fabrication technology can be adapted from methods for the fabrication of AFM cantilevers that are known in the art. Briefly, a silicon nitride film is deposited via CVD on a sacrificial silicon substrate. Portions of the silicon nitride is then patterned and then etched to form cantilevers and slits. The underlying silicon may be partially anisotropically etched to free the cantilevers. Alternatively, the silicon nitride layer may be bonded to a Pyrex glass wafer and the silicon substrate is entirely etched. The wafer is then diced to afford chips terminated with tipless slit cantilevers. The cantilevers may be optionally coated with a thin reflective metal layer. The metal coating must be carefully chosen so as not to react with or otherwise affect the ink. FIGS. 28, 29 illustrate the actual deposition with a slit silicon nitride cantilever (fabricated according to the blueprint in FIG. 26) of ink composition #3 (silver nanoparticle) on a glass substrate and across a gap between gold electrodes patterned on said glass substrate. The resistance between the two gold electrodes in image B was about 100 ohms after heat curing. Note that the ink deposited directly on top of the gold electrodes is not visible after heat-gun curing, the possible result of alloying or dewetting during curing. FIG. 30 demonstrates the deposition of the gold nanoparticle/1,3,5-TEB ink composition #2 with the same type of cantilever.

Additional Embodiments

The following describes additional embodiments, especially with respect to instruments and methods for flat panel display repair.

Embodiment 33

Instrument and Method for Flat Panel Display Repair Using Cantilever Microdeposition and Laser Curing The invention further provides an instrument for the repair of gaps in open traces on a flat panel display substrate and similar devices, the instrument comprising: (1) a cantilever (or microbrush) adapted to receiving an ink; (2) a cantilever holding and positioning means adapted to contacting and translating said cantilever on the surface of said flat panel display substrate in order to pattern said ink on said substrate in the shape of a repair patch; (3) an inking mechanism that supplies said ink to said cantilever; (4) optionally, a curing system adapted to converting the deposited material into a low-resistivity form adapted to electrical conduction. The curing system may comprise a laser and its focusing optics. The cantilever positioning means may comprise: (1) a nanometer-resolution stage controlling the motion of said microbrush along the X, Y, Z axes; (2) a coarse long-range Z-stage adapted to contacting said microbrush with said substrate; (3) a rotation stage that can position the microbrush at any angle about the Z axis; (4) optionally, a cantilever contact detection means.

When the cantilever or cantilevered device has a at least partially reflective coating, the said contact detection and cantilever deflection measurement means may be chosen among a group consisting of (1) a video camera, its associated optics, a light source and computing means adapted to measuring the brightness of light reflected by of at least parts of said cantilever; (2) a laser reflective sensor; and (3) a confocal distance measurement system.

In a preferred embodiment, the invention provides an instrument adapted to the repair of flat panel displays and other substantially flat circuitry, such as printed circuit boards. The instrument may comprise some or all of the following:
(1) a cantilever of (sub)micrometric width,
(2) a micro/nanometer-scale XYZ stage that provides cantilever fine motion, and
(3) a laser to cure the deposited material ("ink");
(4) an inking mechanism that supplies the material ("ink") to the micro cantilever prior to the touchdown operation.
(5) a large motion Z-stage moves, which may supply gross Z motion for inking,
(6) a rotation stage that can position the cantilever at any angle about the Z axis.

Figure 31:
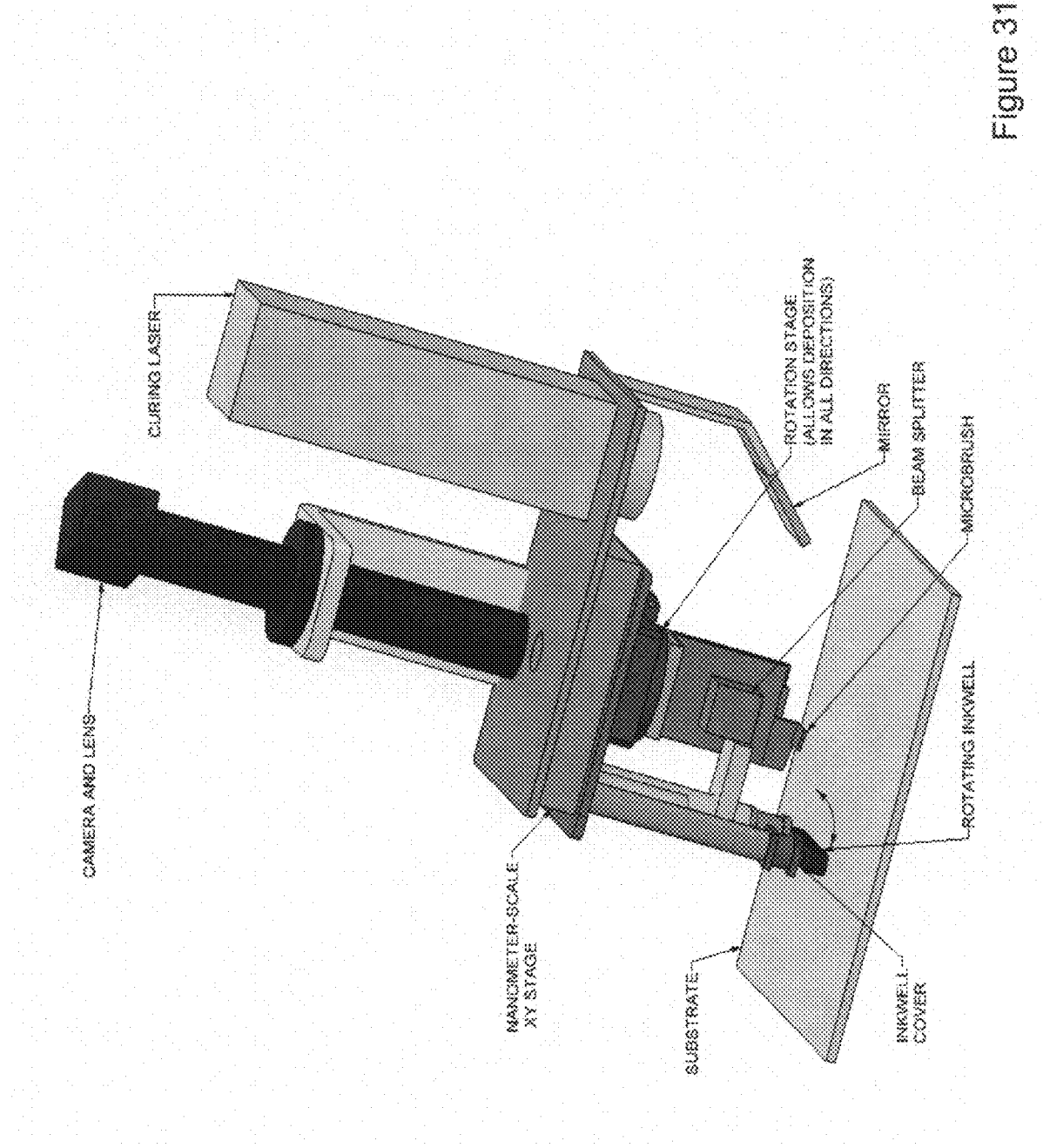
FIG. 31. Diagram illustrating an instrument for the repair of flat panel displays and similar objects. It utilizes a cantilever or cantilevered microbrush coated with a metal-precursor ink to repair gaps in conductive traces. A XYZ stage controls the cantilever's high-resolution motion. An inking mechanism comprising an inkwell and its protective cover supplies the material to the cantilever prior to the touchdown operation. A coarse Z-motion stage is provided for inking the cantilever and contacting the surface, while a rotation stage can position it at any angle about the Z axis. Monitoring of the brightness of the cantilever (which varies with bending) via video imaging with the included camera system and appropriate image processing software detects the touchdown of the cantilever on the surface when putting it in initial contact with the surface. A laser system is provided to (thermally) cure the microdeposited material.

FIG. 31 shows a first design of this instrument, where the brightness of the cantilever is monitored via video imaging to detect the touchdown of the cantilever on the surface. In this embodiment, the task of detecting the precise height at which the microbrush or cantilever comes in contact with the substrate is accomplished by computer monitoring of the video image area corresponding to the cantilever for changes in brightness as the nanometer scale XYZ stage moves the cantilever downward. Upon contact and under proper lighting, a dramatic change in brightness occurs (due to cantilever bending) with enough sensitivity to allow detection of contact. After contact, the nanometer scale XYZ stage can move the cantilever in the XYZ directions, depositing ink on the 2D surface and on 3D surface structures. The 360 degree motorized rotation stage allows the cantilever to always be pulled rather than pushed (i.e. in the direction parallel to its length, from its free end to its bound end; see working example below). This avoids cantilever buckling and other problems leading to poor patterning results.

To apply ink to the cantilever, the cantilever is moved upward by the coarse motorized Z stage until it is above the level of the inkwell rotary stage. The inkwell rotating stage then rotates the inkwell to a position directly below the cantilever. The cantilever is then lowered into the inkwell and ink coats the cantilever. The cantilever is then moved up again, and the inkwell is rotated out of the cantilever area. The cantilever is then ready to deposit ink on the substrate.

After ink deposition is complete in a given area, the curing laser is activated. Thru a mirror and beam splitter (or other device that selectively reflects the light from the laser towards the substrate), it directs laser light onto the area where in was deposited. Curing can be viewed as it occurs through the beam splitter to the camera and microscope assembly. The entire assembly may be moved over large distances (meters) to position the assembly over areas of the substrate in need of repair. The necessary flat panel display support frame and the large-distance positioning system are not shown but are known in the art. Alternatively, the laser light can be directed downward or at angle, without mirrors, utilized the XY motion of the gantry that can move the entire assembly over large distances (meters) to position the cantilever or the curing laser over repair areas. Note that use of direct laser lighting may preclude microscope viewing of the curing process.

Figure 32:
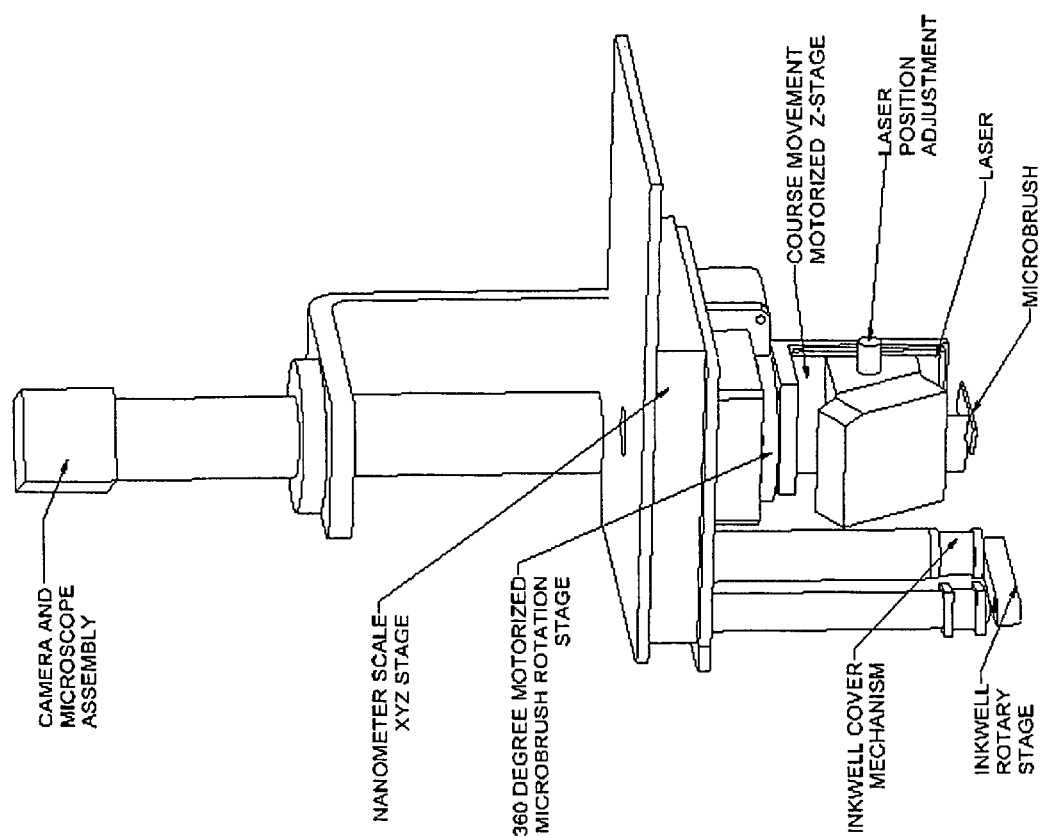
FIG. 32. Schematic diagram illustrating a second instrument for flat panel repair. In this design, the output of a laser reflective sensor is monitored as it measures the Z position of the cantilever, detecting touchdown of the cantilever on the substrate surface. As in the previous design, a few-nanometer-resolution XYZ stage provides cantilever motion, and a laser (not shown) cures the deposited material ("ink"). An inking mechanism supplies the material ("ink") to the cantilever prior to the touchdown operation. A large motion Z-stage moves supplies gross Z motion for inking, while the rotation stage can position the cantilever at any angle about the Z axis.
Figure 33:
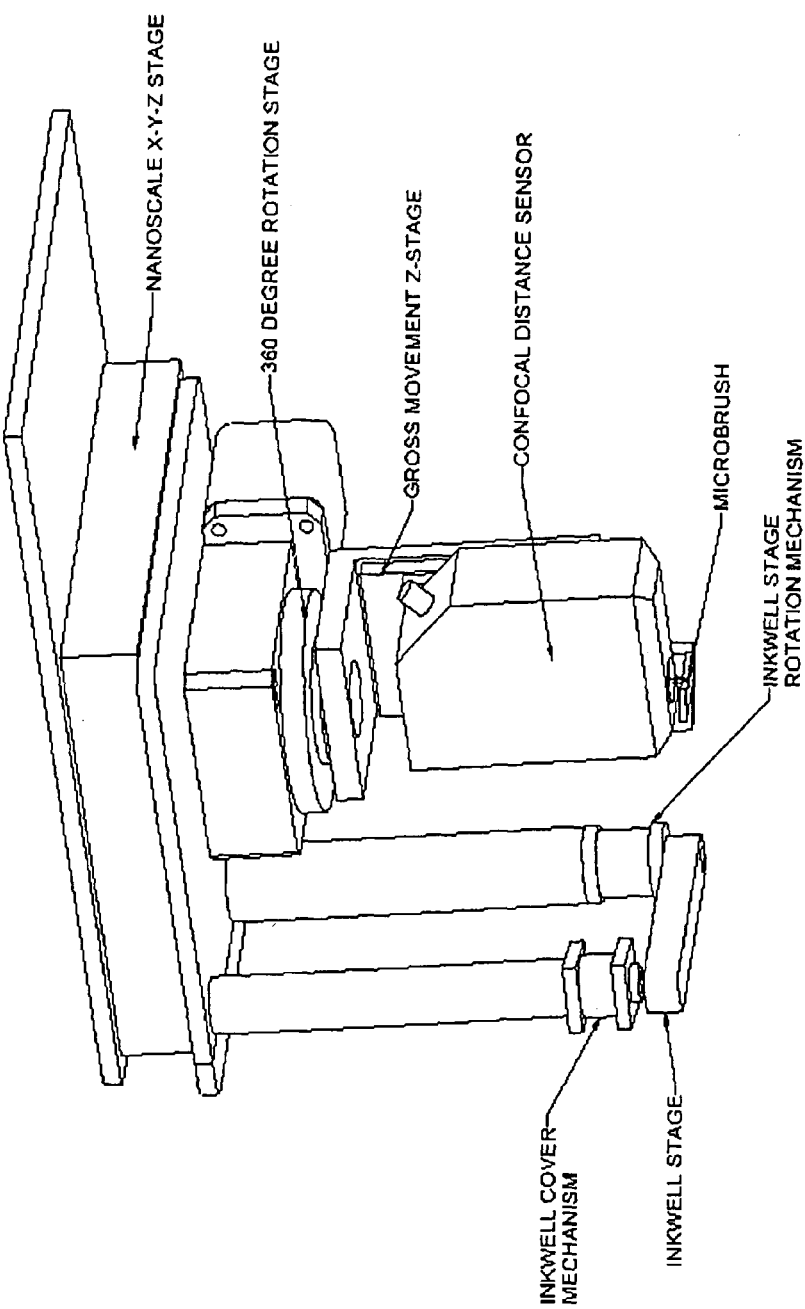
FIG. 33. Alternative design for a FPD repair instrument, in which a confocal distance measurement device detects the touchdown of the cantilever on the substrate surface.

In another embodiment (FIG. 32), the task of detecting the precise height at which the microbrush or cantilever comes in contact with the substrate is accomplished by computer monitoring of the output of a Z-axis laser reflective sensor (Keyence Corp., Japan) focused on the cantilever. Upon contact, a dramatic change in sensor output occurs, with sensitivity that allows detection of contact. After contact, the nanometer scale XYZ stage can move the cantilever in the XYZ directions, depositing ink on the 2D surface and on 3D surface structures. In yet another embodiment (FIG. 33), the task of detecting the precise height at which the cantilever comes in contact with the substrate is accomplished by computer monitoring of the output of a confocal distance sensor (again available from Keyence Corp.) targeted at the cantilever. Laser curing can be viewed as it occurs, as the confocal sensor may incorporate a built-in CCD array.

The invention further provides a method for the additive repair of gaps in open traces on a flat panel display substrate by local deposition of a precursor ink followed by curing of said ink to a conductive form, the method comprising the steps of:
providing a cantilever (or microbrush);
providing a precursor ink;
disposing said ink on said cantilever;
providing a substrate surface;
contacting said cantilever and said substrate surface so that ink is delivered from the cantilever to the substrate surface;
curing the deposited ink.

Working Example 14

Bidirectional Writing and Cantilever Rotation

Figure 34:
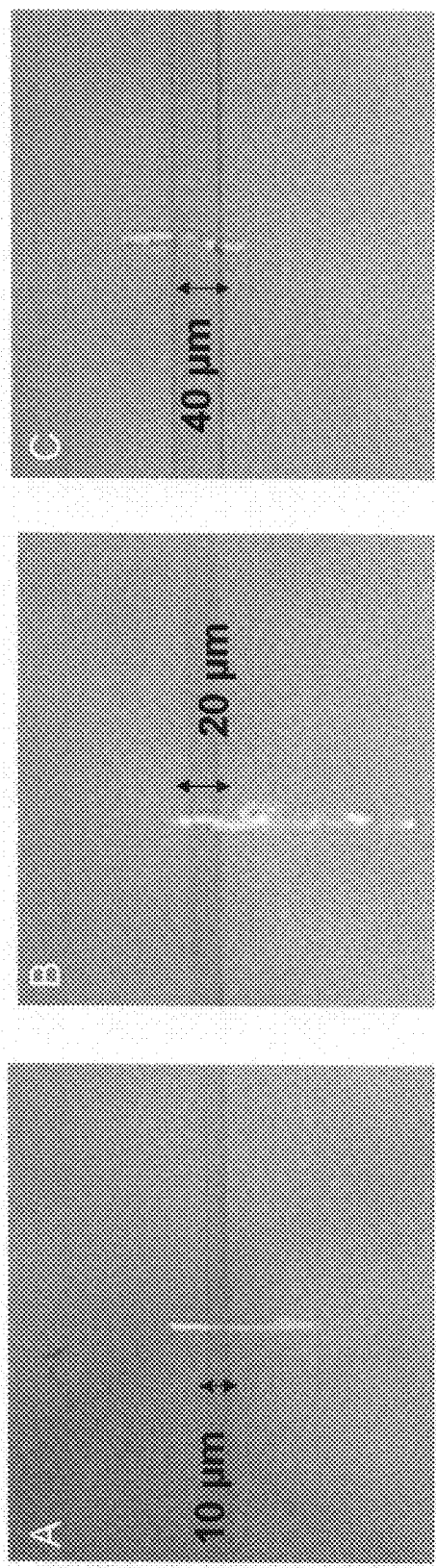
FIG. 34. Optical images illustrating the deposition of conductive Au traces deposited from a 5 μm tipless cantilever loaded with gold nanoparticle ink across insulating gaps of various widths (10, 20, 40 μm) between conductive ITO (indium tin oxide) electrodes.
Figure 35:
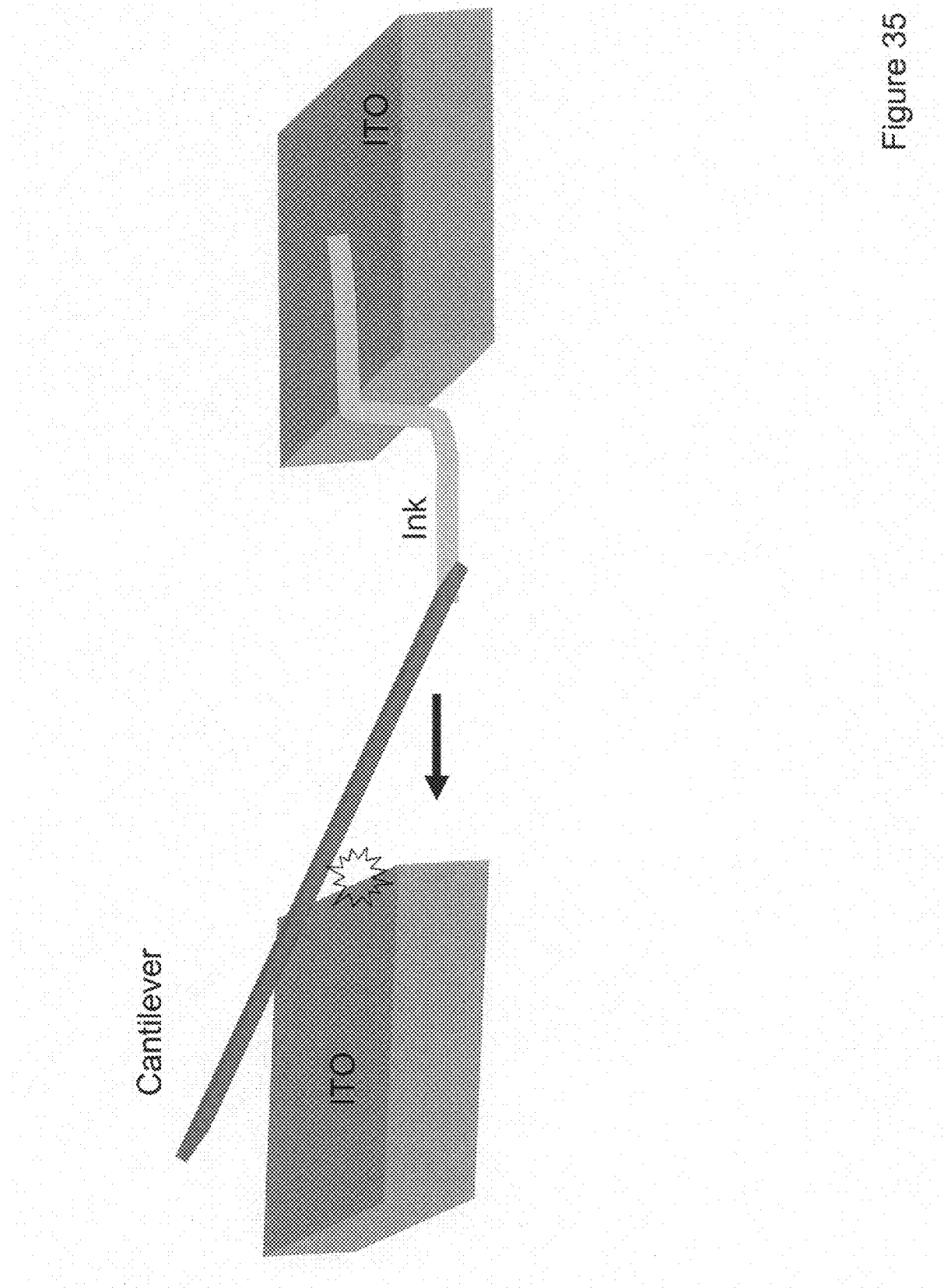
FIG. 35. Diagram illustrating how a gap may be formed near a topography step when drawing a line using a tipless cantilever.

In FIG. 34, gold traces were deposited from a 5 μm tipless cantilever loaded with gold nanoparticle ink across an insulating gap between conductive ITO (indium tin oxide) electrodes. When repeating this experiment multiple times, it was shown that these gold traces were often discontinuous and had a small gap in proximity to only one of the ITO steps. FIG. 35 explains how a gap may be formed near a topography step when drawing a line using a tipless cantilever. In this diagram, a cantilever draws a line with ink from right to left on top of two ITO islands on a non-conductive glass substrate, which are separated by a groove (see FIG. 34). The cantilever end faithfully deposits ink over the right edge, but may be lifted from the bottom of the groove when the cantilever body hits the left edge. That may result in non-conductive lines after curing of the ink. A simple remedy to this problem consists of (i) writing a first layer of ink from, say, right to left; (ii) writing a second layer from left to right atop the first layer (a method nicknamed "bidirectional writing"). Preferably, the cantilever is rotated 180 degrees before writing the second layer, as best patterning results (narrowest lines) were obtained when moving the cantilever parallel to its length and from its free end towards its bound end. Otherwise, the cantilever may bend or buckle, releasing ink in unwanted areas. This is best achieved by incorporating a cantilever rotation stage in the patterning instrument.

A person skilled in the art will recognize that numerous alternative embodiments and applications of the present invention exist. These alternatives are considered to be within the scope of the present invention. In particular, this includes the use of said cantilever for (iii) the fabrication of network of conductive traces on flat panel displays; (ii) the repair or fabrication of other elements of flat panel displays than metallic conductive traces, including but not limited to semiconductive (polysilicon) layers, transparent conductive oxide layers (such as ITO); (iii) especially, the repair of color filters in flat panel displays; (iv) the repair or fabrication of other types of flat or flexible displays; including (v) the repair of organic light-emitting diode (OLED) displays; (vi) the fabrication or repair of the masks used in semiconductor chip manufacturing, including the photomasks used in UV photolithography; (vii) the fabrication or repair of micro- or nano-structured stamps or molds; (vii) the fabrication or repair of thin film resistors or other thick or thin film passive components, as well as (viii) other micron-scale precision deposition applications. The cantilever used for CMD may be modified for better ink retention or deposition capabilities. For example, the whole cantilever may be coated with a layer of polymer, such as PDMS (polydimethylsiloxane). Cantilevers with integrated actuators, e.g. with an integrated heater and thermally driven bimorph, may be used to better control patterning. Cantilevers adapted for CMD may be combined in the same chip with other devices, for example a Atomic Force Microscopy cantilever with integrated tip for high-resolution imaging or a cantilever with an heated tip for ink curing after deposition.

The following are exemplary specifications for open line repair:

| Feature | Specification | Tolerance | Comments |
| --- | --- | --- | --- |
| Linewidth | 5 and 10 micron | +/− 20% | line widths? |
| Height | 0.1 micron | +/− 30% | Height is related to resistance (see below). |
| Resistivity | ~10($\mu\Omega$*cm). | | maximum resistivity ($\mu\Omega$*cm) for a line or repair? |
| Line length | Max line length = 200 micron | +/− 10 micron from designated length | longest line to write with a single pass? |
| Write/Cure time per repair | Depositing 100 micron line + curing one time. Less or equal to 60 seconds | | maximum time for repair that is acceptable? This will help determine the write speed and cure time. |
| Curing conditions | About 200 degrees C. (depending on the ink used) | | Can use a hotplate at 170° C. or select a laser system for curing. |
| Adhesion | Scotch tape test | | Ink resists scotch tape test and water rinsing. |

What is claimed is:

1. A method for writing conductive metal comprising:
providing two or more tipless cantilevers each having a cantilever end, wherein the cantilevers have a gap between them which is about one micron to about 20 microns;
providing an ink disposed in the gap between the cantilevers and disposed on the cantilever end, wherein the gap between the cantilevers acts as a reservoir to hold the ink;
providing a substrate surface; and
contacting the two or more cantilevers with the ink disposed in the gap between the cantilevers and at the cantilever end with the substrate surface so that ink is delivered from the gap between the cantilevers and the cantilever end to the substrate surface to form a feature on the substrate-surface,
wherein the widths of the two or more cantilevers and the width of the gap between the cantilevers control at least one dimension of the feature formed on the substrate surface.

2. The method according to claim 1, wherein the gap is about one micron to about five microns.

3. The method according to claim 1, wherein the gap is about five microns to about ten microns.

4. The method according to claim 1, wherein the gap is about ten microns to about twenty microns.

5. A method comprising:
providing two or more cantilevers each having a cantilever end, wherein the cantilevers can comprise a tip at the end or can be tipless cantilevers, wherein the cantilevers have a gap between them which is about one micron to about 20 microns;
providing an ink disposed in the gap between the cantilevers and disposed at the cantilever end, wherein the gap between the cantilevers acts as a reservoir to hold the ink;
providing a substrate surface; and
contacting the two or more cantilevers with the ink disposed in the gap between the cantilevers and at the cantilever end with the substrate surface so that ink is delivered from the gap between the cantilevers and the cantilever end to the substrate surface to form a feature on the substrate surface,
wherein the widths of the two or more cantilevers and the width of the gap between the cantilevers control at least one dimension of the feature formed on the substrate surface.

6. The method according to claim 5, wherein the gap is about one micron to about five microns.

7. The method according to claim 5, wherein the gap is about five microns to about ten microns.

8. The method according to claim 5, wherein the gap is about ten microns to about twenty microns.

9. The method of claim 5, wherein the cantilevers are tipless cantilevers.

10. The method of claim 5, wherein the gap between the cantilevers acts as a reservoir to hold ink due to capillary action.

11. The method of claim 5, wherein the ink comprises one or more biological molecules.

12. The method of claim 5, wherein the ink comprises one or more peptides or proteins.

13. The method of claim 5, wherein the ink comprises one or more nucleic acids.

14. The method of claim 5, wherein the ink comprises one or more sol-gel materials.

15. The method of claim 5, wherein the delivered ink forms a feature which has a dot diameter or line width of about one micron to about 100 microns.

16. The method of claim 5, wherein the cantilevers are about 50 microns to about 200 microns long.

17. The method of claim 5, wherein the cantilevers are brought into contact with the substrate surface at an angle of about 10 degrees or less.

18. The method of claim 5, wherein the cantilevers are brought into contact with the substrate surface at an angle of about 5 degrees or less.

19. A method comprising:
providing two or more tipless cantilevers each having a cantilever end, wherein the cantilevers have a gap or slit between them;
providing an ink disposed in the gap or slit between the cantilevers and disposed at the cantilever end, wherein the gap or slit between the cantilevers acts as a reservoir to hold the ink;
providing a substrate surface; and
depositing the ink from the gap or slit between the cantilevers and the cantilever end to the substrate surface to form a feature on the substrate surface,
wherein the widths of the two or more cantilevers and the width of the gap or slit between the cantilevers control at least one dimension of the feature formed on the surface.

* * * * *